United States Patent
Pyeon

(10) Patent No.: US 8,553,485 B2
(45) Date of Patent: *Oct. 8, 2013

(54) DYNAMIC RANDOM ACCESS MEMORY DEVICE AND METHOD FOR SELF-REFRESHING MEMORY CELLS WITH TEMPERATURE COMPENSATED SELF-REFRESH

(75) Inventor: Hong Beom Pyeon, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/618,250

(22) Filed: Sep. 14, 2012

(65) Prior Publication Data

US 2013/0010562 A1    Jan. 10, 2013

Related U.S. Application Data

(63) Continuation of application No. 12/705,040, filed on Feb. 12, 2010, now Pat. No. 8,300,488, which is a continuation of application No. 12/349,756, filed on Jan. 7, 2009, now Pat. No. 7,692,994, which is a continuation of application No. 11/835,663, filed on Aug. 8, 2007, now Pat. No. 7,499,361, which is a continuation of application No. 11/412,960, filed on Apr. 28, 2006, now Pat. No. 7,286,377.

(51) Int. Cl.
*G11C 7/00* (2006.01)

(52) U.S. Cl.
USPC .......................... 365/222; 365/149

(58) Field of Classification Search
USPC ......................... 365/222, 149, 211
See application file for complete search history.

(56) References Cited

U.S. PATENT DOCUMENTS 5,566,117 A    10/1996   Okamura et al.
5,636,171 A     6/1997   Yoo et al.

(Continued)

FOREIGN PATENT DOCUMENTS

JP    H08-171795    7/1996
JP    H10-188552    7/1998

(Continued)

OTHER PUBLICATIONS

S. Takase et al., A 1.6-GByte/s DRAM with Flexible Mapping Redundancy Technique and Additional Refresh Scheme, IEEE Journal of Solid-State Circuits, vol. 34, pp. 1600-1606, Nov. 1999.

(Continued)

*Primary Examiner* — Huan Hoang
(74) *Attorney, Agent, or Firm* — Shin Hung; Borden Ladner Gervais LLP

(57) ABSTRACT

A dynamic random access memory (DRAM) device has an array of DRAM cells of rows by columns. Each DRAM cell of the array is coupled with a wordline of a corresponding row and a bitline of a corresponding column. Entry into and an exit from the self-refresh mode is detected by a mode detector and a self-refresh mode signal is provided. An oscillation circuit generates in response to the self-refresh mode signal a basic time period. A first frequency divider/time period multiplier changes the basic time period in accordance with a process variation factor relating to the DRAM device. A second frequency divider/time period multiplier further changes the changed time period in accordance with a temperature change factor. In the self-refresh mode, data stored in the DRAM cells is refreshed. In accordance with the two factors, the DRAM devices perform and achieve reliable self-refresh for variable DRAM cell retention time.

7 Claims, 33 Drawing Sheets

(56) References Cited

U.S. PATENT DOCUMENTS

| | | | |
|---|---|---|---|
| 5,774,404 | A | 6/1998 | Eto |
| 6,483,764 | B2 | 11/2002 | Chen Hsu et al. |
| 6,556,496 | B2 | 4/2003 | Benedix et al. |
| 6,862,239 | B1 | 3/2005 | Huang et al. |
| 7,027,343 | B2 | 4/2006 | Sinha et al. |
| 7,177,218 | B2 | 2/2007 | Choi et al. |
| 7,177,220 | B2 | 2/2007 | Chou et al. |
| 7,286,377 | B1 | 10/2007 | Pyeon |
| 7,499,361 | B2 | 3/2009 | Pyeon |
| 7,692,994 | B2 | 4/2010 | Pyeon |
| 8,300,488 | B2 * | 10/2012 | Pyeon .................... 365/222 |
| 2002/0018387 | A1 | 2/2002 | Nam et al. |
| 2004/0208074 | A1 * | 10/2004 | Schnabel et al. .............. 365/222 |
| 2005/0068829 | A1 | 3/2005 | Oh |
| 2005/0248755 | A1 | 11/2005 | Chou et al. |
| 2006/0023545 | A1 | 2/2006 | Ito et al. |

FOREIGN PATENT DOCUMENTS

| | | |
|---|---|---|
| JP | H10-283774 | 10/1998 |
| JP | 2003005861 | 1/2003 |
| JP | 2004-165649 | 6/2004 |
| JP | 2006-31860 | 2/2006 |
| JP | 2006-54913 | 2/2006 |
| WO | 2004/095465 | 11/2004 |

OTHER PUBLICATIONS

Y. Idei et. al., Dual-Period Self-Refresh Scheme for Low-Power DRAM's with On-Chip PROM Mode Register, IEEE Journal of Solid-State Circuits, vol. 33, pp. 253-259, Feb. 1998.

Tsuruda et al., High-Speed/High-Bandwidth Design Methodologies for On-Chip DRAM Core Multimedia System LSI's, IEEE Journal of Solid-State Circuits, vol. 32, pp. 477-482, Mar. 1997.

U.S. Appl. No. 12/349,756, Notice of Allowance dated Nov. 17, 2009.

U.S. Appl. No. 12/705,040, Notice of Allowance dated Jun. 19, 2012.

* cited by examiner

DYNAMIC RANDOM ACCESS MEMORY DEVICE AND METHOD FOR SELF-REFRESHING MEMORY CELLS WITH TEMPERATURE COMPENSATED SELF-REFRESH

CROSS REFERENCE TO RELATED APPLICATIONS

This application is a continuation of U.S. patent application Ser. No. 12/705,040, filed on Feb. 12, 2012 which is a continuation of U.S. patent application Ser. No. 12/349,756, filed on Jan. 7, 2009, now issued as U.S. Pat. No. 7,692,994 on Apr. 6, 2010 which is a continuation of U.S. patent application Ser. No. 11/835,663, filed on Aug. 8, 2007, now issued as U.S. Pat. No. 7,499,361 on Mar. 3, 2009, which is a continuation of U.S. patent application Ser. No. 11/412,960 filed on Apr. 28, 2006, now issued as U.S. Pat. No. 7,286,377 on Oct. 23, 2007. The contents of all the above-mentioned applications being incorporated by reference in their entirety.

FIELD OF THE INVENTION

The present invention generally relates to a semiconductor integrated circuit, and in particular, to a dynamic random access memory device with a self-refresh function, a method for self-refreshing the data storage cells of a dynamic random access memory, and a self-refresh controller for use in a dynamic random access memory device.

BACKGROUND OF THE INVENTION

In dynamic random access memory (DRAM) integrated circuit devices, DRAM cell arrays are typically arranged in rows and columns such that a particular DRAM cell is addressed by specifying its row and column within the array. A wordline connects a row of cells to a set of bitline sense amplifiers that detect the data in the cells. In a read operation, a subset of the data in the sense amplifiers is then chosen, or "column-selected" for output of the data. DRAM cells are "dynamic" in the sense that the stored data, typically in the form of stored electrical charge on storage capacitors, will dissipate after a relatively short period of time. Thus, in order to retain the information, the contents of the DRAM cells must be periodically refreshed. The charged or discharged state of the storage capacitor must be reapplied to an individual memory cell in a repetitive manner. The maximum amount of time allowable between refreshing operations is determined by the charge storage capabilities of the capacitors that make up the DRAM cell array. DRAM manufacturers typically specify a refresh time for which it guarantees data retention in the DRAM cells.

A refresh operation is similar to a read operation, but no data is output from the bitline sense amplifiers. The sensing of the data in the cells by the sense amplifiers is followed by a restoring operation that results in the data being rewritten to the cells. The data is, thus, "refreshed". The refresh operation is performed by enabling a wordline according to a row address, and enabling a sense amplifier. In addition, the refresh operation may be carried out by operating the sense amplifier without receiving an external refresh address. In this case, a refresh address counter that is integrated in a DRAM chip generates a row address subsequent to receiving an external start address.

In general, refresh operations can be categorized as "auto-refresh" and "self-refresh". The auto-refresh operation occurs when, during operation of the chip, a refresh command is periodically generated and received. During auto-refresh, the receipt of other commands to the chip is interrupted and refresh is carried out. Then, the chip is allowed to receive and act on the other commands. The self-refresh operation performs refresh operations within the DRAM when in a sleep or standby mode to retain the data written in its memory cells. Those skilled in the art understand that a sleep mode is typically a low power consumption operation mode of the device where no operations are or will be executed.

In order to perform the self-refresh operation, regular internal reading of cell data and rewriting of that data are established in order to prevent data loss when the chip is operating in a so-called "sleep" mode. An internal timer controls the frequency of self-refresh. The self-refresh control circuitry is comprised of an internal oscillator, a frequency divider and a refresh count request block. Temperature monitoring and variable refresh rate control circuitry can be included. In known DRAM integrated circuits having a self-refresh function, the device is automatically switched to a self-refresh mode to perform self-refresh when required.

In order to obtain high-speed operation and high-density integrated circuits, deep sub-micron CMOS processes such as 90 nm, 65 nm and 45 nm have been introduced and used to implement many semiconductor IC devices. For those deep sub-micron processes, MOS transistors are scaled down (i.e., have minimum transistor dimensions decreased) and their threshold voltage (Vth) are lowered. However, the lowered threshold voltage results in significant sub-threshold leakage (i.e., leakage current present for transistor gate voltages below a threshold voltage) and therefore, semiconductor ICs based on such lowered threshold voltages can consume more power in normal operation as well as in a power saving mode of operation. Since a DRAM cell includes a minimally sized access transistor for coupling the storage capacitor to a bitline, the stored charge can quickly leak from the storage capacitor through this access transistor. Therefore, more frequent "self-refresh" operations are required.

FIG. 1A shows a self-refresh controller found in conventional DRAMs and FIG. 1B shows the relative timing sequence for the signals of the DRAM device shown in FIG. 1A. Referring to FIGS. 1A and 1B, a "self-refresh" mode, also known as a "sleep" mode, can be activated by a command signal 111. In response to the command signal 111 having a self-refresh entry command "SELF-REF ENTRY", a self-refresh mode detector 113 enables a self-refresh mode signal 115 so as to be active "high" (i.e., "high" logic level voltage Vdd). In response to the "high" self-refresh mode signal 115, an internal oscillator 117 is initiated to commence the generation of a self-refresh oscillation signal 119 having a predetermined pulse period Tosc and pulse width Twosc. The oscillation signal 119 is combined with other signals by a self-refresh request generator 121 which in turn generates a self-refresh request oscillation signal 123. The request signal 123 enables an internal row-address counter 125 to generate an address signal 127 having an appropriate internal row address. A row-address decoder 129 decodes the internal row address to provide a decoded address signal 131, with the result that a selected wordline is activated. When the self-refresh mode detector 113 receives a self-refresh exit command "SELF-REF EXIT" on the command signal 111, the self-refresh mode signal 115 goes "low" (i.e., "low" logic level voltage Vss) and the internal oscillator 117 is disabled, with the result that the generation of the oscillation signal 119 is ceased. Thereafter, the self-refresh request signal 123 is no longer provided to refresh the DRAM memory cells.

The self-refresh controller in the conventional DRAM includes a compensation controller 141 that receives a compensation signal 143. The compensation controller 141 provides a control signal 145 to the internal oscillator 117 to adjust the oscillation pulse period $T_{OSC}$ to cover a wide range of DRAM cell retention time varied by temperature. Generally, the higher temperature, the higher frequency refresh is required and the lower temperature, the less frequency refresh is required. If the compensation signal 143 includes information on a change to the device temperature, the internal oscillator 117 adjusts or varies the pulse period $T_{OSC}$. In response to the device temperature, the self-refresh repetition rate (which directly relates to the pulse period $T_{OSC}$) is variably controlled ("temperature compensated self-refresh (TCSR)"). The self-refresh repetition rate can thus be varied to be longer when the device temperature drops below nominal, and varied to be shorter when the device temperature increases above nominal, due to the dependence of current leakage on temperature of the device.

Diverse types of memory cells can be used as DRAM cells. For example, metal-insulator-metal (MIM) cells are now used in memory devices, especially for logic based embedded memories. For example, in a case of a 90 nm process, trench cell based DRAM devices have a relatively large capacitance of 20 fF. On the other hand, the MIM capacitor cell has a capacitance of 6 fF. Unlike stacked or trench cells, the MIM cells do not ensure long enough refresh characteristics, due to the small capacitances and high leakage inherent in logic-based processes. Therefore, efforts have been made to enhance the refresh characteristics of the MIM cells. In logic implementations, uncertainty of refresh characteristics and current leakage makes it difficult to increase relevant logic blocks in DRAM chips. Now, DRAM devices are widely used in mobile products wherein longer battery life is required. In mobile products, the TCSR function is now surging as one of the supplementary features in order to extend the battery life. The TCSR function controls the refresh time period based on the temperature experienced by the device, such as a mobile product. The characteristics from the cell processes and the environment temperature are two separate factors which can dynamically require changes the refresh time period.

The memory cells limited to a small capacitance, like MIM cells, can easily lose data polarity in a short period of time. Hence, the relevant circuits should have flexibility to change or adjust the refresh time period in order to cover all probable refresh time characteristics. Solutions for this issue can increase the amount of logic circuitry and its complexity when the TCSR function is adopted as one of features. It is well known that the refresh time becomes worse exponentially with temperature. Therefore, there are two factors which can change the refresh time period, that is, temperature and inherent refresh characteristics caused by unavoidable process variations and defect-oriented problems.

The problem is addressed and discussed by (i) S. Takase et al. "A 1.6-GByte/s DRAM with flexible mapping redundancy technique and additional refresh scheme", IEEE Journal of Solid-State Circuits, vol. 34, pp. 1600-1606, November 1999, IEEE Journal of Solid-State Circuits; (ii) Y. Wei et al., "Dual-period self-refresh scheme for low-power DRAM's with on-chip PROM mode register", IEEE Journal of Solid-State Circuits, vol. 33, pp. 253-259, February 1998; and (iii) T. Tsuruda et al., "High-speed/high-bandwidth design methodologies for on-chip DRAM core multimedia system LSI's", IEEE Journal of Solid-State Circuits, vol. 32, pp. 477-482, March 1997. They show how to generate self-refresh time and characteristics of cell refresh time according to leakage level and temperature. They do not, however, mention any TCSR issue that is main features in mobile products and how to combine two refresh time change factors. Conventionally, the TCSR and the refresh time characteristics have been considered as separate issues, each with separate and independent solutions.

It is, therefore, desirable to provide a merged logic approach for these two separate issues without a large area penalty caused by an independent logic solution. It is desirable to provide memory devices having DRAM cells with diverse refresh time characteristics and the TCSR function.

SUMMARY OF THE INVENTION

It is an object of the present invention to provide an improved dynamic random access memory (DRAM) device, a method for self-refreshing memory cells with temperature compensated self-refresh function and a self-refresh controller for a dynamic DRAM device.

In accordance with one aspect of the present invention, there is provided a dynamic random access memory (DRAM) device that includes an array of DRAM cells arranged in rows by columns and a refresh circuit for controlling a data refresh rate of the DRAM cells in a self-refresh mode. Each DRAM cell of the array is coupled to a wordline of a corresponding row and a bitline of a corresponding column.

The refresh circuit includes a mode detection circuit for detecting an entry into and an exit from the self-refresh mode to provide a self-refresh mode signal. Also, the refresh circuit also includes an oscillation circuit for producing an oscillation signal in response to the self-refresh mode signal to provide a basic time period. Furthermore, the refresh circuit includes a refresh time change circuit for changing the basic time period in response to one of two refresh time change factors of process variations relating to the DRAM device and temperature changes relating to the DRAM device to provide a changed time period. The refresh time change circuit further changes the changed time period in response to the other refresh time change factor, to provide a further changed time period for self-refreshing.

For example, the refresh time change circuit includes first and second changing circuits. The first change circuit changes the repetition period of the oscillation signal in response to the one refresh time change factor and provides a first period changed signal having the changed time period. The second changing circuit changes the repetition period of the first period changed signal in response to the other refresh time change factor and provides a second period changed signal having the further changed time period. Thus, the basic time period is changed by the first and second change circuits to provide the further changed time period for self-refreshing the DRAM cells of the array.

Advantageously, the first changing circuit includes a first frequency producing circuit that produces a first set of m frequency signals in response to the oscillation signal having an oscillation frequency. Each of the m frequency signals has a different frequency relating to the oscillation frequency, wherein m is an integer greater than one. Also, included is a first selection circuit for selecting one signal from the first set of m frequency signals, so that the selected signal is provided as the first period changed signal.

The second changing circuit includes a second frequency producing circuit that produces a second set of n frequency signals in response to the first period changed signal. Each of the n frequency signals has a different frequency relating to the oscillation signal, wherein n is an integer greater than one. Also, included is a second selection circuit for selecting one signal from the second set of n frequency signals, so that the selected signal is provided as the second period changed signal.

For example, the first frequency producing circuit includes a first frequency dividing circuit that divides the oscillation frequency in accordance with a first parameter and produces the first set of m frequency signals. The first selection circuit selects one signal of the m divided different frequency signals. The second frequency producing circuit includes a second frequency dividing circuit that divides the frequency of the first period changed signal in accordance with a second parameter to produce the second set of n frequency signals. The second selection circuit selects one signal of the n divided different frequency signals.

Advantageously, the DRAM device has a factor providing circuit that provides the factor of process variations relating to the DRAM device and the temperature changes relating to the DRAM device. For example, the factor providing circuit includes first and second first factor providers for designating the first and second parameters. The first frequency producing circuit divides the frequency of the oscillation signal in accordance with the designated first parameter. The second factor provider divides the frequency of the first period divided signal in accordance with the designated second parameter.

Advantageously, the first factor provider includes a process variation provider that provides a process variation code for designating the first parameter. The process variation code is derived from the process variations comprising DRAM characteristics. The second factor provider includes a temperature change provider that provides a temperature change code for designating the second parameter. The temperature change code is derived from temperature changes sensed from the DRAM device. The process variation provider includes a first generator that generates the process variation code representing a plurality of variations of the DRAM characteristics. The temperature change provider includes a second generator that generates the temperature change code representing a plurality of temperature changes of sensed temperature variations.

For example, the first generator includes a first decoder that decodes the plurality of variations and providing the process variation code. The second generator includes a second decoder that decodes the plurality of temperature changes and provides the temperature change code. The first selection circuit includes a first signal selection circuit that selects one of the m divided frequencies of the first set of frequency signals and provides the selected signal as the first period changed signal. The second selection circuit includes a second signal selection circuit that selects one of the n divided frequencies of the second set of frequency signals and provides the selected signal as the second period changed signal.

For example, the process variation provider includes a code provider that provides a variation code representing $2^i$, i being the designated first parameter of a positive or negative integer. The first frequency dividing circuit divides the oscillation frequency by $2^i$. The temperature change provider includes another code provider that provides a temperature change code representing $2^j$, j being the designated second parameter of a positive or negative integer. The second frequency dividing circuit divides the frequency of the first period changed signal by $2^j$.

Alternatively, the first frequency dividing circuit and the second frequency dividing circuit can be exchanged. Thus, the basic time period is first divided by the frequency divider in accordance with the temperature change and thereafter, the frequency divided signal is further divided in accordance with the process variation.

The frequency producing circuits may include frequency multipliers that provide output signals having multiplied frequencies and divided repetition periods. By the circuits, the basic time period is divided and thus, divided refresh periods are provided.

In a further aspect, there is provided a method for self-refreshing a dynamic random access memory (DRAM) device having an array of DRAM cells arranged in rows by columns, each DRAM cell of the array being coupled to a wordline of a corresponding row and a bitline of a corresponding column. The DRAM device is operable in a self-refresh mode and a non self-refresh mode. By the method, a self-refresh mode signal is provided. The signal is enabled and disabled in the self-refresh mode and the non self-refresh mode, respectively.

An oscillation signal is produced in response to the self-refresh mode signal to provide a basic time period. The basic time period is changed in response to one of two refresh time change factors of process variations relating to the DRAM device and temperature changes relating to the DRAM device. A changed time period is provided. The changed time period is further changed in response to the other refresh time change factor, to provide a further changed time period for self-refreshing.

Advantageously, the repetition period of the oscillation signal is changed in accordance with the one refresh time change factor. A first period changed signal having the changed time period is provided. The repetition period of the first period changed signal is further changed in accordance with the other refresh time change factor. A second period changed signal having the further changed time period is provided.

For example, the oscillation frequency is divided in accordance with a first parameter to produce a first set of m frequency signals having m divided frequencies. One of the first frequency signals of m divided frequencies is selected to provide the selected signal as the first period changed signal.

Advantageously, the frequency of the first period changed signal is divided in accordance with a second parameter to produce a second set of n frequency signals having n divided frequencies. One of the second frequency signals is selected to provide the selected signal as the second period changed signal.

In a further aspect, there is provided a self-refresh controller for use in a dynamic random access memory (DRAM) device selectively operated in a self-refresh mode and a non self-refresh mode, the DRAM device having an array of DRAM cells arranged in rows by columns, each DRAM cell of the array being coupled to a wordline of a corresponding row and a bitline of a corresponding column. The self-refresh controller includes a mode detection circuit for detecting an entry into and an exit from the self-refresh mode to provide a self-refresh mode signal; an oscillation circuit for producing an oscillation signal in response to the self-refresh mode signal to provide a basic time period; and a refresh time change circuit for changing the basic time period in response to one of two refresh time change factors of process variations relating to the DRAM device and temperature changes relating to the DRAM device to provide a changed time period and further changing the changed time period in response to the other refresh time change factor, to provide a further changed time period for self-refreshing.

There are two factors for the change of refresh time period, that is, temperature, and inherent refresh characteristics caused by unavoidable process variation and defect-oriented problem. In accordance with embodiments of the present invention, there is provided a DRAM device and a method for self-refreshing memory cells with wide range refresh time control for a combination of the two refresh time change factors of temperature and inherent refresh characteristics.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the present invention, reference is made to the accompanying drawings which form a part hereof, and in which is shown by way of illustration of specific sample embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention provides the self-refreshing of memory cells within an array included in a dynamic random access memory (DRAM) device. The DRAM devices can be a discrete component or embedded in a larger system.

Figure 1A:
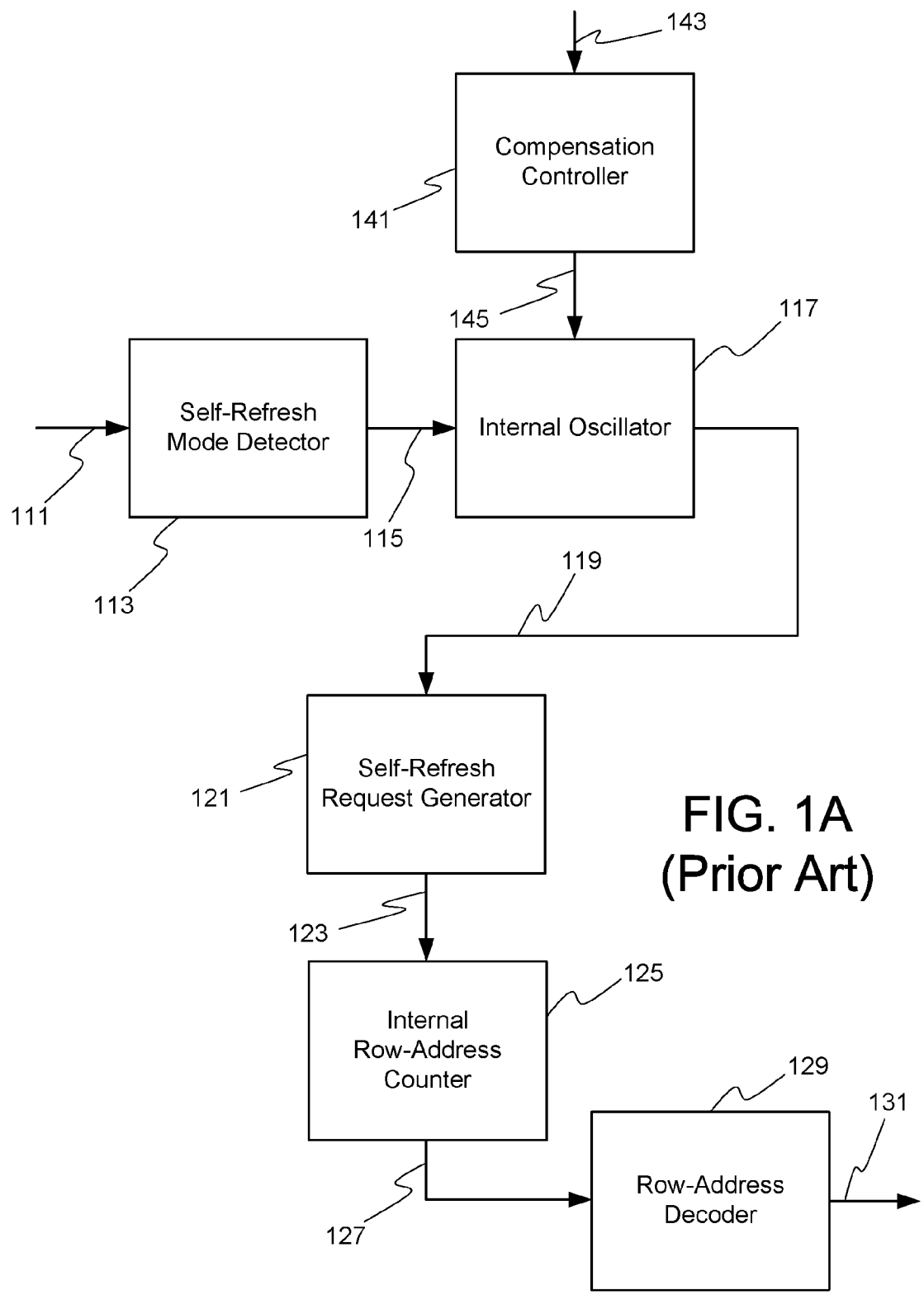
FIG. 1A is a block diagram illustrating self-refresh operation with the temperature compensated self-refresh (TCSR) function found in conventional dynamic random access memory (DRAM) devices.
Figure 1B:
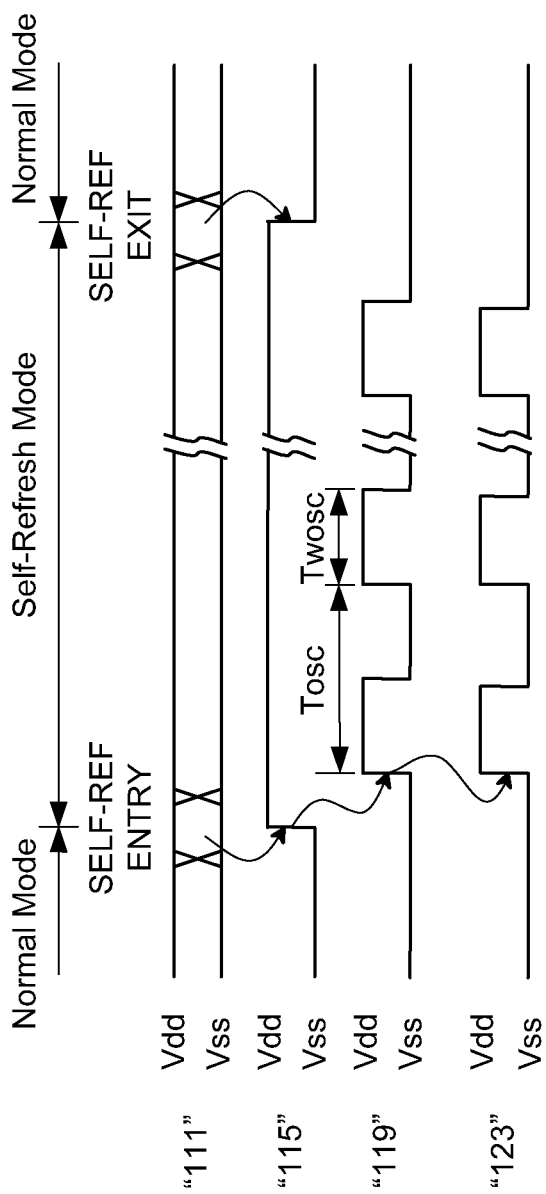
FIG. 1B illustrates the relative timing sequence for the signals in the self-refresh operation shown in FIG. 1A.

As previously described, the prior art DRAM device shown in FIG. 1A performs the self-refresh operation during the self-refresh period. In a case where wide self-refresh timer options are able to select self-refresh pulse period with frequency dividers, a self-refresh pulse period is tuned in the range dictated by process variations. In a conventional approach, tuning the process variation is to achieve the proper refresh time within the acceptable time period variation so as to use so that a preferable self-refresh value is used.

An embodiment according to the present invention provides a wide range of self-refresh time options to select a self-refresh pulse period, for example, from 122 ns to 7808 ns with frequency dividers that perform the function of tuning according to the process variation. Therefore, this embodiment effectively expands the range of refresh time coverage, including cells' characteristic variations. Based on the cell characteristics of refresh time, the self-refresh time value can be changed along with a temperature compensated self-refresh (TCSR) function. In one embodiment, the self-refresh time can be adjusted in response first to the process variation first and further to the sensed temperature. In another embodiment, the self-refresh time value can be adjusted in response first to the sensed temperature and further to the process variation.

Embodiments in accordance with the present invention are now described in the context of a DRAM device, and in particular, a refresh controller for self-refreshing DRAM cells within an array.

Figure 2A:
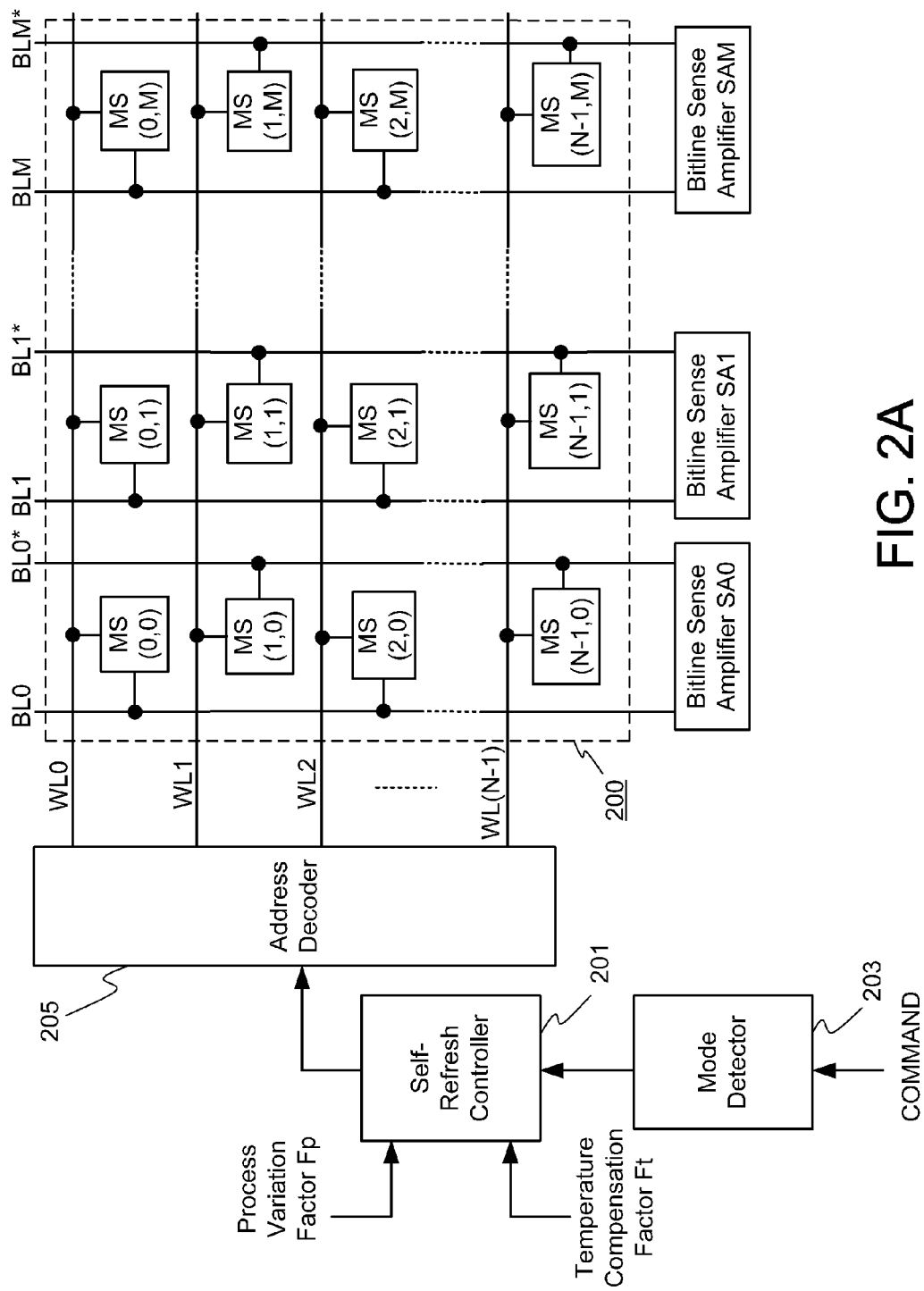
FIG. 2A is a block diagram illustrating a DRAM device with a self-refresh function according to an embodiment of the present invention.
Figure 2B:
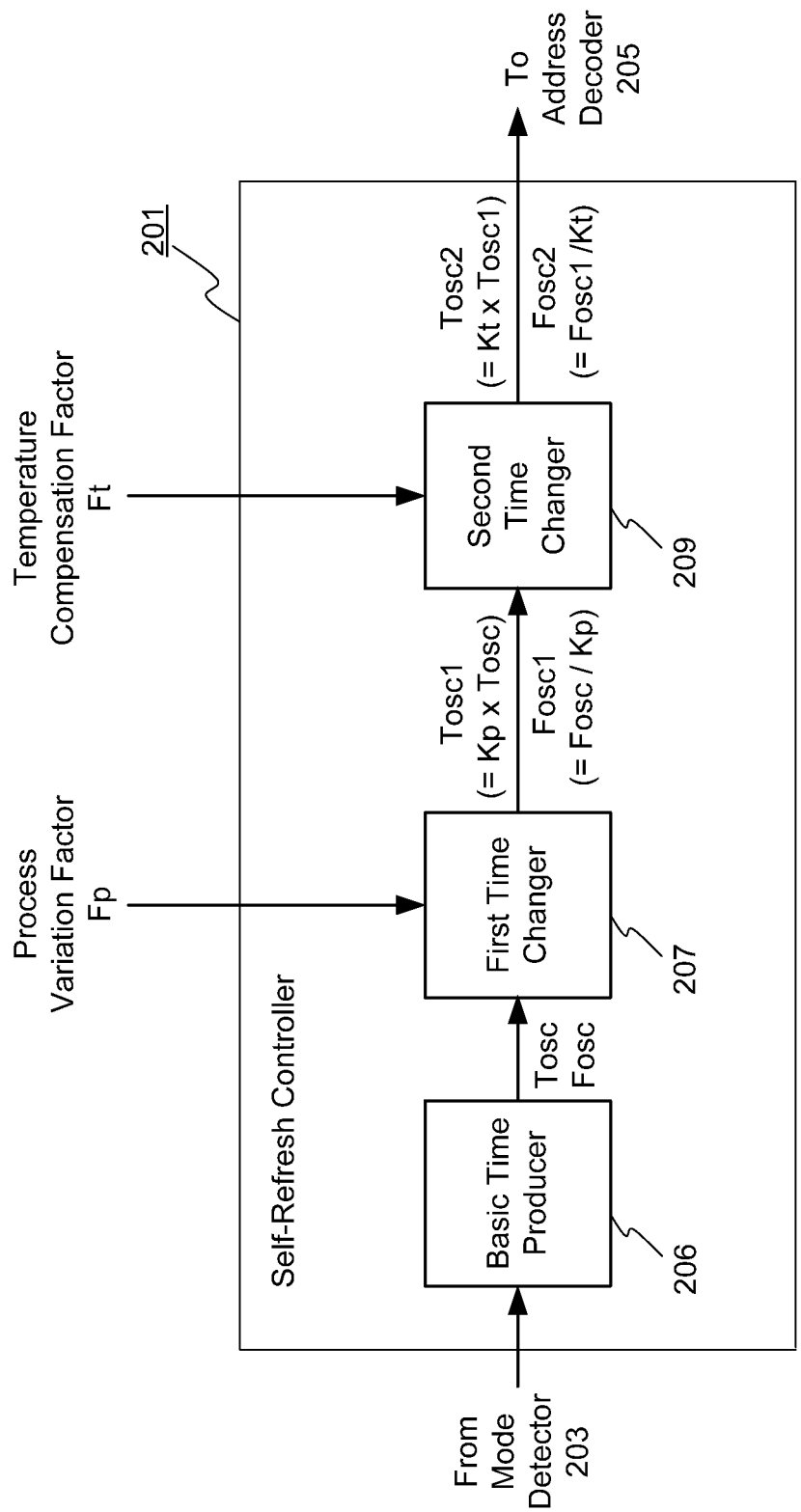
FIG. 2B is a block diagram illustrating a self-refresh controller shown in FIG. 2A.

FIG. 2A shows a DRAM device according to an embodiment of the present invention. FIG. 2B shows a self-refresh controller shown in FIG. 2A. Referring to FIGS. 2A and 2B, an array 200 of DRAM cells has a plurality of wordlines WL0-WL(N−1) and a plurality of bitlines BL0 and BL0*-BLM and BLM*. The array 200 of N rows by (M+1) columns includes a plurality of DRAM cells MS (i.e., MS(0,0) to MS(N−1,M)) that store data bits and are to be refreshed. For example, N is 4096 and the array 200 has wordlines WL0-WL 4095. Each DRAM cell includes an access transistor and a charge storage capacitor (not shown). A plurality of bitline sense amplifiers SA0-SAM are coupled with the array 200. The bitlines are arranged as folded bitlines (pairs of complementary bitlines) and each complementary bitline pair of BL0, BL0* - - - BLM, BLM* are connected to a corresponding bitline sense amplifier. The bitline sense amplifiers SA0-SAM are connected to databuses (not shown) through a pair of respective column address transistors (not shown). The pairs of column address transistors are activated by respective column address signals, when data access to the array 200 is required. In the description, "*" denotes inverted or opposite logic.

In the array 200 of DRAM cells, the refresh row address signal is represented by a (N+1) bit signal, for example. The address is decoded by an address decoder 205 and the decoded address controls row addressing. Each of the memory cells is coupled with an associated wordline and one bitline of a complementary bitline pair. Data can be read through the bitline sense amplifier connected to the respective complementary bitline pair. In a read operation, a wordline is activated and the bit charge is shared with the associated bitline. In accordance with the column address, the full logic level on the bitlines is applied to the databuses.

The cells of the array 200 are refreshed in the self-refresh operation mode. The refreshing operation of the DRAM cells of the array 200 is performed by a self-refresh controller 201 and a mode detector 203 that detects an entry into and an exit from the self-refresh mode in response to a COMMAND signal. Based on the detected self-refresh entry and exit, a time period between the self-refresh entry and exit is determined. In response to the row addresses, the self-refresh operation is performed to refresh the DRAM cells within the array 200.

The self-refresh controller 201 is provided with process variations (represented by a process variation factor Fp) and temperature changes (represented by a temperature compensation factor Ft), which changes time for controlling the self-refreshing of data stored in the DRAM cells in the self-refresh mode. The process variations represent, for example, characteristics of DRAM devices that can vary with manufacturing processes. The temperature changes are, for example, sensed from the DRAM device itself and can vary with operation conditions.

In response to the detected self-refresh entry and exit, a basic time producer 206 of the self-refresh controller 201 generates an oscillation signal containing a repetition period or basic time period Tosc and having an oscillation frequency Fosc (=1/Tosc). The basic time period Tosc is multiplied in accordance with a process variation based multiplying factor Kp by a first time changer 207 (that includes a frequency divider and a time period multiplier). The first time changer 207 provides a frequency divided oscillation signal containing a multiplied time period Tosc1 (Kp×Tosc) and having a divided frequency Fosc1 (=Fosc/Kp=1/Tosc1), in accordance with the process variation factor Fp. The multiplied time period Tosc1 is further multiplied in accordance with a temperature compensation based multiplying factor Kt by a second time changer 209 (that includes a frequency divider and a time period multiplier). The second time changer 209 provides a further frequency divided oscillation signal containing a further multiplied time period $Tosc_2$ (=Kt×Tosc1) and having a further divided frequency $Fosc_2$ (=Fosc1/Kt=1/Tosc2). The further frequency divided oscillation signal is provided to the address decoder 205 for self-refreshing. Thus, in the DRAM device, the originally generated basic time period Tosc is first divided by the first time changer 207 and then further divided by the second time changer 209. As such, a first tuning-in function is performed in accordance with the process variation factor Fp and a further tuned-in function based on the tuned-in time period is performed in accordance with the temperature compensation factor Ft. Therefore, a wider range tuning-in is achieved by the two step time change.

Figure 3A:
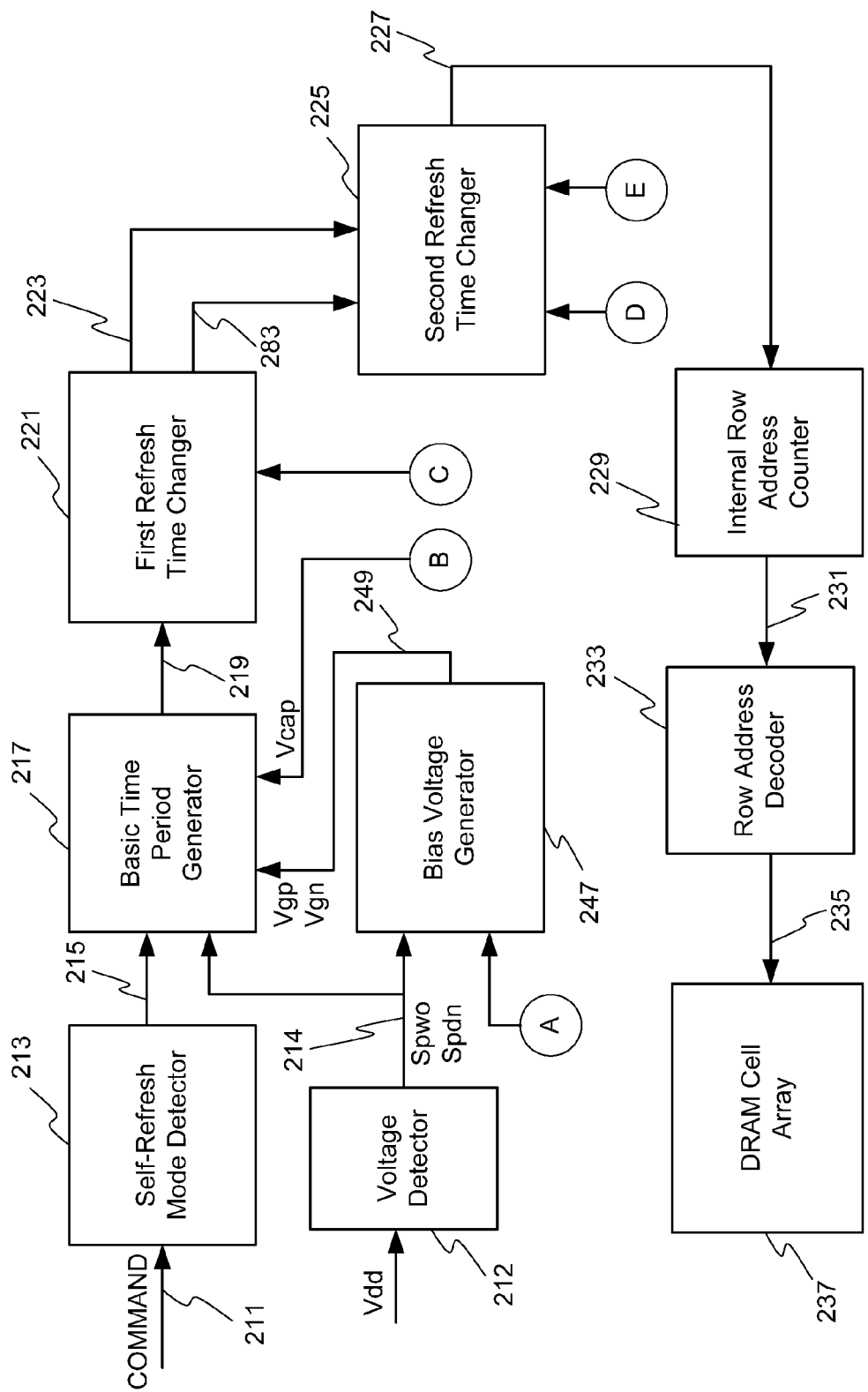
FIGS. 3A and 3B are block diagrams illustrating a DRAM device according to one embodiment of the present invention.
Figure 3B:
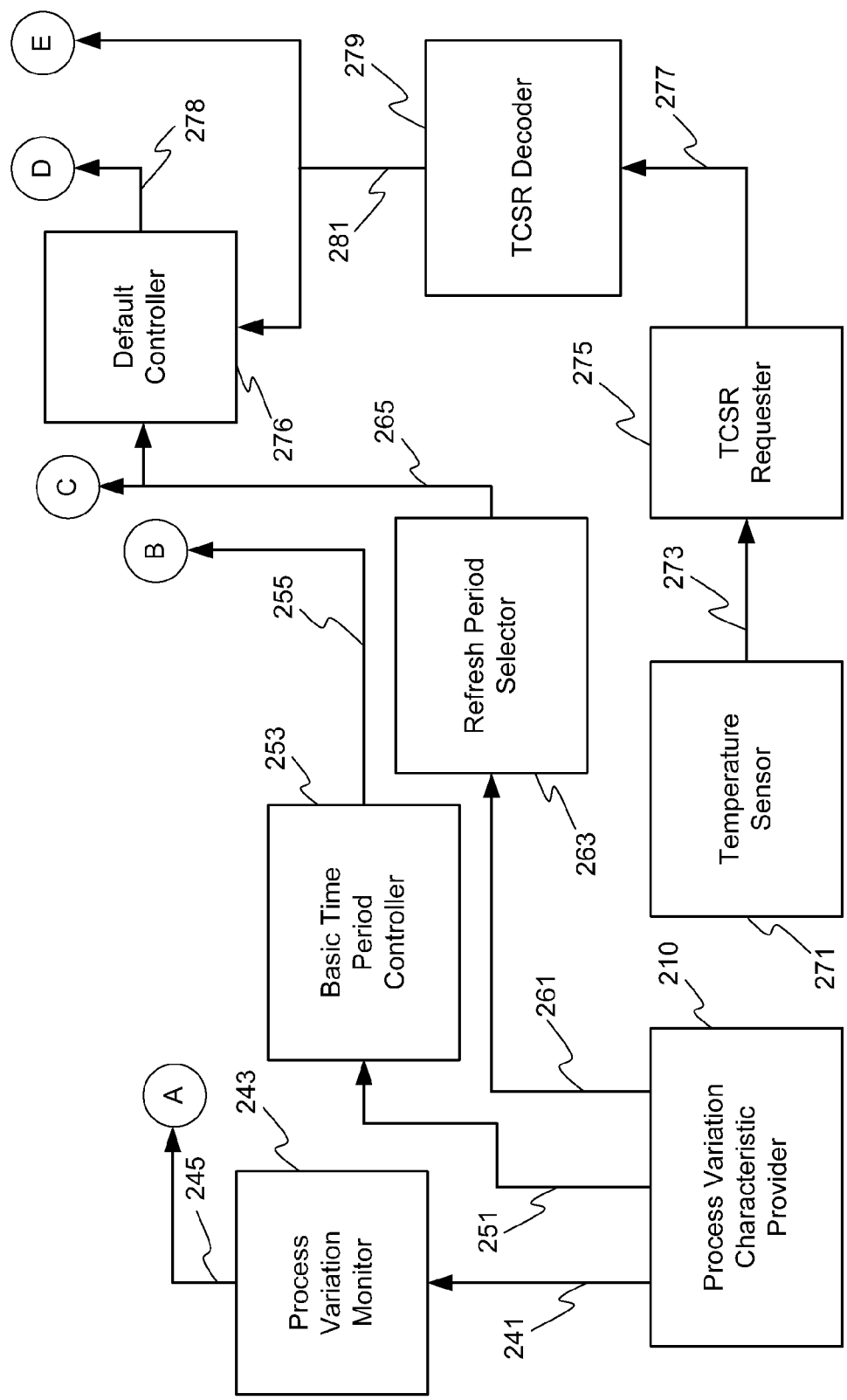
Figure 4:
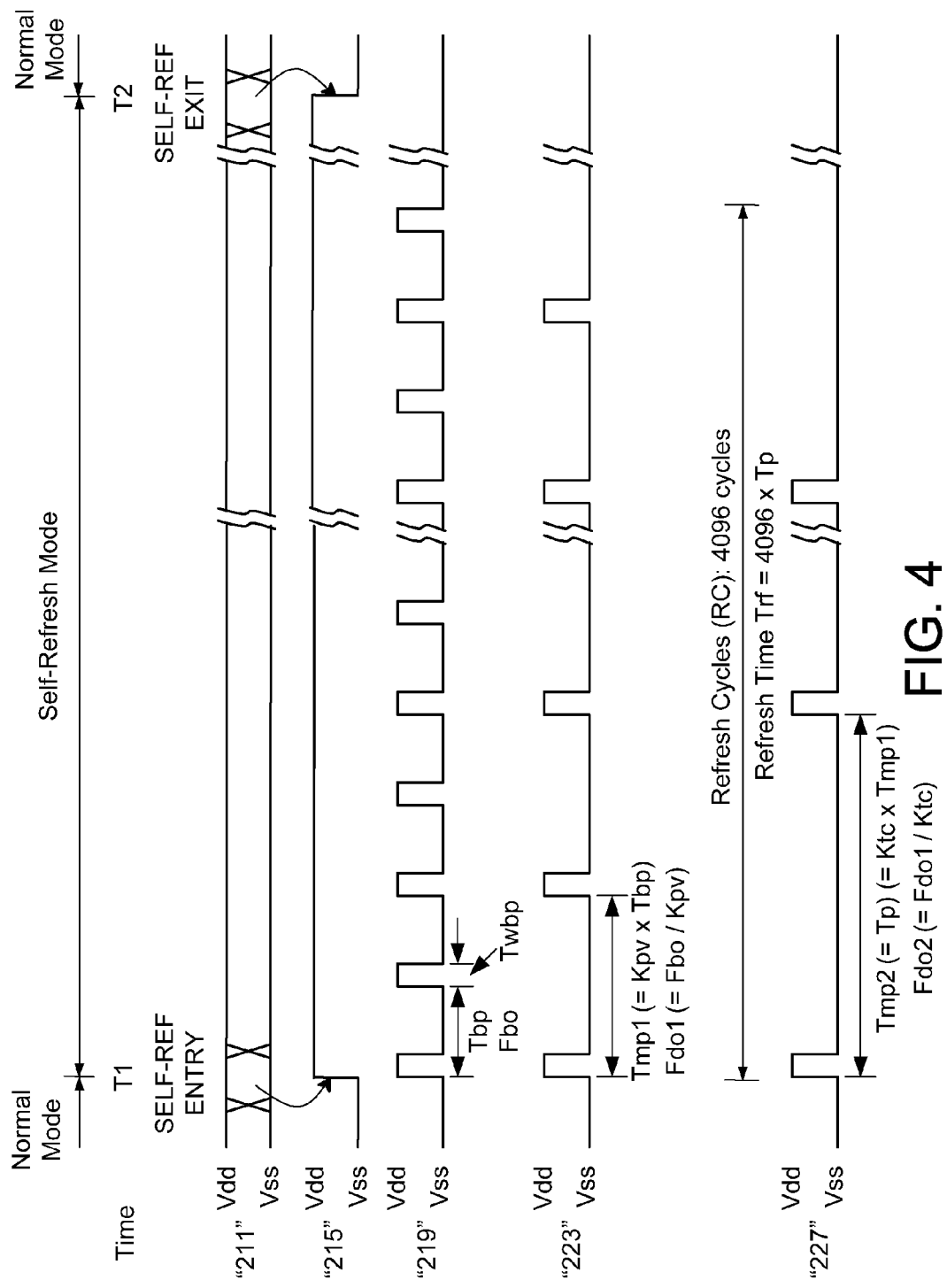
FIG. 4 is a timing sequence for the signals of the DRAM device shown in FIGS. 3A and 3B.
Figure 5:
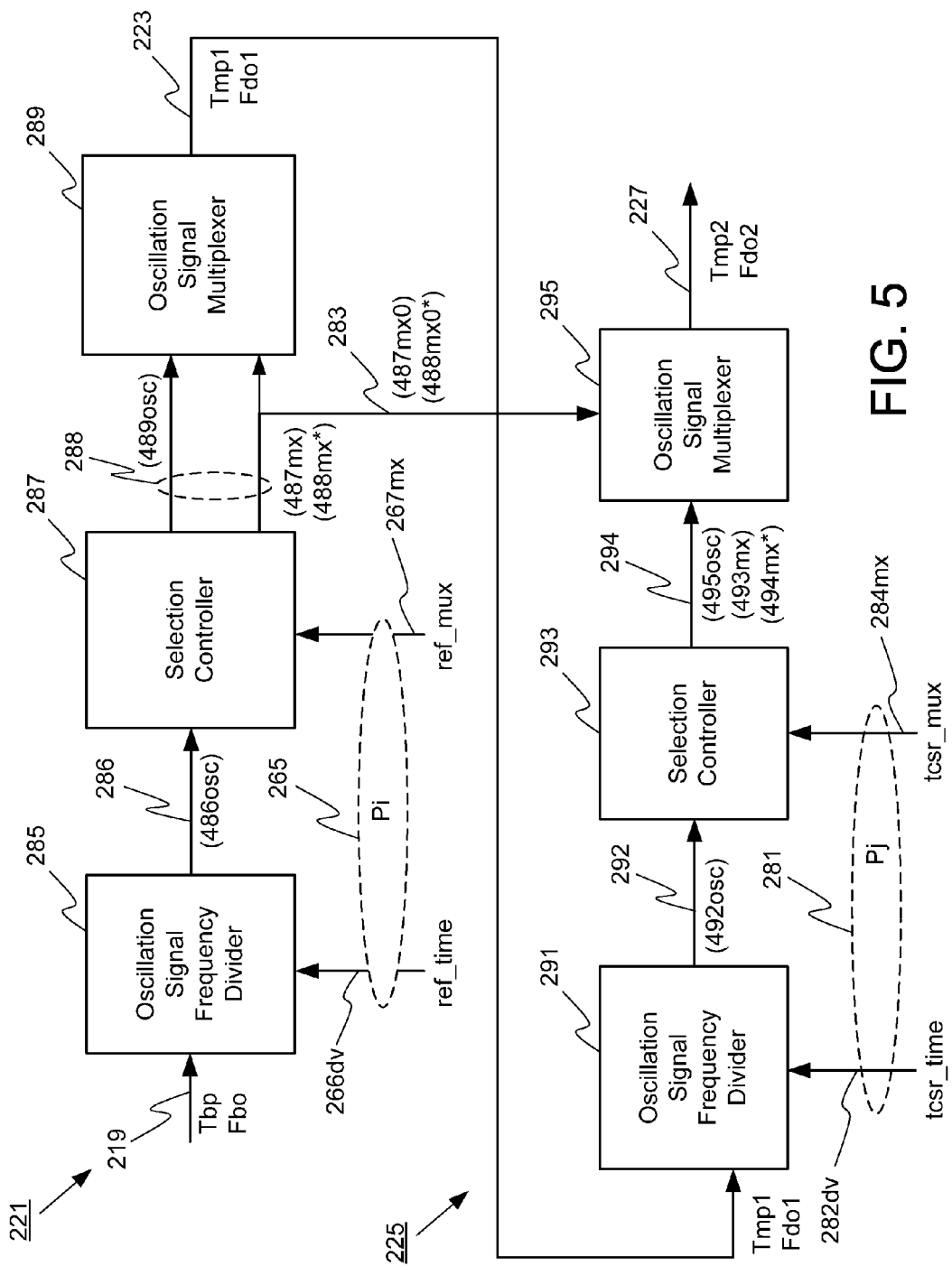
FIG. 5 is a block diagram illustrating a first refresh time changer and a second refresh time changer of the DRAM device shown in FIGS. 3A and 3B.

FIGS. 3A and 3B shows a DRAM device according to an embodiment of the present invention. FIG. 4 shows a timing sequence for the signals of the DRAM device shown in FIGS. 3A and 3B. FIG. 5 shows first and second refresh time changers shown in FIGS. 3A and 3B. Each of the first and second refresh time changers is comprised of frequency dividers and multiplexers. The multiplexer logic of the first and second refresh time changers is performed by NAND gates and transmission gates.

Referring to FIGS. 3-5, a "self-refresh" mode, also known as a "sleep" mode, can be activated by a command signal 211 provided by a memory controller (not shown). In response to the command signal 211 having a self-refresh entry command "SELF-REF ENTRY", a self-refresh mode detector 213 enables a self-refresh mode signal 215 (at time T1), so as to be active "high" (i.e., "high" logic level voltage Vdd). In response to the "high" self-refresh mode signal 215, a basic time period generator 217 is initiated to commence the generation of a basic oscillation signal 219 having a basic oscillation signal Fbo (e.g., 8.2 MHz) and a basic time period Tbo (e.g., 122 ns).

The basic oscillation signal 219 is provided to a first refresh time changer 221. The first refresh time changer 221 provides a first frequency divided signal 223 having a divided frequency Fdo1 and a multiplied period Tmp1 to a second refresh time changer 225. The second refresh time changer 225 provides a further frequency divided and multiplexed signal having a further divided frequency Fdo2 and a further multiplied period Tmp2, as a self-refresh request signal 227. In response to the self-refresh request signal 227, the internal row-address counter 229 generates an address signal 231 having an appropriate internal row address. A row-address decoder 233 decodes the internal row address to provide a decoded address signal 235, with the result that a selected wordline of an array of DRAM cells 237 is activated. The array of DRAM cells 237 has a similar structure as the array 200 shown in FIG. 2A.

When the self-refresh mode detector 213 receives a self-refresh exit command "SELF-REF EXIT" on the command signal 211, the self-refresh mode signal 215 goes "low" (i.e., "low" logic level voltage Vss) and the basic time period generator 217 is disabled, with the result that the generation of the basic oscillation signal 219 is ceased (at time T2). Therefore, the self-refresh mode signal 215 is disabled. Thereafter, the self-refresh request signal 227 is no longer provided to perform the self-refreshing the DRAM memory cells, until a next self-refresh command is provided. The operation modes are referred to as a "normal mode" before time T1 and after time T2 and to a "self-refresh mode" between time T1 and time T2. The high and low logic level voltages Vdd and Vss are fed through power supply voltage and ground level voltage lines.

A voltage detector 212 performs a power detection function, whereby a power stable signal Spwo and a power down signal Spdn included in a detected power signal 214 are provided. While the power supply voltage Vdd fed to the DRAM device is stable at a desired operation voltage level, the power stable signal Spwo is provided to perform normal oscillation operation. When the voltage Vdd decreases deeply, the power down signal Spdn is provided to cease the normal oscillation operation. The power stable signal Spwo and the power down signal Spdn are provided to a bias voltage generator 247.

A process variation characteristic provider 210 provides a process variation value signal 241, a period value signal 251 and a refresh period value signal 261. The refresh period value signal 261 contains the process variation related values that are refresh time characteristics "rfc0", "rfc1" and "rfc2" (i.e., three bits). The process variation value signal 241 contains the process variation related value "rfc3" (i.e., one bit). The period value signal 251 contains the process variation related value "rfc4" (i.e., one bit). It is a known technique to provide the process variation related values.

The refresh period value signal 261 is provided in accordance with the process variation factor Fpv. The refresh period selector 263 decodes the factor Fpv to a process variation based parameter Pi as the process variation factor signal 265. An oscillation signal frequency divider 285 of the first refresh time changer 221 produces a set of frequency divided signals (the frequency divided oscillation signal 286) of m divided frequencies, wherein m is an integer greater than one, for example seven.

The process variation value signal 241 is fed to a process variation monitor 243, which in turn provides a process variation monitored signal 245 to the bias voltage generator 247. The process variation monitor 243 monitors the process variation (the process variation related value "rfc3") comprised in the process variation value signal 241 and produces the process variation monitored signal 245. In response to the process variation monitored signal 245 and the power stable signal Spwo and power down signal Spdn, the bias voltage generator 247 generates a bias voltage signal 249 containing p-channel gate voltage Vgp and n-channel gate voltage Vgn that are fed to the basic time generator 217.

The period value signal 251 (the process variation related value "rfc4") is provided to a basic time period controller 253, which in turn provides a period control signal 255 to the basic time period generator 217. The process variation related value "rfc4" relates to a capacitance value of the cells of the DRAM device. For example, the cells are MIM cells having relative large leakage. Therefore, the period control signal 255 contains a capacitor reference voltage Vcap. In response to the capacitance variation comprised in the period value signal 251, the basic time period controller 253 produces the capacitor reference voltage Vcap which is provided to the basic time period generator 217.

The refresh period value signal 261 of three bits containing the process variation related values of the refresh time characteristics "rfc0", "rfc1" and "rfc2" is fed to a refresh period selector 263 which in turn provides a process variation factor signal 265 to the first refresh time changer 221. The process variation factor signal 265 contains a process variation based parameter Pi for frequency dividing and time period multiplying. The process variation factor signal 265 comprises a process variation-frequency division signal 266$dv$ and a process variation-multiplexing signal 267$mx$. The process variation-frequency division signal 266$dv$ is fed to the oscillation signal frequency divider 285 and the process variation-multiplexing signal 267$mx$ is fed to a selection controller 287. In response to the process variation factor signal 265, the first refresh time changer 221 varies the basic time period Tbp and provides the first frequency divided signal 223 to the second refresh time changer 225. A multiplexing signal 283 corresponding to part of the process variation factor signal 265 is also fed from the selection controller 287 to the second refresh time changer 225.

A temperature sensor 271, preferably integrated using known circuit elements, in the DRAM device provides a temperature signal 273 corresponding to a temperature or temperature changes sensed therefrom for achieving the temperature compensated self-refresh (TCSR). In response to the temperature signal 273, a TCSR requester 275 provides a TCSR signal 277 to a TCSR decoder 279 which in turn provides a temperature compensation factor signal 281 to the second refresh time changer 225. The temperature compensation factor signal 281 contains a temperature compensation based parameter Pj for frequency dividing and time period multiplying. The temperature compensation factor signal 281 comprises a temperature compensation-frequency division signal 282$dv$ and a temperature compensation-multiplexing signal 284$mx$. In response to the temperature compensation-frequency division signal 282$dv$, temperature compensation-multiplexing signal 284$mx$ and the multiplexing signal 283, the second refresh time changer 225 changes the frequency of the first frequency divided signal 223 and provides the self-refresh request signal 227 having a further divided frequency. The self-refresh request signal 227 contains an further divided frequency or multiplied time period of the basic time period Tbp.

The temperature compensation factor signal 281 and the process variation factor signal 265 are provided to a default controller 276, which in turn may provide a default signal 278 to the second refresh time changer 225. The default signal represents a minimum refresh time of 0.5 ms. The second refresh time changer 225 provides the self-refresh request signal 227 in accordance with the default operation (of the minimum refresh time) and thus, the internal row address counter 229 sets a default setting for the refresh time Trf.

The TCSR requester 275 provides the TCSR signal 277 in accordance with the temperature compensation factor Ftc. The TCSR decoder 279 decodes the factor Fpv to the temperature compensation based parameter Pj as the temperature compensation factor signal 281 so that an oscillation signal frequency divider 291 of the second refresh time changer 225 produces a set of frequency divided signals (the frequency divided oscillation signal 292) of n divided frequencies. Wherein n is an integer greater than one, for example, four.

Further details of the first refresh time changer 221 and the second refresh time changer 225 are shown in FIG. 5, now discussed as follows.

Referring to FIG. 5, the first refresh time changer 221 shown in FIG. 3A includes the oscillation signal frequency divider 285, the selection controller 287 and an oscillation signal multiplexer 289. The oscillation signal frequency divider 285 receives the basic oscillation signal 219 from the basic time period generator 217 and provides a frequency divided frequency divided oscillation signal 286 to the selection controller 287 in response to the process variation-frequency division signal 266$dv$. The process variation-frequency division signal 266$dv$ and the process variation-multiplexing signal 267$mx$ contain the process variation based parameter Pi. The basic oscillation frequency of the basic oscillation signal Fbo is divided in accordance with the process variation based parameter Pi and the basic time period Tbo is multiplied accordingly. For example, a process variation based multiplying factor Kpv is $2^{Pi}$ and the frequency Fbo is divided by $2^{Pi}$. The process variation based parameter Pi is designated by the process variation-frequency division signal 266dv and the process variation-multiplexing signal 267mx.

The frequency divided frequency divided oscillation signal 286 is provided to the selection controller 287 that receives the process variation-multiplexing signal 267mx. The selection controller 287 provides a frequency divided oscillation signal 288 to the oscillation signal multiplexer 289 in response to the process variation-multiplexing signal 267mx. The oscillation signal multiplexer 289 provides the first frequency divided signal 223 having the multiplied period Tmp1 (=Kpv×Tbp) and the divided frequency Fdo1 (=Fbo/Kpv).

In an example embodiment of a DRAM device, there can be seven given process variation cases, referred to as PV0-PV6. Table 1 shows the relation between the process variation based parameter Pi and the process variation based multiplying factor Kpv which can be used for each case.

TABLE 1

| Process Variation Based Parameter Pi | Process Variation Based Multiplying Factor Kpv | Multiplied Time Period Tmp1 = Kpv × Tob | Divided Frequency Fdo1 = Fbo/Kpv |
|---|---|---|---|
| 0 | 1 | Tbo | Fbo |
| 1 | 2 | 2Tbo | Fbo/2 |
| 2 | 4 | 4Tbo | Fbo/4 |
| 3 | 8 | 8Tbo | Fbo/8 |
| 4 | 16 | 16Tbo | Fbo/16 |
| 5 | 32 | 32Tbo | Fbo/32 |
| 6 | 64 | 64Tbo | Fbo/64 |

As such, in accordance with the process variation based parameter Pi derived from the seven process variations PV0-PV6, the process variation based multiplying factor Kpv varies and thus, the multiplied time period Tmp1 varies.

The second refresh time changer 225 includes the oscillation signal frequency divider 291, a selection controller 293 and an oscillation signal multiplexer 295. The oscillation signal frequency divider 291 receives the first frequency divided signal 223 from the oscillation signal multiplexer 289 of the first time changer 221. The oscillation signal frequency divider 291 provides a frequency divided oscillation signal 292 to the selection controller 293, in response to the temperature compensation-frequency division signal 282dv. The selection controller 293 provides multiplexer values of a frequency divided oscillation signal 294 to the oscillation signal multiplexer 295, in response to the temperature compensation-multiplexing signal 284mx. The temperature compensation-frequency division signal 282dv and the temperature compensation-multiplexing signal 284mx included in the temperature compensation factor signal 281 make up the temperature compensation based parameter Pj. In response to the frequency divided oscillation signal 294 and the multiplexing signal 283, the oscillation signal multiplexer 295 provides the self-refresh request signal 227 having the further multiplied period Tmp2 (=Ktc×Tmp1) and the further divided frequency Fdo2 (=Fdo1/Ktc).

In the example embodiment DRAM device, there can be four given temperature change cases, referred to as TS0-TS3. For example, a temperature compensation based multiplying factor Ktc is $2^{Pj}$ and the frequency Fdo1 is divided by $2^{Pj}$. The temperature compensation based parameter Pj is designated by the temperature compensation-frequency division signal 282dv and the temperature compensation-multiplexing signal 284mx. Table 2 shows the relation between the temperature compensation based parameter Pj and the temperature compensation based multiplying factor Ktc which can be used for each case.

TABLE 2

| Temperature Compensation Based Parameter Pj | Temperature Compensation Based Multiplying Factor Ktc | Multiplied Time Period Tmp2 = Ktc × Tmp1 | Divided Frequency Fdo2 = Fdo1/Ktc |
|---|---|---|---|
| −1 | 0.5 | 0.5Tmp1 | 2Fdo1 |
| 0 | 1 | Tmp1 | Fdo1 |
| 1 | 2 | 2Tmp1 | Fdo1/2 |
| 2 | 4 | 4Tmp1 | Fdo1/4 |

As such, in accordance with the temperature compensation based parameter Pj derived from the four temperature changes TS0-TS3, the temperature compensation based Multiplying factor Ktc varies and thus, the multiplied time period Tmp2 varies.

Referring to FIG. 4, in the self-refresh mode, the generated basic oscillation signal 219 has a series of pulses of the basic time period Tbp (a frequency Fbo=1/Tbp) and pulse width Twbp. In the example DRAM device, a refresh cycle (RC) is set at 4096 cycles, and compensation for seven process variations PV0-PV6 is programmed. A refresh time period Tp is given in relation to a respective one of the seven variations PV0-PV6. Table 3 shows seven process variations and refresh time Trf as target refresh times in conjunction with the cell refresh characteristics. The refresh time Trf varies along with four temperature changes (TS0-TS3) are as follows:

TABLE 3

| | Temperature T(° C.) | | | |
|---|---|---|---|---|
| Process Variation PV | T > 85 (TS3) | 85 ≥ T > 70 (TS2) | 70 ≥ T > 45 (TS1) | 45 ≥ T > 15 (TS0) |
| PV0 | Trf = 0.5 ms[#1] | Trf = 0.5 ms | Trf = 1 ms | Trf = 2 ms |
| PV1 | Trf = 0.5 ms | Trf = 1 ms | Trf = 2 ms | Trf = 4 ms |
| PV2 | Trf = 1 ms | Trf = 2 ms | Trf = 4 ms | Trf = 8 ms |
| PV3 | Trf = 2 ms | Trf = 4 ms | Trf = 8 ms | Trf = 16 ms |
| PV4 | Trf = 4 ms | Trf = 8 ms | Trf = 16 ms | Trf = 32 ms |
| PV5 | Trf = 8 ms | Trf = 16 ms | Trf = 32 ms | Trf = 64 ms |
| PV6 | Trf = 16 ms | Trf = 32 ms | Trf = 64 ms | Trf = 128 ms |

In Table 3, #1 denotes a "default" operation wherein the refresh time Trf is set to "0.5 ms" regardless of the values of the process variation and the temperature change. As such, the seven process variations PV0-PV6 and the four temperature changes are factors to change or adjust the refresh time Trf. Table 4 shows possible cases of the refresh time Trf in the example DRAM device. It is noted that the basic time period Tbp is 122 ns.

TABLE 4

| Process Variation Based Multiplying Factor Kpv | Temperature Compensation Based Multiplying Factor Ktc | Refresh Time Period Tp = Tbp × Kpv × Ktc | Refresh Cycle RC (cycle) | Refresh Time Trf = RC × Tp |
|---|---|---|---|---|
| (Pi = 0) 1 | (Pj = 2) 4 | 488 ns | 4096 | 2 ms |
| (Pi = 1) 2 | (Pj = 2) 4 | 976 ns | 4096 | 4 ms |
| (Pi = 2) 4 | (Pj = 2) 4 | 1952 ns | 4096 | 8 ms |
| (Pi = 3) 8 | (Pj = 2) 4 | 3904 ns | 4096 | 16 ms |
| (Pi = 4) 16 | (Pj = 2) 4 | 7808 ns | 4096 | 32 ms |
| (Pi = 5) 32 | (Pj = 2) 4 | 15616 ns | 4096 | 64 ms |

TABLE 4-continued

| Process Variation Based Multiplying Factor Kpv | Temperature Compensation Based Multiplying Factor Ktc | Refresh Time Period Tp = Tbp × Kpv × Ktc | Refresh Cycle RC (cycle) | Refresh Time Trf = RC × Tp |
|---|---|---|---|---|
| (Pi = 6) 64 | (Pj = 2) 4 | 31232 ns | 4096 | 128 ms |
| (Pi = 0) 1 | (Pj = 1) 2 | 244 ns | 4096 | 1 ms |
| (Pi = 1) 2 | (Pj = 1) 2 | 488 ns | 4096 | 2 ms |
| (Pi = 2) 4 | (Pj = 1) 2 | 976 ns | 4096 | 4 ms |
| (Pi = 3) 8 | (Pj = 1) 2 | 1952 ns | 4096 | 8 ms |
| (Pi = 4) 16 | (Pj = 1) 2 | 3904 ns | 4096 | 16 ms |
| (Pi = 5) 32 | (Pj = 1) 2 | 7808 ns | 4096 | 32 ms |
| (Pi = 6) 64 | (Pj = 1) 2 | 15616 ns | 4096 | 64 ms |
| (Pi = 0) 1 | (Pj = 1) 1 | 122 ns | 4096 | 0.5 ms |
| (Pi = 1) 2 | (Pj = 1) 1 | 244 ns | 4096 | 1 ms |
| (Pi = 2) 4 | (Pj = 1) 1 | 488 ns | 4096 | 2 ms |
| (Pi = 3) 8 | (Pj = 1) 1 | 976 ns | 4096 | 4 ms |
| (Pi = 4) 16 | (Pj = 1) 1 | 1952 ns | 4096 | 8 ms |
| (Pi = 5) 32 | (Pj = 1) 1 | 3904 ns | 4096 | 16 ms |
| (Pi = 6) 64 | (Pj = 1) 1 | 7808 ns | 4096 | 32 ms |
| (Pi = 0) 1 | (Pj = −1) 0.5 | 122 ns[#1] | 4096 | 0.5 ms[#1] |
| (Pi = 1) 2 | (Pj = −1) 0.5 | 122 ns | 4096 | 0.5 ms |
| (Pi = 2) 4 | (Pj = −1) 0.5 | 244 ns | 4096 | 1 ms |
| (Pi = 3) 8 | (Pj = −1) 0.5 | 488 ns | 4096 | 2 ms |
| (Pi = 4) 16 | (Pj = −1) 0.5 | 976 ns | 4096 | 4 ms |
| (Pi = 5) 32 | (Pj = −1) 0.5 | 1952 ns | 4096 | 8 ms |
| (Pi = 6) 64 | (Pj = −1) 0.5 | 3904 ns | 4096 | 16 ms |

In Table 4, #1 denotes the "default" operation (of the minimum refresh time) and the refresh time period Tp is set to "122 ns" and thus, the refresh time Trf is set to 0.5 ms.

As shown in Table 4, the refresh time period Tp is given in accordance with a respective one of the seven variations PV0-PV6 and the temperature changes TS0-TS3. With a given process variation PV, a different refresh time Trf is produced. The highlighted cases (the process variations PV0-PV6 and the time changes TS1) will be described later as examples.

Figure 6A:
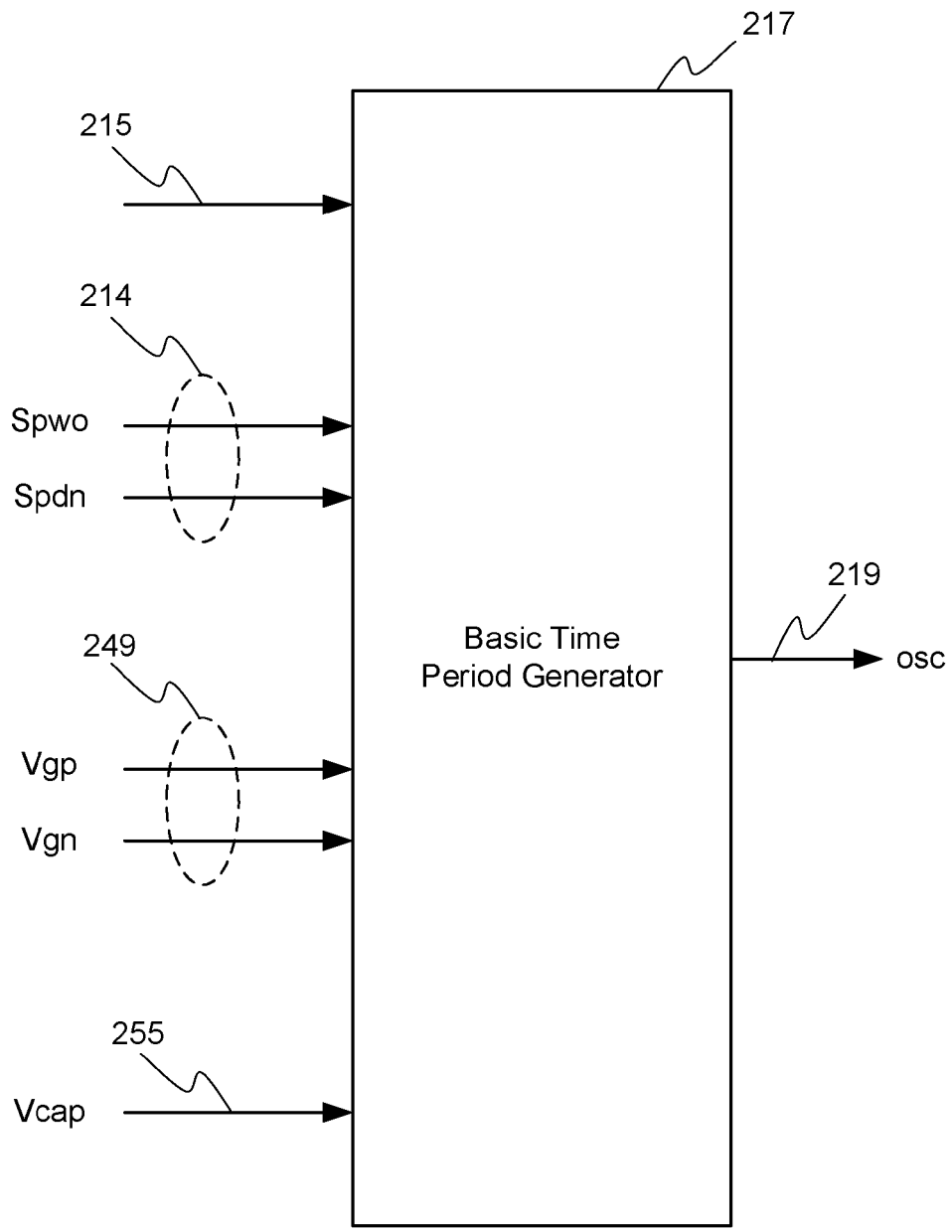
FIG. 6A is a block diagram illustrating a basic time period generator of the DRAM device shown in FIGS. 3A and 3B.

FIG. 6A shows the basic time period generator 217 shown in FIGS. 3A and 3B. The basic time period generator 217 receives the detected power signal 214 including the power stable signal Spwo and the power down signal Spdn from the voltage detector 212, the p-channel gate voltage Vgp and the n-channel gate voltage Vgn from the bias voltage generator 247 and the capacitor reference voltage Vcap from the basic time period controller 253 shown in FIGS. 3A and 3B.

Figure 6B:
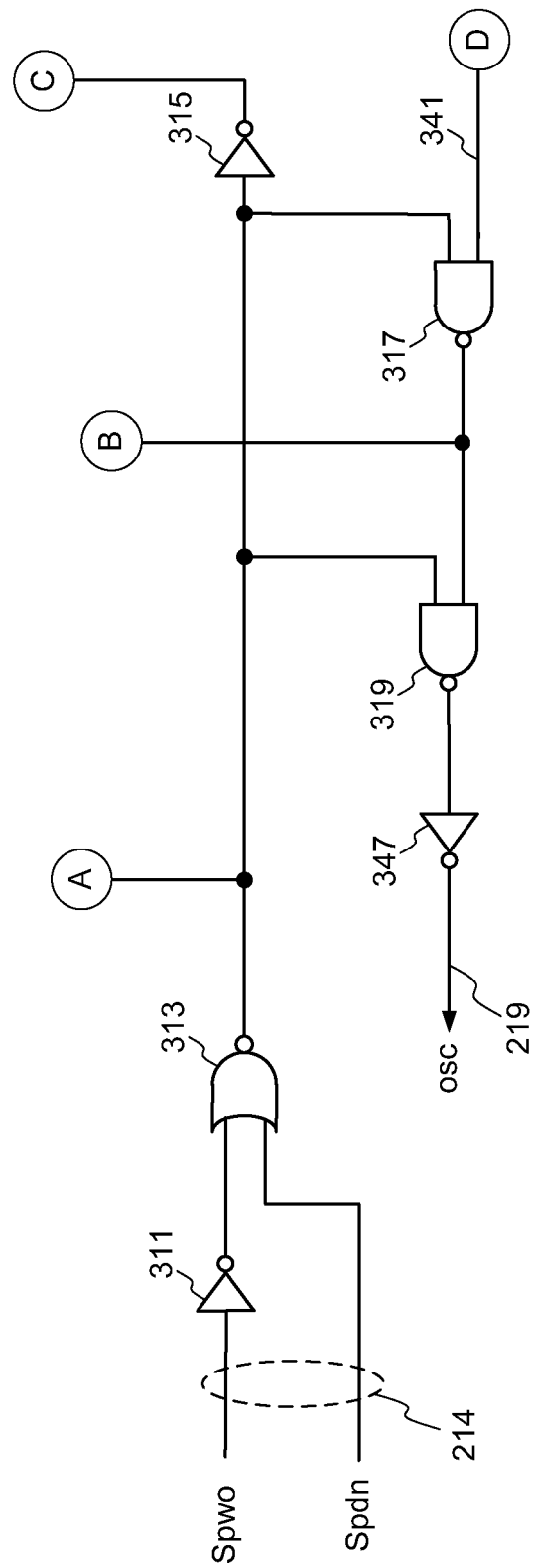
FIGS. 6B-6D are schematic diagrams illustrating a detailed circuit of the basic time period generator shown in FIG. 6A.
Figure 6C:
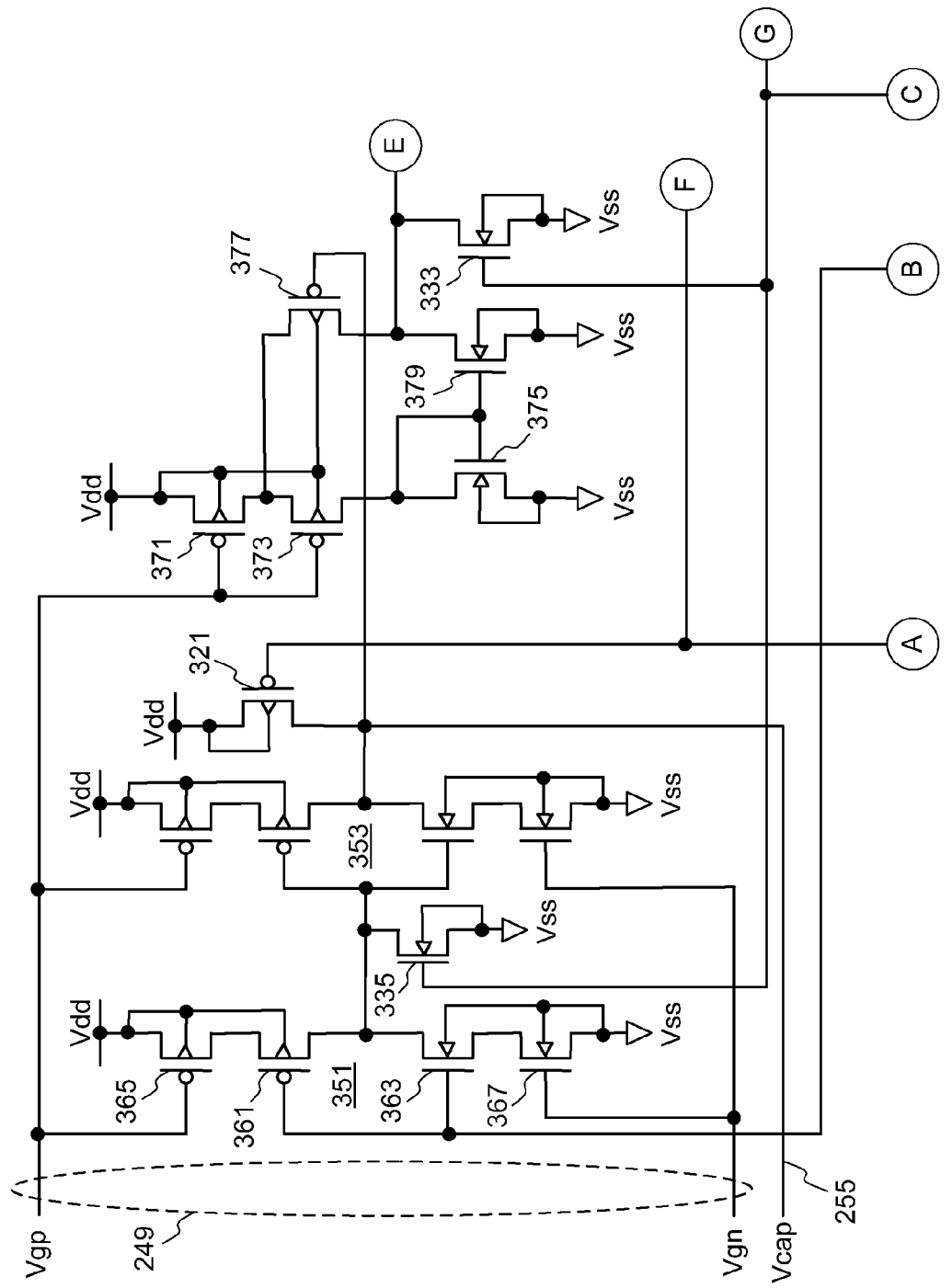
Figure 6D:
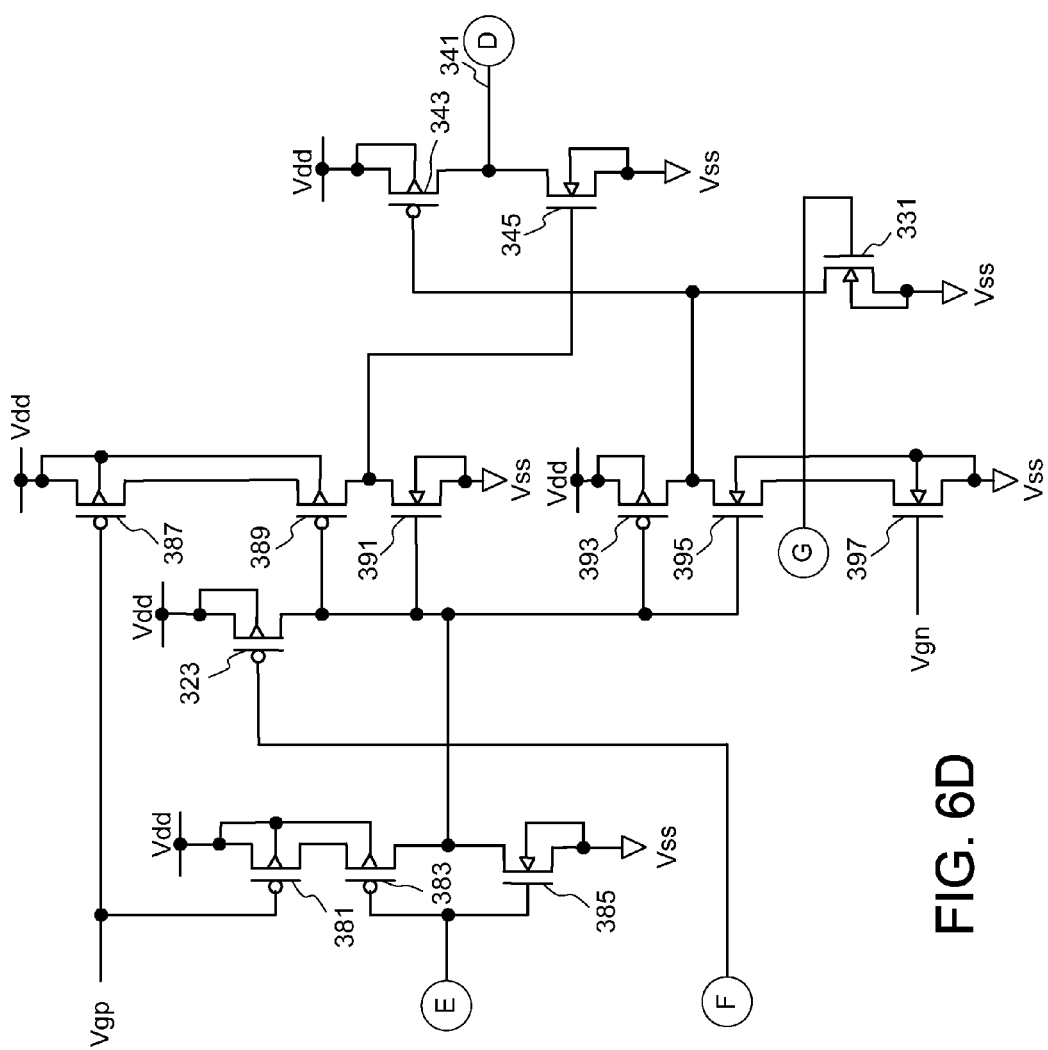

FIGS. 6B to 6D shows a detailed circuit of the basic time period generator 217. The basic time generator 217 is formed by bias control inverters including PMOS and NMOS transistors, series-connected PMOS and NMOS transistors between the voltages Vdd and Vss, and logic circuitry. Referring to FIGS. 6A and 6B, the basic time period generator 217 includes an internal oscillator for generating a basic time period oscillation signal for self-refreshing. The internal oscillator is operative with the p-channel gate voltage Vgp and n-channel gate voltage Vgn provided by the bias voltage generator 247. In response to the "self-refresh" command in the self-refresh mode signal 215, the basic time period generator 217 is activated by the power stable signal Spwo and the power down signal Spdn.

The basic time period generator 217 produces the basic oscillation signal 219 having the basic oscillation frequency Fbo and the basic time period Tpb for self-refreshing the cells of the DRAM device. The basic time period Tpb is variably controlled with the capacitor reference voltage Vcap. The p-channel gate voltage Vgp and the n-channel gate voltage Vgn are fed to the gates of the PMOS and NMOS transistors, respectively, included in the basic time period generator 217. The p-channel gate voltage Vgp is lower than Vdd by at least the threshold voltage of the PMOS transistors to turn them on. The n-channel gate voltage Vgn is higher than the voltage Vss by at least the threshold voltage of the NMOS transistors to turn them on.

The power stable signal Spwo is fed to an inverter 311, the inverted output signal of which is fed to one input of a NOR gate 313 having another input for receiving the power down signal Spdn. A logic output signal from the NOR gate 313 is fed to an inverter 315, two NAND gates 317 and 319 and the gates of PMOS transistors 321 and 323. An inverted output signal from the inverter 315 is fed to the gates of NMOS transistors 331, 333 and 335. An internal oscillation signal 341 is derived from coupled drains of PMOS and NMOS transistors 343 and 345 that are series-connected between the terminals of the voltages Vdd and Vss. For example, Vdd and Vss are supply voltages. The internal oscillation signal 341 is fed to the NAND gate 317, the output signal of which is fed to the NAND gate 319. A logic output signal of the NAND gate 319 is inverted by an inverter 347, the inverted signal of which is the basic oscillation signal 219 ("osc") provided by the basic time period generator 217. The NAND gate 319 and the inverter 347 form an AND logic circuit.

The logic output signal from the NAND gate 317 is also fed to an input terminal of a bias control inverter 351 comprising PMOS and NMOS transistors 361 and 363 and additional PMOS and NMOS transistors 365 and 367. An output terminal of the bias control inverter 351 is connected to the input terminal of another bias control inverter 353 and the drain of the NMOS transistor 335. The output terminal of the bias control inverter 353 is connected to the drain of the PMOS transistor 321. The bias control inverters 351 and 353 have the same circuit structure.

Two PMOS transistors 371 and 373 and a diode-connected NMOS transistor 375 are series-connected between the terminals of the voltages Vdd and Vss. The source of a PMOS transistor 377 is connected to the coupled drain and source of the PMOS transistors 371 and 373. The drain of the PMOS transistor 377 is connected to the drain of a NMOS transistor 379, the gate of which is connected to the gate of the NMOS transistor 375. PMOS transistors 381 and 383 and a NMOS transistor 385 are connected in series between the terminals of the voltages Vdd and Vss. Similarly, PMOS transistors 387 and 389 and a NMOS transistor 391 are connected in series between the terminals of the voltages Vdd and Vss. Furthermore, a PMOS transistor 393 and NMOS transistors 395 and 397 are connected in series between the terminals of the voltages Vdd and Vss.

The p-channel gate voltage Vgp is fed to the gates of the PMOS transistors and the n-channel gate voltage Vgn is fed to the gates of the NMOS transistors. The capacitor reference voltage Vcap is fed to the drain of the gate of the PMOS transistor 377, which is connected to the output of the bias control inverter 353. The basic time period generator 217 oscillates and with the voltages Vgp, Vgn and Vcap, the basic time period generator 217 changes its oscillation frequency.

While the power supply voltage Vdd is stable at the desired operation voltage level, the power stable signal Spwo is "high" and the power down signal Spdn is "low". The logic output from the NOR gate 313 is "high" and thus, the internal oscillation signal 341 is inverted by the NAND gates 317 and 319 and the inverter 347. The inverted output signal of the inverter 347 is provided as the basic oscillation signal 219. While the power supply voltage Vdd is unstable and does not reach the desired operation voltage level, the power stable signal Spwo is "low". The output from the inverter 313 is "low" and thus, the PMOS transistors 321 and 323 are turned on. The gate of the PMOS transistors 377 goes "high" and the oscillation operation is not performed. In a case where the power supply voltage Vdd decreases deeply, the power down signal Spdn goes "high". The logic output from the NOR gate 313 goes "low" and thus, no oscillation operation is performed either.

Figure 7A:
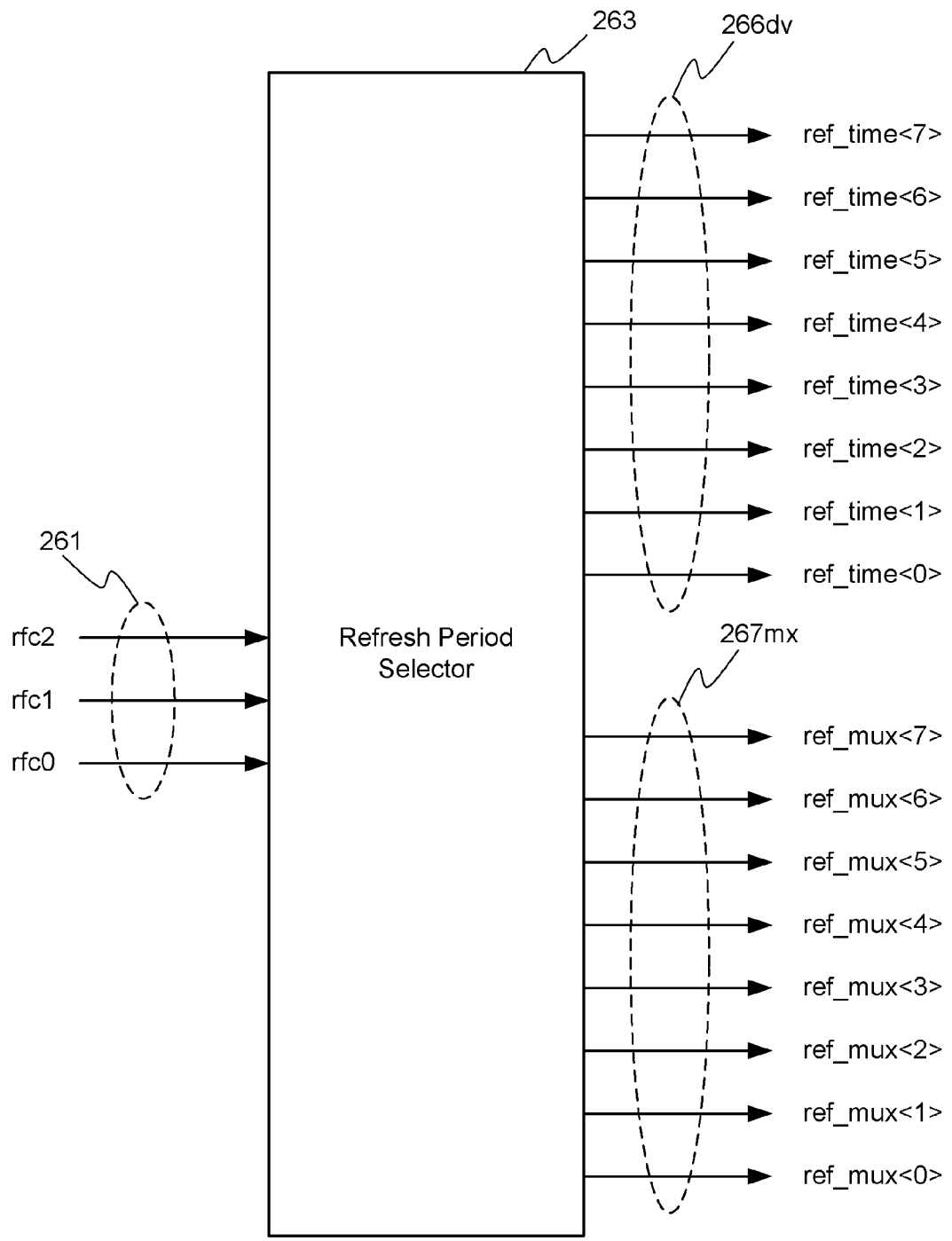
FIG. 7A is a block diagram illustrating a refresh period selector of the DRAM device shown in FIGS. 3A and 3B.

FIG. 7A shows the refresh period selector 263 of the DRAM device shown in FIGS. 3A and 3B. Referring to FIG. 7A, the refresh period selector 263 receives the refresh period value signal 261 comprising the refresh time characteristics "rfc0", "rfc1" and "rfc2" and provides the process variation factor signal 265 containing the process variation based parameter Pi. The process variation factor signal 265 includes eight refresh time bit signals "ref_time<7>"-"ref_time<0>" of the process variation-frequency division signal 266dv and eight refresh multiplexing bit signals "ref_mux<7>"-"ref_mux<0>" of the process variation-multiplexing signal 267mx.

Figure 7B:
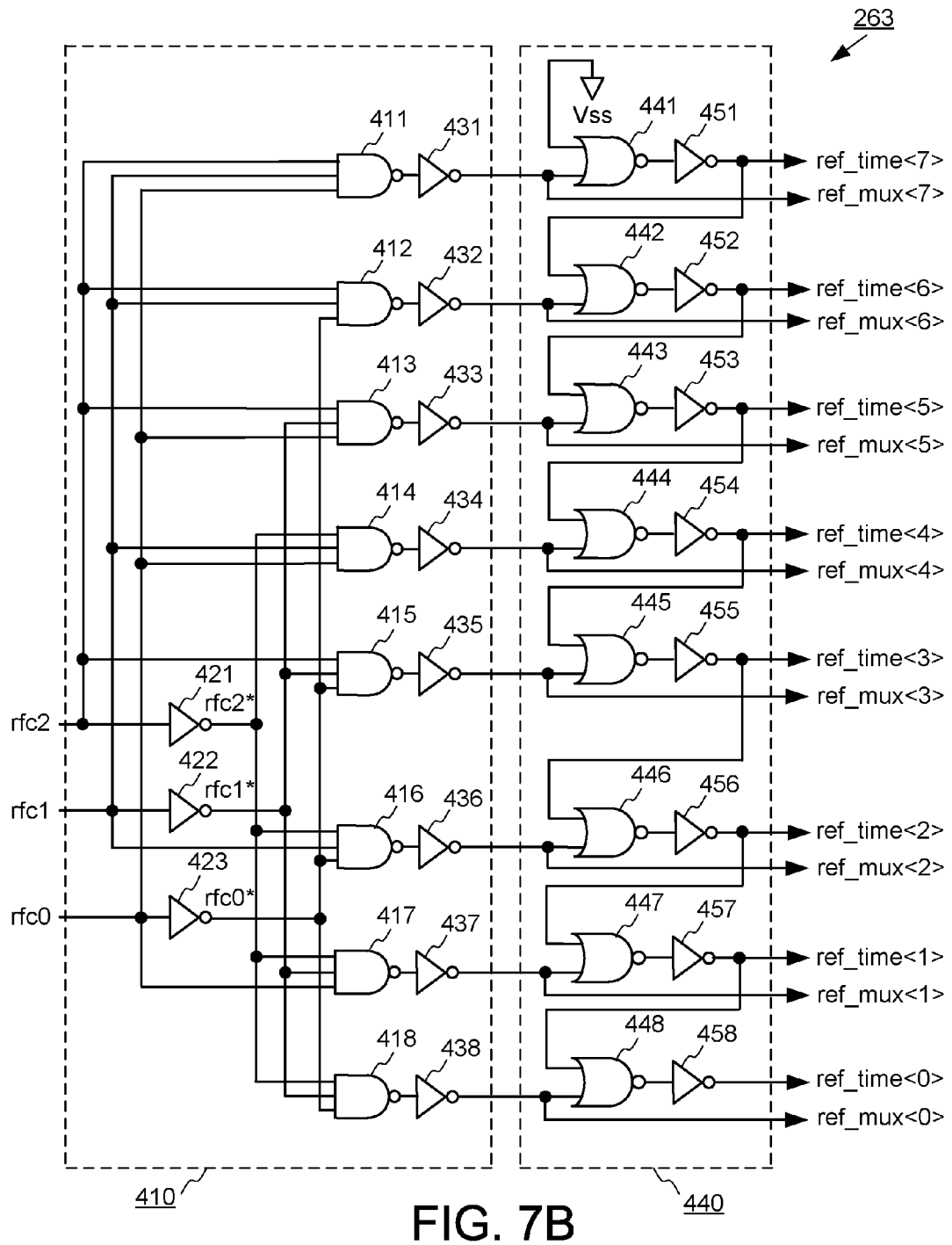
FIG. 7B is a schematic diagram illustrating a detailed circuit of the refresh period selector shown in FIG. 7A.

FIG. 7B shows a detailed circuit of the refresh period selector 263 that includes an input AND logic block 410 for decoding the refresh time characteristics and an output OR logic block 440 for providing the refresh time bits and refresh multiplexing bits from the decoded refresh time characteristics.

Referring to FIGS. 7A and 7B, the refresh period selector 263 receives the refresh period value signal 261 comprising the process variation related values of the refresh time characteristics "rfc0", "rfc1" and "rfc2". The refresh time characteristics "rfc0", "rfc1" and "rfc2" are fed to the input AND logic block 410 that includes eight NAND gates 411-418, three inverters 421-423 and eight inverters 431-438. One NAND gate (e.g., the NAND gate 411) and one inverter connected to its output (e.g., the inverter 431) form an AND logic circuit. The logic outputs of the input AND logic block 410 are fed to the output OR logic block 440 that includes eight NOR gates 441-448 and eight inverters 451-458. One NOR gate (e.g., the NOR gate 441) and one inverter connected to its output (e.g., the inverter 451) form an OR logic circuit.

The NAND gate 411 receives the three refresh time characteristics "rfc2", "rfc1" and "rfc0" and its NAND logic output signal is inverted by the inverter 431. The inverted output signal of the inverter 431 is fed to one input of the NOR gate 441, the other input of which is pulled down to the voltage level of Vss. The NAND gate 412 receives the refresh time characteristics "rfc2" and "rfc1" and the inverted logic signal "rfc0*" of the refresh time characteristic "rfc0" and its NAND logic output signal is inverted by the inverter 432. The inverted output signal of the inverter 432 is fed to one input of the NOR gate 442. The NAND gate 413 receives the refresh time characteristics "rfc2" and "rfc0" and the inverted logic signal "rfc1*" of the refresh time characteristic "rfc1" and its NAND logic output signal is inverted by the inverter 433. The inverted output signal of the inverter 433 is fed to one input of the NOR gate 443. The NAND gate 414 receives the refresh time characteristics "rfc1" and "rfc0" and the inverted logic signal "rfc2*" of the refresh time characteristic "rfc2" and its NAND logic output signal is inverted by the inverter 434. The inverted output signal of the inverter 434 is fed to one input of the NOR gate 444. The NAND gate 415 receives the refresh time characteristic "rfc2" and the inverted logic signals "rfc1*" and "rfc0*" and its NAND logic output signal is inverted by the inverter 435. The inverted output signal of the inverter 435 is fed to one input of the NOR gate 445. The NAND gate 416 receives the refresh time characteristic "rfc1" and the inverted logic signals "rfc2*" and "rfc0*" and its NAND logic output signal is inverted by the inverter 436. The inverted output signal of the inverter 436 is fed to one input of the NOR gate 446. The NAND gate 417 receives the refresh time characteristic "rfc0" and the inverted logic signals "rfc2*" and "rfc1*" and its NAND logic output signal is inverted by the inverter 437. The inverted output signal of the inverter 437 is fed to one input of the NOR gate 447. The NAND gate 418 receives the inverted logic signals "rfc2", "rfc1*" and "rfc0*" and its NAND logic output signal is inverted by the inverter 438. The inverted output signal of the inverter 438 is fed to one input of the NOR gate 448. The output signals of the inverters 451-457 are fed to the other outputs of the NOR gates 442-448, respectively.

The output logic signals from the inverters 431, 432, 433, 434, 435, 436, 437 and 438 are refresh multiplexing signals "ref_mux<7>", "ref_mux<6>", "ref_mux<5>", "ref_mux<4>", "ref_mux<3>", "ref_mux<2>", "ref_mux<1>" and "ref_mux<0>", respectively, and these signals can be considered part of the process variation-multiplexing signal 267mx. The output logic signals from the inverters 451, 452, 453, 454, 455, 456, 457 and 458 are refresh time signals "ref_time<7>", "ref_time<6>", "ref_time<5>", "ref_time<4>", "ref_time<3>", "ref_time<2>", "ref_time<1>" and "ref_time<0>", respectively, and these signals can be considered part of the process variation-frequency division signal 266dv. The process variation-frequency division signal 266dv and the process variation-multiplexing signal 267mx are included in the process variation factor signal 265.

The logic of the refresh period selector 263 is as follows:

B7 (which denotes "ref_mux<7>")=rfc2×rfc1×rfc0

A7 (which denotes "ref_time<7>")=B7

B6 (which denotes "ref_mux<6>")=rfc2×rfc1×rfc0*

A6 (which denotes "ref_time<6>")=B6+A7

B5 (which denotes "ref_mux<5>")=rfc2×rfc1*×rfc0

A5 (which denotes "ref_time<5>")=B5+A6

B4 (which denotes "ref_mux<4>")=rfc2*×rfc1×rfc0

A4 (which denotes "ref_time<4>")=B4+A5

B3 (which denotes "ref_mux<3>")=rfc2×rfc1*×rfc0*

A3 (which denotes "ref_time<3>")=B3+A4

B2 (which denotes "ref_mux<2>")=rfc2*×rfc1×rfc0*

A2 (which denotes "ref_time<2>")=B2+A3

B1 (which denotes "ref_mux<1>")=rfc2*×rfc1*×rfc0

A1 (which denotes "ref_time<1>")=B1+A2

B0 (which denotes "ref_mux<0>")=rfc2*×rfc1*×rfc0*

A0 (which denotes "ref_time<0>")=B0+A1

Table 5 is the truth table of the refresh time characteristics "rfc0", "rfc1" and "rfc2" and the decoded logic outputs of the refresh period selector 263. In accordance with the refresh time characteristics "rfc0", "rfc1" and "rfc2", the multiplexing outputs "ref_mux" and "ref_time" are provided, as shown in Table 5.

TABLE 5

| Refresh Time Characteristic | | | Decoded Output A7 – A0 ("ref_time<7>" – "ref_time<7>") B7 – B0 ("ref_mux<7>" – "ref_mux<0>") | | | | | | | | | | | | | | | |
|---|---|---|---|---|---|---|---|---|---|---|---|---|---|---|---|---|---|---|---|
| rfc2 | rfc1 | rfc0 | A7 | B7 | A6 | B6 | A5 | B5 | A4 | B4 | A3 | B3 | A2 | B2 | A1 | B1 | A0 | B0 |
| 0 | 0 | 0 | 0 | 0 | 0 | 0 | 0 | 0 | 0 | 0 | 0 | 0 | 0 | 0 | 0 | 0 | 1 | 1 |
| 0 | 0 | 1 | 0 | 0 | 0 | 0 | 0 | 0 | 0 | 0 | 0 | 0 | 0 | 0 | 1 | 1 | 1 | 0 |
| 0 | 1 | 0 | 0 | 0 | 0 | 0 | 0 | 0 | 0 | 0 | 0 | 0 | 1 | 1 | 1 | 0 | 1 | 0 |
| 1 | 0 | 0 | 0 | 0 | 0 | 0 | 0 | 0 | 0 | 0 | 1 | 1 | 1 | 0 | 1 | 0 | 1 | 0 |
| 0 | 1 | 1 | 0 | 0 | 0 | 0 | 0 | 0 | 1 | 1 | 1 | 0 | 1 | 0 | 1 | 0 | 1 | 0 |
| 1 | 0 | 1 | 0 | 0 | 0 | 0 | 1 | 1 | 1 | 0 | 1 | 0 | 1 | 0 | 1 | 0 | 1 | 0 |
| 1 | 1 | 0 | 0 | 0 | 1 | 1 | 1 | 0 | 1 | 0 | 1 | 0 | 1 | 0 | 1 | 0 | 1 | 0 |
| 1 | 1 | 1 | 1 | 1 | 1 | 0 | 1 | 0 | 1 | 0 | 1 | 0 | 1 | 0 | 1 | 0 | 1 | 0 |

Figure 8A:
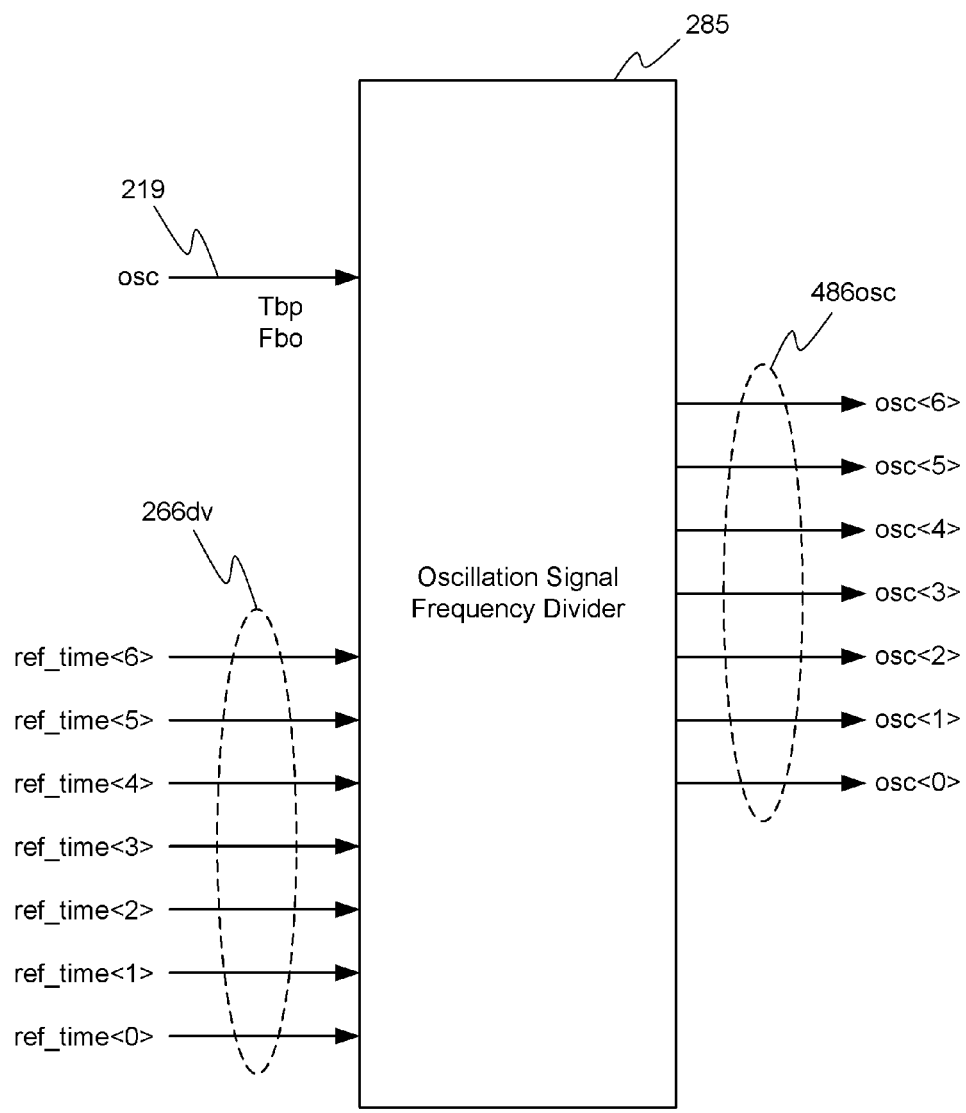
FIG. 8A is a block diagram illustrating an oscillation signal frequency divider shown in FIG. 5.

FIG. 8A shows the oscillation signal frequency divider 285 shown in FIG. 5. Referring to FIG. 8A, the oscillation signal frequency divider 285 receives the basic oscillation signal 219 from the basic time period generator 217 and the process variation-frequency division signal 266*dv* from the process variation factor signal 265. The oscillation signal frequency divider 285 provides the frequency divided oscillation signal 286 which comprises the frequency divided oscillation signal 486*osc*. In the present embodiment, one bit signal "ref_time<7>" of the process variation-frequency division signal 266*dv* is not fed to the oscillation signal frequency divider 285.

Figure 8B:
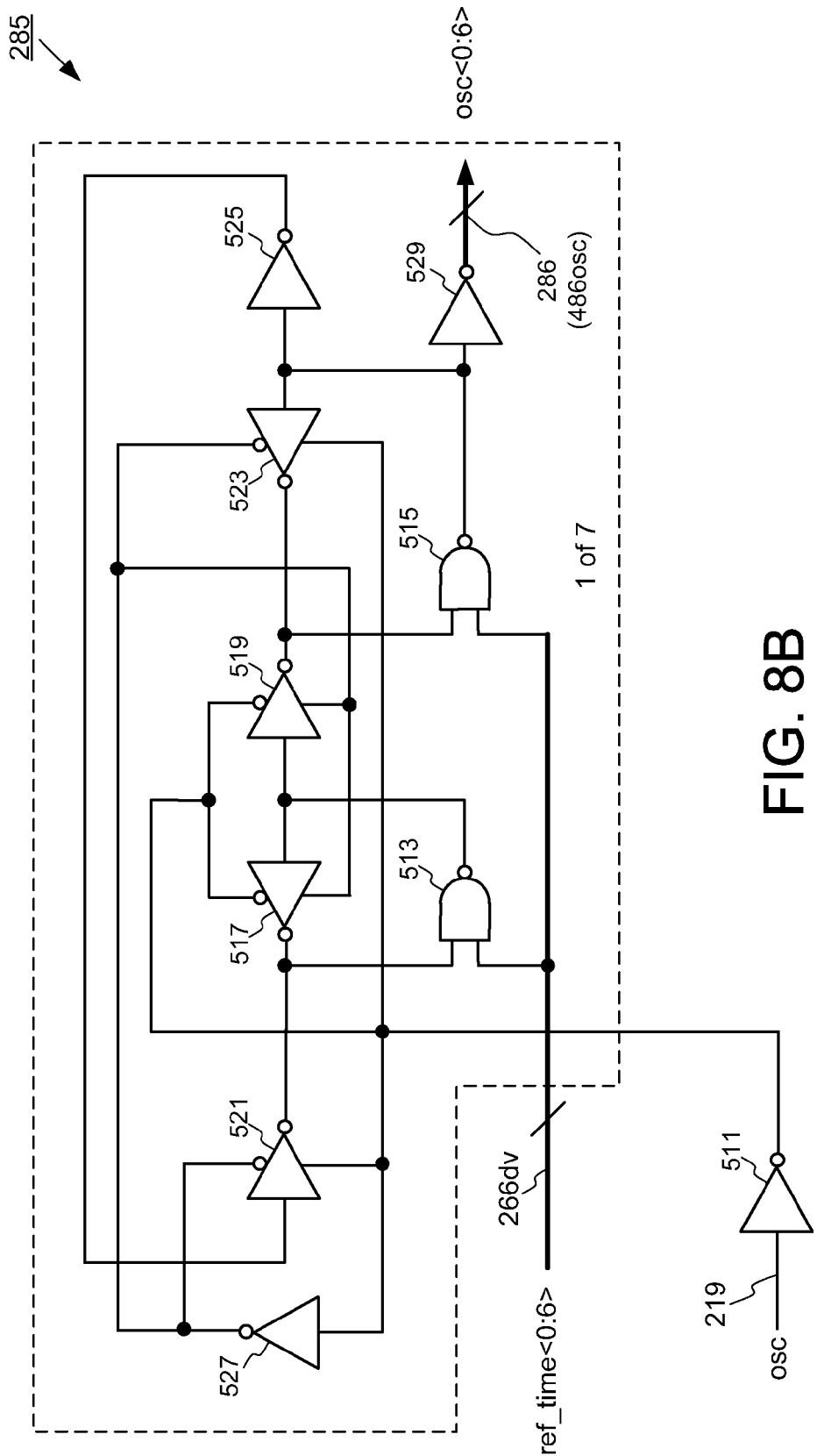
FIG. 8B is a schematic diagram illustrating a detailed circuit of the oscillation signal frequency divider shown in FIG. 8A.

FIG. 8B shows a detailed circuit of the oscillation signal frequency divider 285. Referring to FIGS. 8A and 8B, the basic oscillation signal 219 is inverted by an inverter 511 and its inverted output signal is provided to the non-inverting inputs of tri-state inverter circuits 521 and 523, the inverting inputs of tri-state inverter circuits 517 and 519 and an inverter 527. An inverted signal from the inverter 527 is fed to the inverting inputs of the tri-state inverter circuits 521 and 523 and the non-inverting inputs of the tri-state inverter circuits 517 and 519. The signal outputs of the tri-state inverter circuits 517 and 521 are coupled to each other and the coupled outputs are connected to one input of a NAND gate 513. Similarly, the signal outputs of the tri-state logic circuits 519 and 523 are coupled to each other and the coupled outputs are connected to one input of a NAND gate 515.

It is noted that the aforementioned circuit elements are shown for generating a single frequency divided oscillation signal (486*osc*) from one corresponding variation-frequency division signal (266*dv*). Accordingly, there are seven duplicate circuits. Hence, input signal ref_time<0:6> denotes a grouping of individual signals ref_time<0> to ref_time<6>, while output signal osc<0:6> denotes a grouping of individual signals osc<0> to osc<6>.

The process variation-frequency division signal 266*dv*, shown as signal grouping ref_time<0:6> from the refresh period selector 263 shown in FIGS. 7A and 7B is fed to the other inputs of the NAND gates 513 and 515. The output signal of the NAND gate 513 is fed to the signal inputs of the two tri-state logic circuits 517 and 519. The output signal of the NAND gate 515 is fed to the signal inputs of the tri-state logic circuit 523 and the inverter 525. The tri-state logic circuits 521, 517, 519 and 523 have the same structure as one shown in FIG. 9. The inverted output signal of the inverter 525 is fed to the signal input of the tri-state logic circuit 521. The output signal of the NAND gate 515 is inverted by an inverter 529 to produce the frequency divided oscillation signal 286 comprising the frequency divided oscillation signal 486*osc*, shown as signal grouping osc<0:6>.

Figure 9:
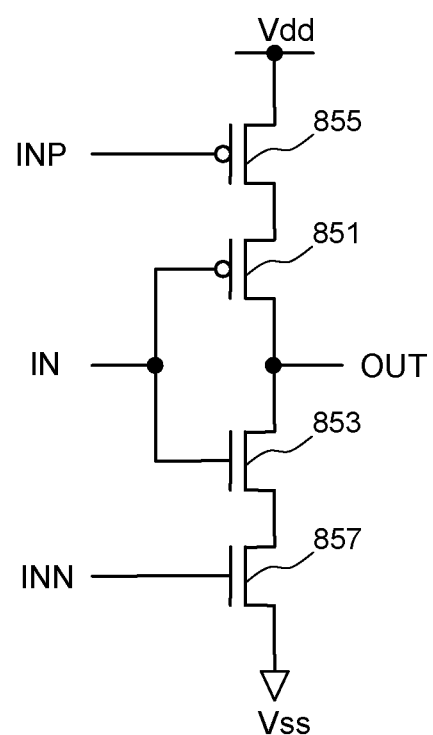
FIG. 9 is a schematic diagram illustrating a controlled inverter logic circuit shown in FIG. 8B.

Referring to FIG. 9, a tri-state logic circuit has signal input and output IN and OUT and inverting and non-inverting inputs INP and INN. The tri-state logic circuit includes series-connected PMOS transistor 851 and NMOS transistor 853 and additional PMOS transistor 855 and NMOS transistor 857. The PMOS transistor 855 is inserted between the source of the PMOS transistor 851 and the power line of power supply voltage Vdd. The NMOS transistor 857 is inserted between the source of the NMOS transistor 853 and the power line of ground level voltage Vss. The gates of the PMOS transistor 851 and the NMOS transistor 853 are coupled to each other and the coupled gates are connected to the signal input IN. The sources of the PMOS transistor 851 and the NMOS transistor 853 are coupled to each other and the coupled sources are connected to the signal output OUT. The gates of the PMOS transistor 855 and the NMOS transistor 857 are connected to the inverting input INP and the non-inverting input INN, respectively.

Again referring to FIGS. 8A and 8B, in accordance with seven bits "ref_time<0>"-"ref_time<6>" of the process variation-frequency division signal 266*dv*, the frequency Fbo of the basic oscillation signal 219 is divided to a set of m bit signals "osc<0>"-"osc<6>" of the frequency divided oscillation signal 486*osc*, wherein m is an integer greater than one, for example, seven. The logic states of the seven bit signals "ref_time<0>"-"ref_time<6>" for frequency dividing and time period multiplying are referred to A0-A6 in above Table 5.

The seven bit signals "osc<0>"-"osc<6>" of the frequency divided oscillation signal 486*osc* have different frequencies F286 as shown in Table 6. In Table 6, the process variation based multiplying factor Kpv is given by $Kpv=2^{Pi}$, wherein Pi is 0, 1, 2, 3, 4, 5 and 6.

TABLE 6

| Bit Signal <osc> | Frequency F286 = Fbo/Kpv |
|---|---|
| osc<0> | Fbo/1 |
| osc<1> | Fbo/2 |
| osc<2> | Fbo/4 |
| osc<3> | Fbo/8 |
| osc<4> | Fbo/16 |
| osc<5> | Fbo/32 |
| osc<6> | Fbo/64 |

Figure 10A:
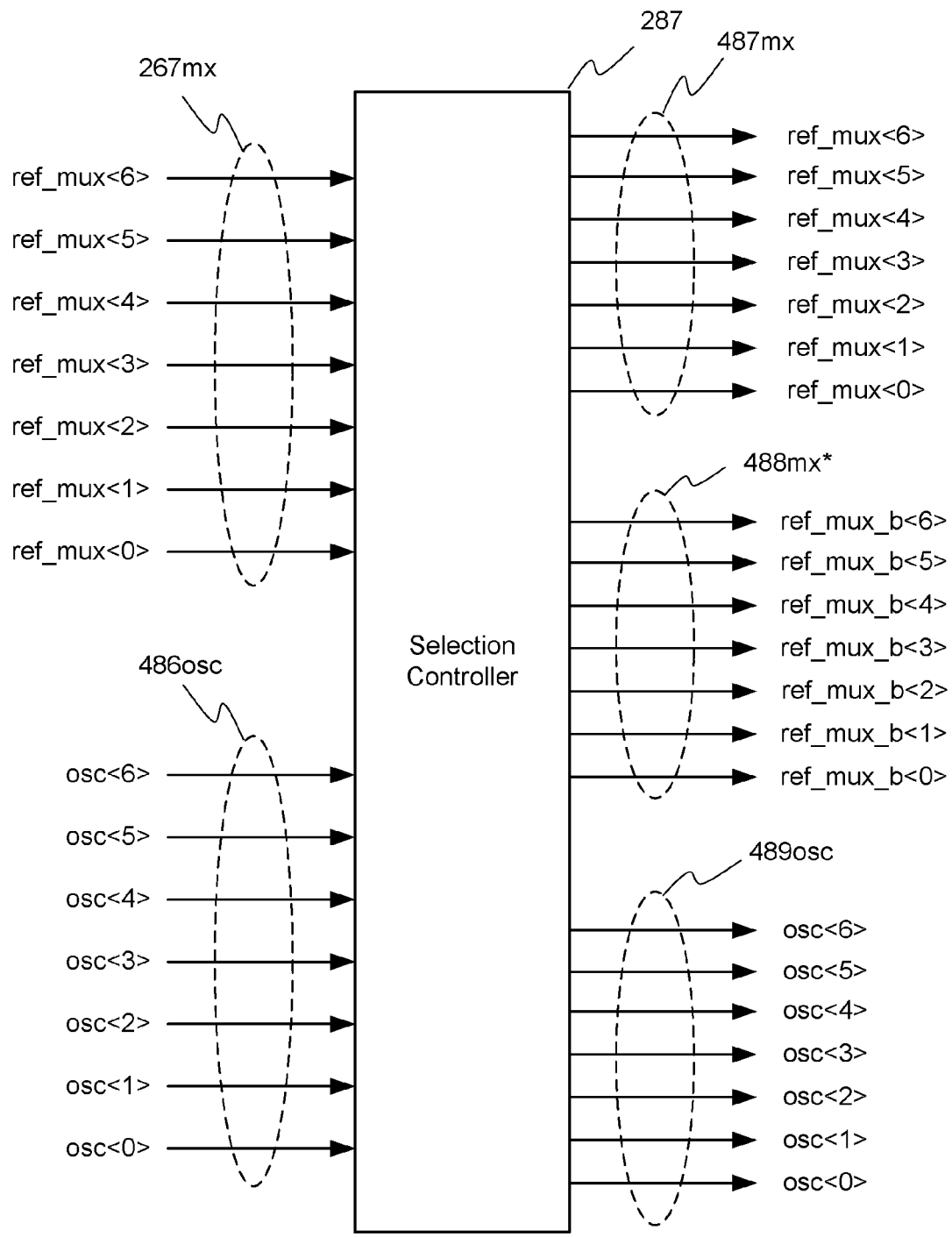
FIG. 10A is a block diagram illustrating a selection controller shown in FIG. 5.

FIG. 10A shows the selection controller 287 shown in FIG. 5. Referring to FIG. 10A, the selection controller 287 receives the process variation-multiplexing signal 267*mx* from the refresh period selector 263 and the frequency divided oscillation signal 486*osc* from the oscillation signal frequency divider 285. However, one bit "ref_mux<7>" of the process variation-multiplexing signal 267*mx* is not fed to the selection controller 287. In response to the process variation-multiplexing signal 267*mx* and the frequency divided oscillation signal 486*osc*, the selection controller 287 provides the frequency divided oscillation signal 288 comprising a seven-bit process variation-multiplexing signal 487*mx*, a seven-bit inverted process variation-multiplexing signal 488*mx** and a seven-bit frequency divided oscillation signal 489*osc*.

Figure 10B:
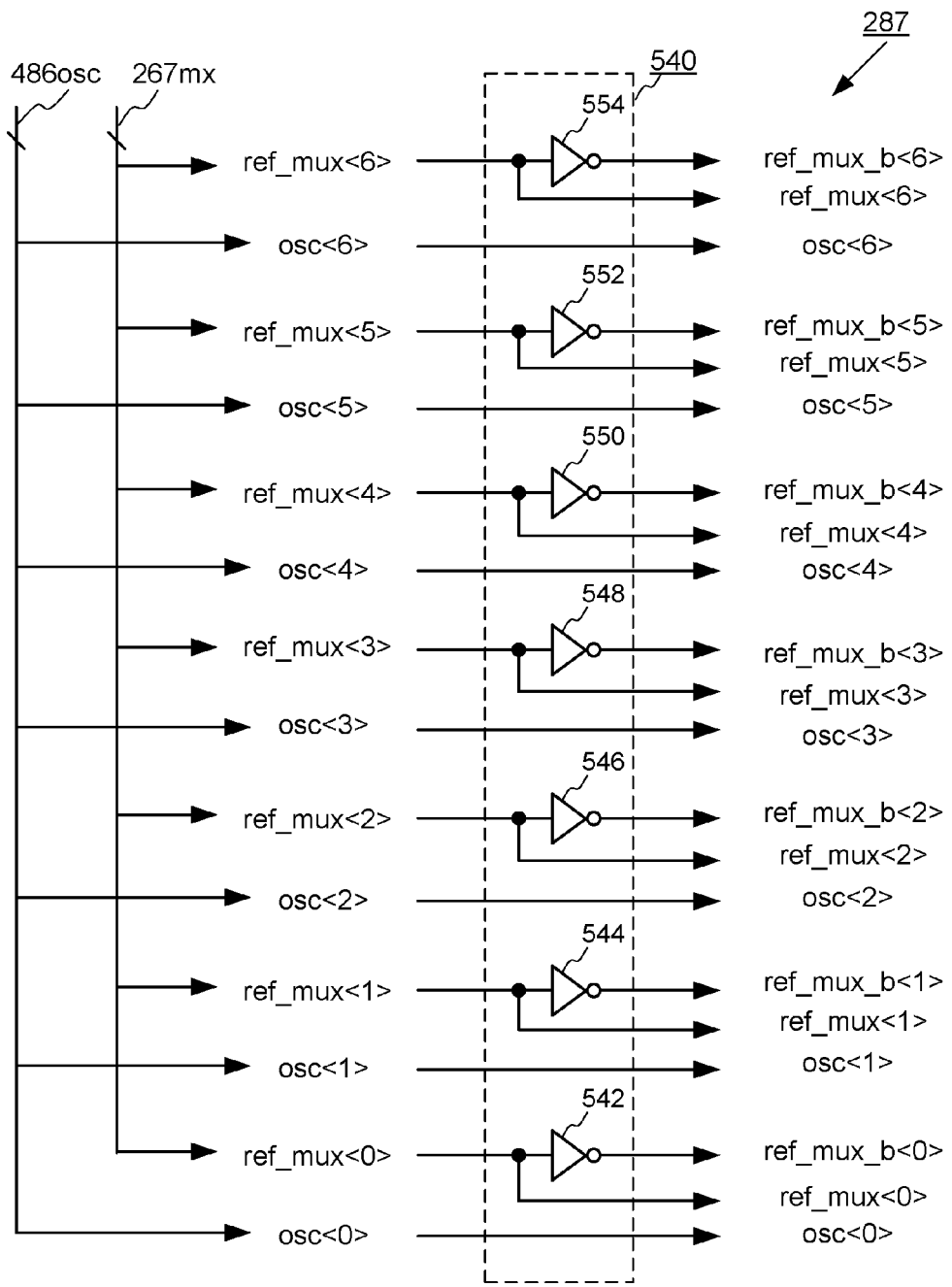
FIG. 10B is a schematic diagram illustrating a detailed circuit of the selection controller shown in FIG. 10A.

FIG. 10B shows a detailed circuit of the selection controller 287. Referring to FIGS. 10A and 10B, the selection controller 287 includes an inverter logic block 540 that includes seven inverters 542, 544, 546, 548, 550, 552 and 554. The inverters 542, 544, 546, 548, 550, 552 and 554 invert the seven bit signals "ref_mux<0>", "ref_mux<0>", "ref_mux<1>", "ref_mux<2>", "ref_mux<3>", "ref_mux<4>", "ref_mux<5>" and "ref_mux<6>" of the process variation-multiplexing signal 267*mx*, and provide seven-bit inverted signals "ref_mux_b<0>", "ref_mux_b<1>", "ref_mux_b<2>", "ref_mux_b<3>", "ref_mux_b<4>", "ref_mux_b<5>" and "ref_mux_b<6>", which are part of the inverted process variation-multiplexing signal 488*mx**. The bit signals "ref_mux<0>"-"ref_mux<6>" of the process variation-multiplexing signal 267*mx* pass the inverter logic block 540 without being inverted, as do seven bit signals "ref_mux<0>"-"ref_mux<6>" of the seven-bit process variation-multiplexing signal 487*mx*. The seven bit signals "ref_mux<0>", "ref_mux<0>", "ref_mux<1>", "ref_mux<2>", "ref_mux<3>", "ref_mux<4>", "ref_mux<5>" and "ref_mux<6>" of the process variation-multiplexing signal 267*mx* are inverted by the seven inverters 542-554. The logic states of seven bits "ref_mux<0>"-"ref_mux<6 are referred to as B0-B6 in Table 5. Similarly, the seven bit signals "osc<0>", "osc<1>", "osc<2>", "osc<3>", "osc<4>", "osc<5>" and "osc<6>" of the frequency divided oscillation signal 486*osc* are provided without being inverted as the frequency divided oscillation signal 489*osc*.

Figure 11A:
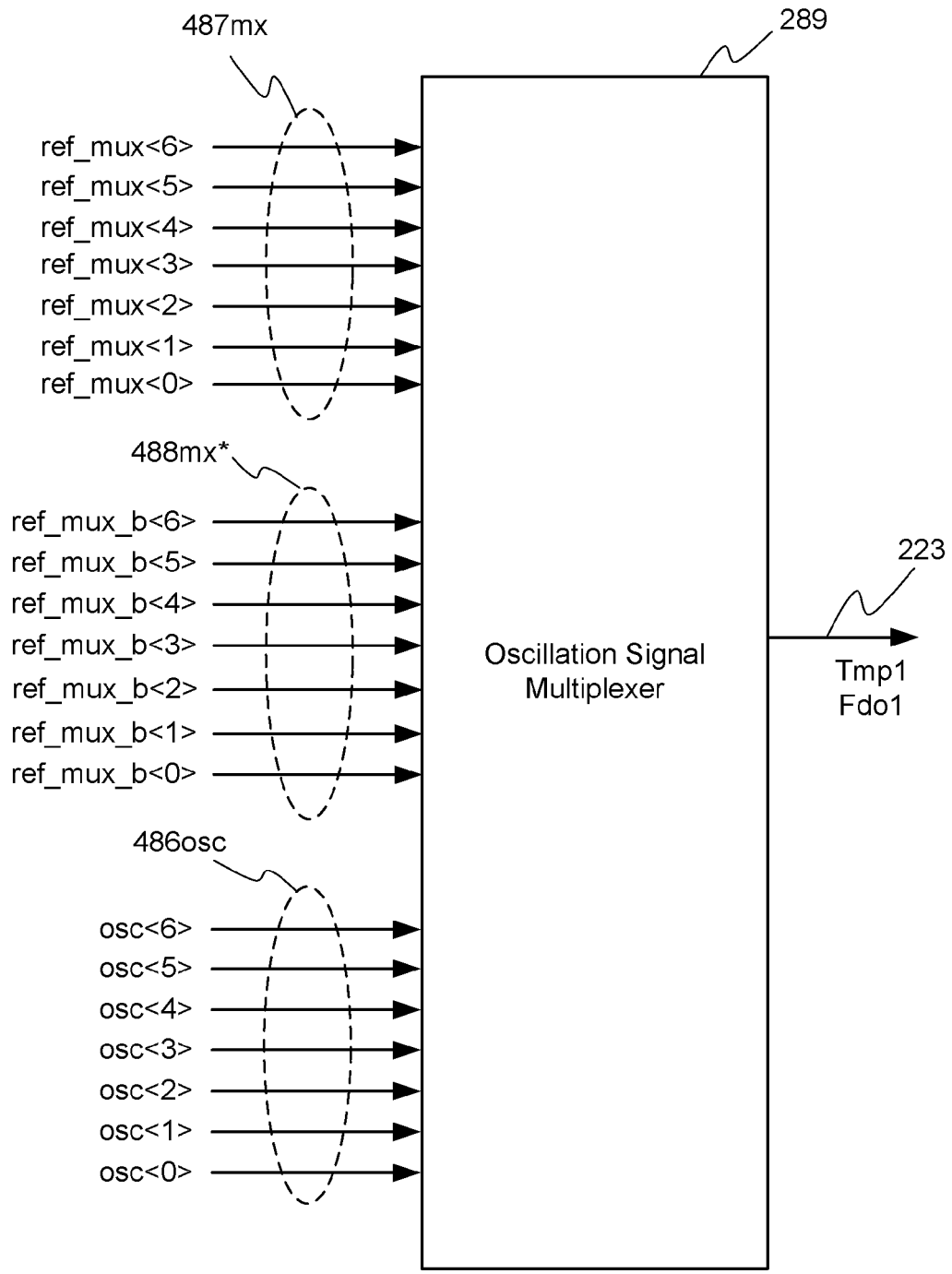
FIG. 11A is a block diagram illustrating an oscillation signal multiplexer shown in FIG. 5.

FIG. 11A shows the oscillation signal multiplexer 289 shown in FIG. 5. Referring to FIG. 11A, the oscillation signal multiplexer 289 receives the process variation-multiplexing signal 487*mx*, the complementary process variation-multiplexing signal 488*mx** and the frequency divided oscillation signal 489*osc* from the inverter logic block 540 shown in FIG. 10B. The oscillation signal multiplexer 289 provides the first frequency divided signal 223.

Figure 11B:
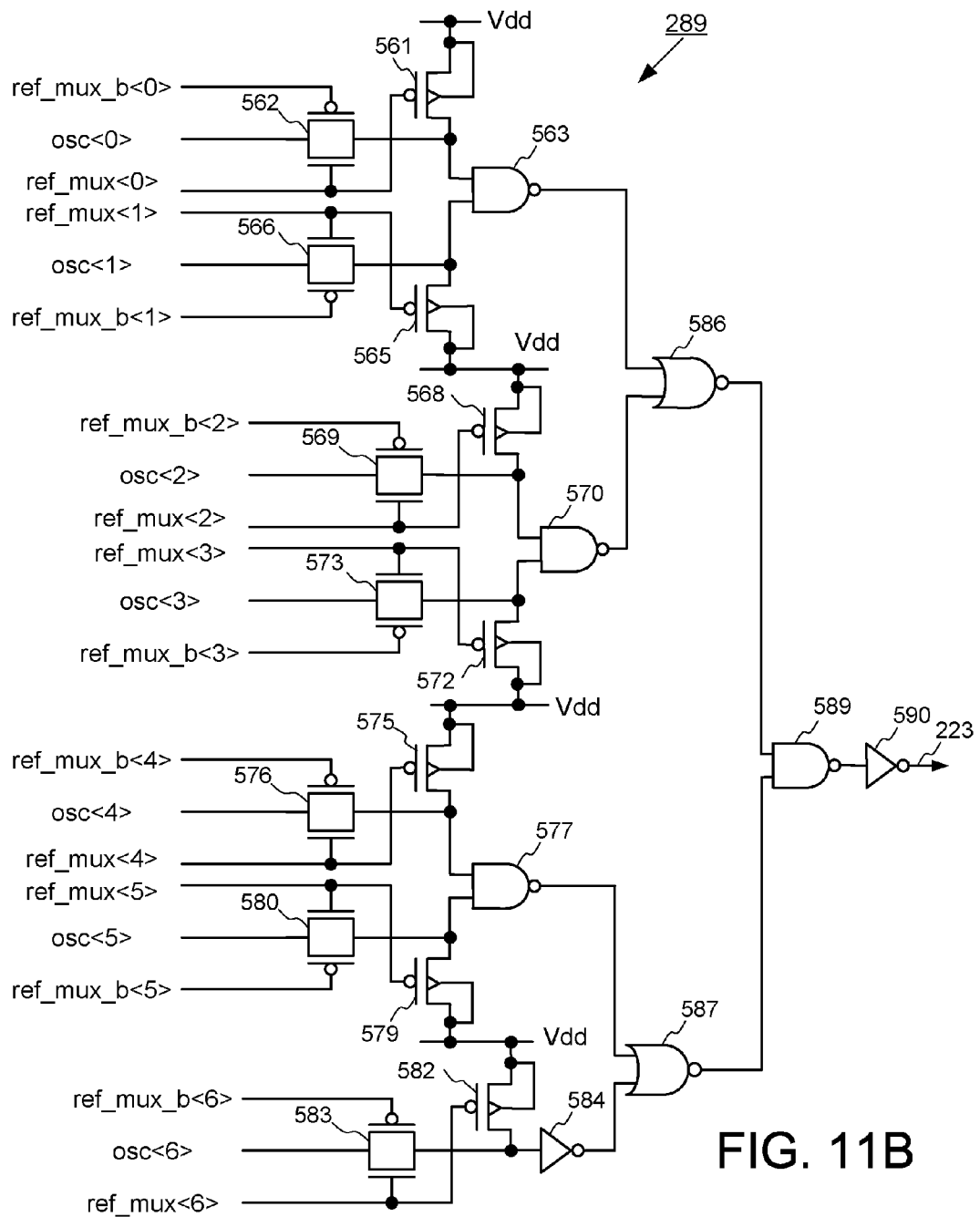
FIG. 11B is a schematic diagram illustrating a detailed circuit of the oscillation signal multiplexer shown in FIG. 11A.

FIG. 11B shows a detailed circuit of the oscillation signal multiplexer 289. Referring to FIGS. 11A and 11B, the oscillation signal multiplexer 289 includes seven PMOS transistors 561, 565, 568, 572, 575, 579 and 582, the sources of which are provided with the Vdd voltage. Seven bit signals "ref_mux<0>", "ref_mux<1>", "ref_mux<2>", "ref_mux<3>", "ref_mux<4>", "ref_mux<5>" and "ref_mux<6>" are provided from the selection controller 287 (see FIGS. 10A and 10B) to the gates of the PMOS transistors 561, 565, 568, 572, 575, 579 and 582, respectively, and to the n-channel gates of seven transmission gates 562, 566, 569, 573, 576, 580 and 583, respectively. The inverted bits "ref_mux_b<0>", "ref_mux_b<1>", "ref_mux_b<2>", "ref_mux_b<3>", "ref_mux_b<4>", "ref_mux_b<5>" and "ref_mux_b<6>" are provided to the p-channel gates of the transmission gates 562, 566, 569, 573, 576, 580 and 583, respectively. The bit signals "osc<0>", "osc<1>", "osc<2>", "osc<3>", "osc<4>", "osc<5>" and "osc<6>" of the frequency divided oscillation signal 486*osc* are provided to the signal inputs of the transmission gates 562, 566, 569, 573, 576, 580 and 583, respectively.

The signal output of the transmission gate 562 is connected to the drain of the PMOS transistor 561 and one input of a NAND gate 563. The signal output of the transmission gate 566 is connected to the drain of the PMOS transistor 565 and the other input of the NAND gate 563. The signal output of the transmission gate 569 is connected to the drain of the PMOS transistor 568 and one input of a NAND gate 570. The signal output of the transmission gate 573 is connected to the drain of the PMOS transistor 572 and the other input of the NAND gate 570. The signal output of the transmission gate 576 is connected to the drain of the PMOS transistor 575 and one input of a NAND gate 577. The signal output of the transmission gate 580 is connected to the drain of the PMOS transistor 579 and the other input of the NAND gate 577. The signal output of the transmission gate 583 is connected to the drain of the PMOS transistor 582 and the inverter 584.

The outputs of the NAND gates 563 and 570 are connected to a NOR gate 586, the output of which is connected to an input of NAND gate 589. The outputs of the NAND gate 577 and the inverter 584 are connected to a NOR gate 587, the output of which is connected to another input of NAND gate 589. An output of the NAND gate 589 is inverted by an inverter 590 to produce the first frequency divided signal 223. The NAND gate 589 and the inverter 590 form an AND logic circuit.

When the signal bit "ref_mux<0>" is "high" (i.e., the signal bit "ref_mux_b<0>" is "low"), the input oscillation bit signal "osc<0>" passes through to the output of the transmission gate 562 and is provided to the NAND gate 563. When the signal "ref_mux<0>" is "low", the input oscillation bit signal "osc<0>" does not pass through the transmission gate 562. The other transmission gates operate in the same manner. When the signal bit "ref_mux<1>" is "high", the oscillation bit signal "osc<1>" is provided to the NAND gate 563 through the transmission gate 566. Similarly, when the signal "ref_mux<2>" is "high", the oscillation bit signal "osc<2>" is provided to the NAND gate 570 through the transmission gate 569. When the signal "ref_mux<3>" is "high", the oscillation bit signal "osc<3>" is provided to the NAND gate 570 through the transmission gate 573. The oscillation bit signal "osc<4>" is provided to the NAND gate 577 through the transmission gate 576, when the signal "ref_mux<4>" is "high". The oscillation bit signal "osc<5>" is provided to the NAND gate 577 through the transmission gate 580, when the signal "ref_mux<5>" is "high". When the signal "ref_mux<6>" is "high", the oscillation bit signal "osc<6>" is transferred through the transmission gate 583 and the transferred signal is inverted by the inverter 584. The inverted output signal from the inverter 584 is fed to the NOR gate 587.

The output signals from the NAND gates 563 and 570 are fed to the NOR gate 586, the output signal of which is fed to one input of the NAND gate 589. The output signals from the NAND gate 577 and the inverter 584 are fed to the NOR gate 587, the output signal of which is fed to the other input of the NAND gate 589. The output signal of the NAND gate 589 is inverted by the inverter 590 and becomes as the first frequency divided signal 223.

The logic states of the bit signals "ref_mux<6>"-"ref_mux<0>" of the process variation-multiplexing signal 487*mx* are shown in Table 5, as "B6"-"B0". The "ref_mux_b<6>"-"ref_mux_b<0>" of the inverted process variation-multiplexing signal 488*mx** are the inverted states of the bit signals "ref_mux<6>"-"ref_mux<0>". In accordance with the bit signals "ref_mux<6>"-"ref_mux<0>" and "ref_mux_b<6>"-"ref_mux_b<0>", one of the seven bit signals "osc<0>"-"osc<6>" is selected and the selected signal is provided as the first frequency divided signal 223. The first frequency divided signal 223 has the divided frequency Fdo1 and the multiplied period Tmp1.

Figure 12A:
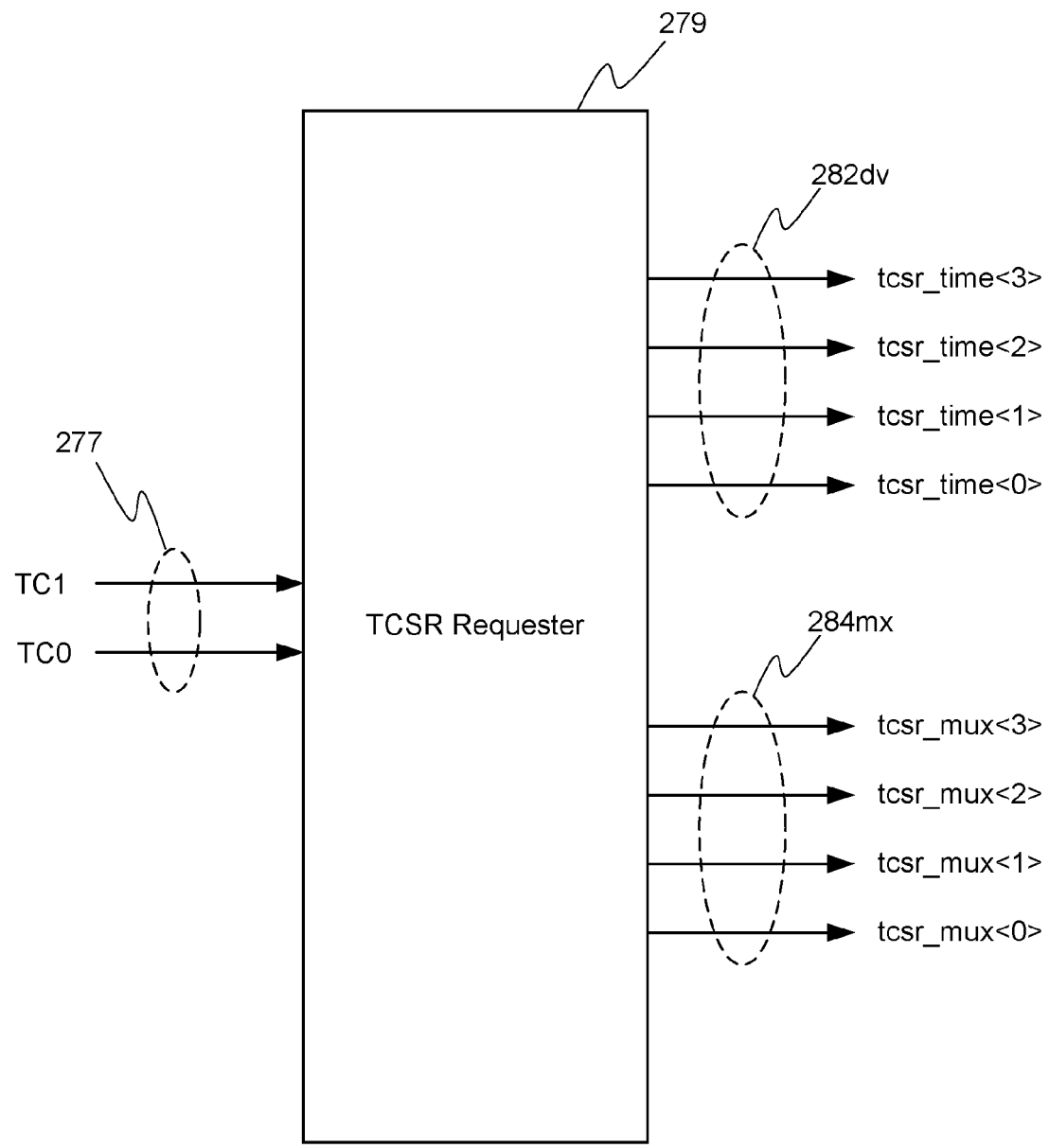
FIG. 12A is a block diagram illustrating a temperature compensated self-refresh (TCSR) requester of the DRAM device in FIGS. 3A and 3B.
Figure 12B:
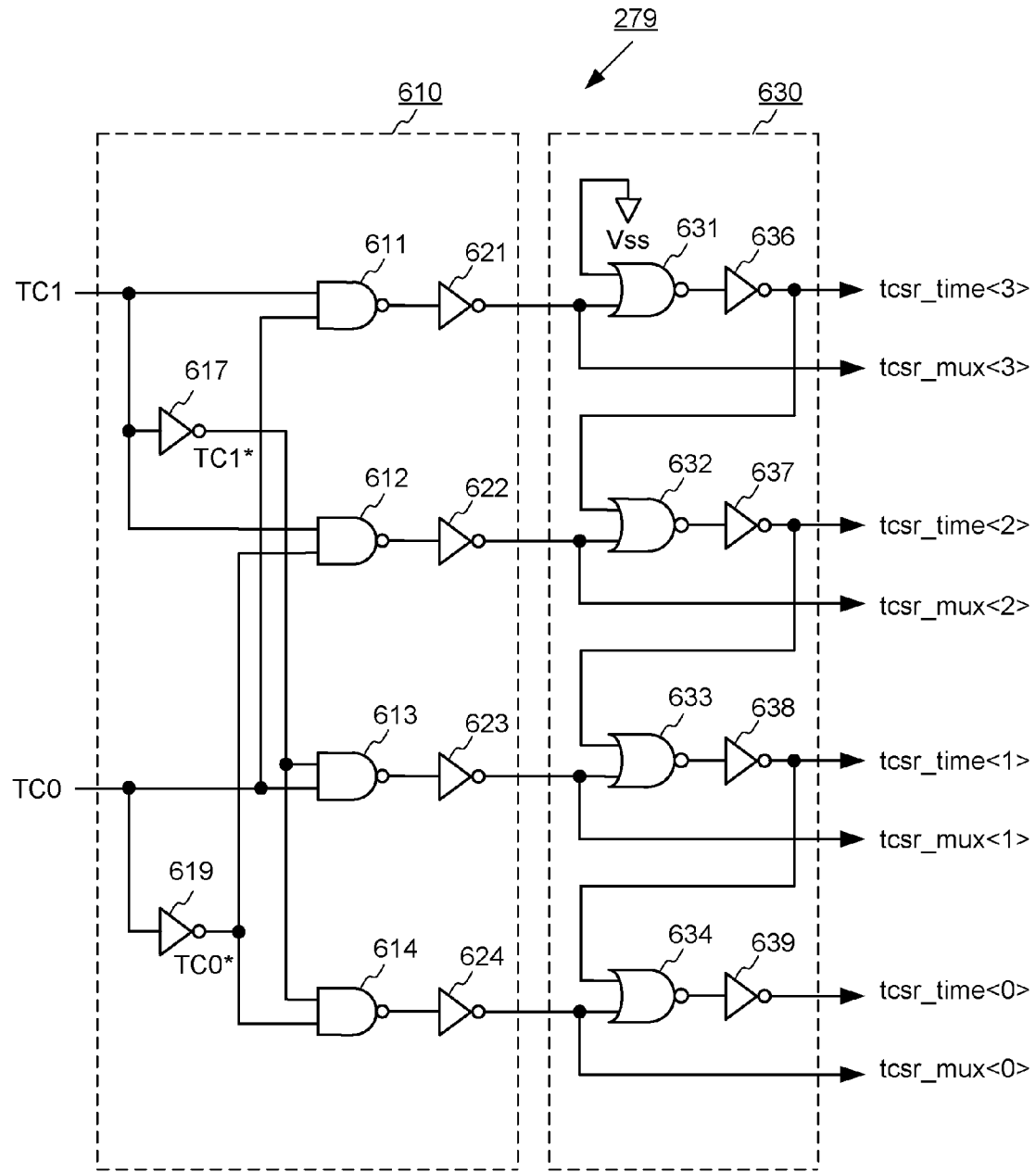
FIG. 12B is a schematic diagram illustrating a detailed circuit of the TCSR requester shown in FIG. 12A.

FIG. 12A shows the TCSR decoder 279 of the DRAM device in FIGS. 3A and 3B. FIG. 12B shows a detailed circuit of the TCSR decoder 279. Referring to FIG. 12A, the TCSR decoder 279 receives the TCSR signal 277 from the TCSR requester 275 and provides the temperature compensation factor signal 281 comprising a four-bit temperature compensation-frequency division signal 282$dv$ and a four-bit temperature compensation-multiplexing signal 284$mx$.

FIG. 12B shows a detailed circuit of the TCSR decoder 279. Referring to FIGS. 12A and 12B, two bits of input logic signals "TC1" and "TC0" of the TCSR signal 277 are fed to an input AND logic block 610 that includes four NAND gates 611, 612, 613 and 614, two signal inverting inverters 617 and 619, and four inverters 621, 622, 623 and 624. The input logic signals "TC1" and "TC0" are derived from the temperature changes sensed by the temperature sensor 271 (see FIGS. 3A and 3B). Here, the input logic signals "TC1" and "TC0" represent a measured temperature. One NAND gate (e.g., the NAND gate 611) and one inverter connected to its output (e.g., the inverter 621) form an AND logic circuit. The logic outputs of the input AND logic block 610 are fed to an output OR logic block 630 that includes four NOR gates 631, 632, 633 and 634 and four inverters 636, 637, 638 and 639. One NOR gate (e.g., the NOR gate 631) and one inverter connected to its output (e.g., the inverter 636) form an OR logic circuit.

The NAND gate 611 receives the input logic signals "TC1" and "TC0" and its NAND logic output signal is inverted by the inverter 621. The inverted output signal of the inverter 621 is fed to one input of the NOR gate 631, the other input of which is connected to the voltage level of Vss. The NAND gate 612 receives the input logic signal "TC1" and the inverted logic signal "TC0*" of the input logic signal "TC0" and its NAND logic output signal is inverted by the inverter 622. The inverted output signal of the inverter 622 is fed to one input of the NOR gate 632. The NAND gate 613 receives the inverted logic signal "TC1*" of the input logic signal "TC1" and the input logic signal "TC0" and its NAND logic output signal is inverted by the inverter 623. The inverted output signal of the inverter 623 is fed to one input of the NOR gate 633. The NAND gate 614 receives the inverted logic signals "TC1*" and "TC0*" and its NAND logic output signal is inverted by the inverter 624. The inverted output signal of the inverter 624 is fed to one input of the NOR gate 634.

The logic output signal of the NOR gate 631 is inverted by the inverter 636 and its inverted output signal is provided to the other input of the NOR gate 632. The logic output signal of the NOR gate 632 is inverted by the inverter 637 and its inverted output signal is provided to the other input of the NOR gate 633. The logic output signal of the NOR gate 633 is inverted by the inverter 638 and its inverted output signal is provided to the other input of the NOR gate 634. The logic output signal of the NOR gate 634 is inverted by the inverter 639.

The output logic signals from the inverters 621, 622, 623 and 624 are TCSR multiplexing signals "tcsr_mux<3>", tcsr_mux<2>", tcsr_mux<1>" and tcsr_mux<0>", respectively. The output logic signals from the inverters 636, 637, 638 and 639 are TCSR time signals "tcsr_time<3>", "tcsr_time<2>", "tcsr_time<1>" and "tcsr_time<0>", respectively.

The logic of the TCSR decoder 279 is as follows:
D3 (which denotes "tcsr_mux<3>")=TC1×TC0
C3 (which denotes "tcsr_time<3>")=D3
D2 (which denotes "tcsr_mux<2>")=TC1×TC0*
C2 (which denotes "tcsr_time<2>")=D2+C3

D1 (which denotes "tcsr_mux<1>")=TC1*×TC0
C1 (which denotes "tcsr_time<1>")=D1+C2
D0 (which denotes "tcsr_mux<0>")=TC1*×TC0*
C0 (which denotes "tcsr_time<0>")=D0+C1.

The logic in the circuits shown in FIG. 12B is given by the truth table shown in Table 7.

TABLE 7

| Temperature Change | | Decoded Output C3 – D0 ("tcsr_time<3>" – " "tcsr_time<0>") D3 – D0 ("tcsr_mux<3>" – "tcsr_mux<0>") | | | | | | | |
|---|---|---|---|---|---|---|---|---|---|
| TC1 | TC0 | C3 | D3 | C2 | D2 | C1 | D1 | C0 | D0 |
| 0 | 0 | 0 | 0 | 0 | 0 | 0 | 0 | 1 | 1 |
| 0 | 1 | 0 | 0 | 0 | 0 | 1 | 1 | 1 | 0 |
| 1 | 0 | 0 | 0 | 1 | 1 | 1 | 0 | 1 | 0 |
| 1 | 1 | 1 | 1 | 1 | 0 | 1 | 0 | 1 | 0 |

As shown in Table 7, the temperature changes represented by the two-bit signal of "TC0" and "TC1" are given as four examples. The two bits "TC0" and "TC1" are decoded by the TCSR decoder 279 and the temperature compensation-frequency division signal 282$dv$ having four bits "tcsr_time<0>"-"tcsr_time<3>" and the temperature compensation-multiplexing signal 284$mx$ having four bits "tcsr_mux<0>"-"tcsr_mux<3>" are provided. The logic states of "tcsr_time<0>"-"tcsr_time<3>" are referred to "C0"-"C3" in Table 7. Also, the logic states of "tcsr_mux<0>"-"tcsr_mux<3>" are referred to "D0"-"D3" in Table 7.

Figure 13A:
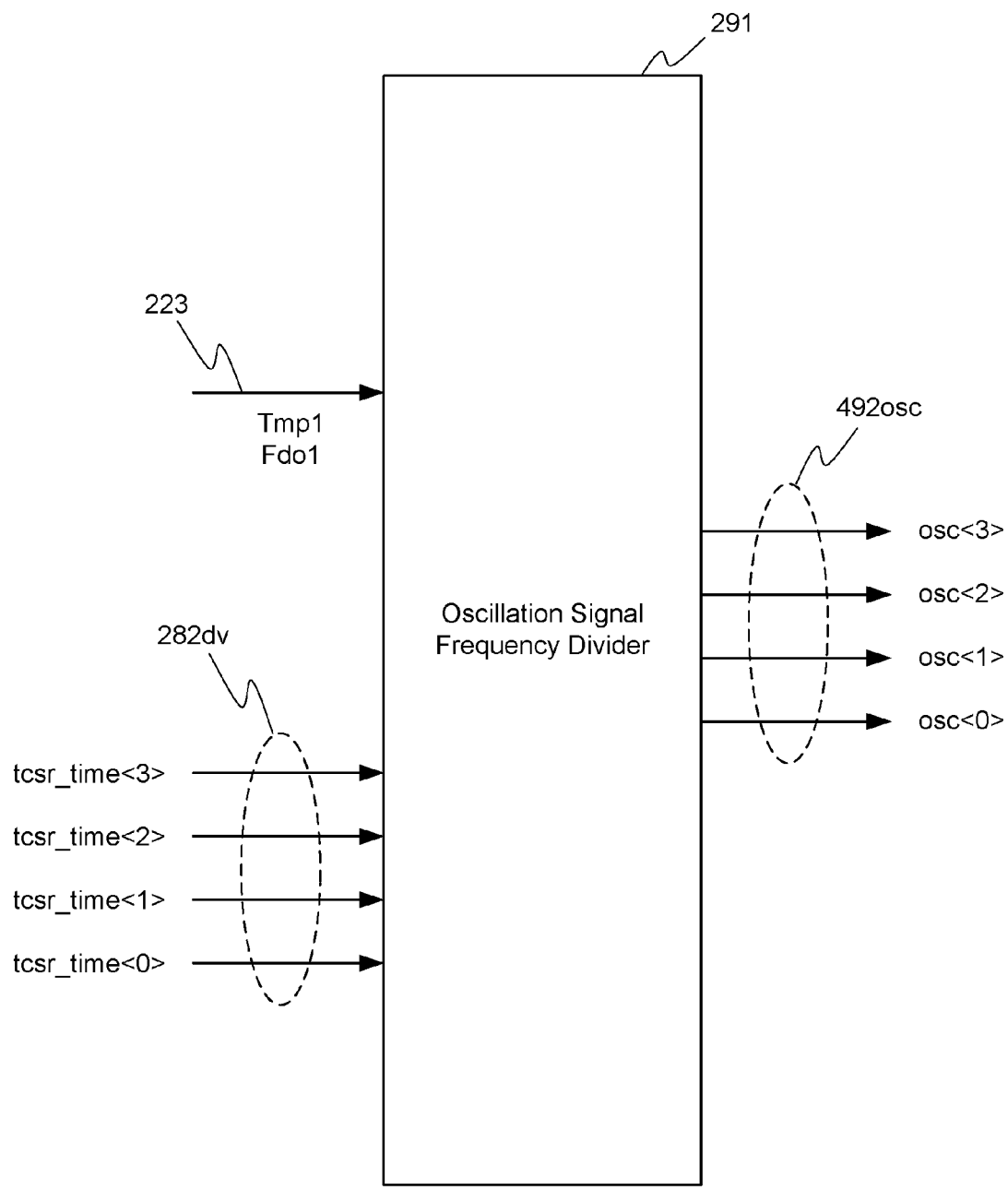
FIG. 13A is a block diagram illustrating an oscillation signal frequency divider shown in FIG. 5.

FIG. 13A shows the oscillation signal frequency divider 291 shown in FIG. 5. Referring to FIG. 13A, the oscillation signal frequency divider 291 receives the first frequency divided signal 223 from the first refresh time changer 221 and the temperature compensation-frequency division signal 282$dv$ from the TCSR decoder 279 shown in FIGS. 12A and 12B and provides the frequency divided oscillation signal 292 comprising four frequency divided oscillation signals 492$osc$.

Figure 13B:
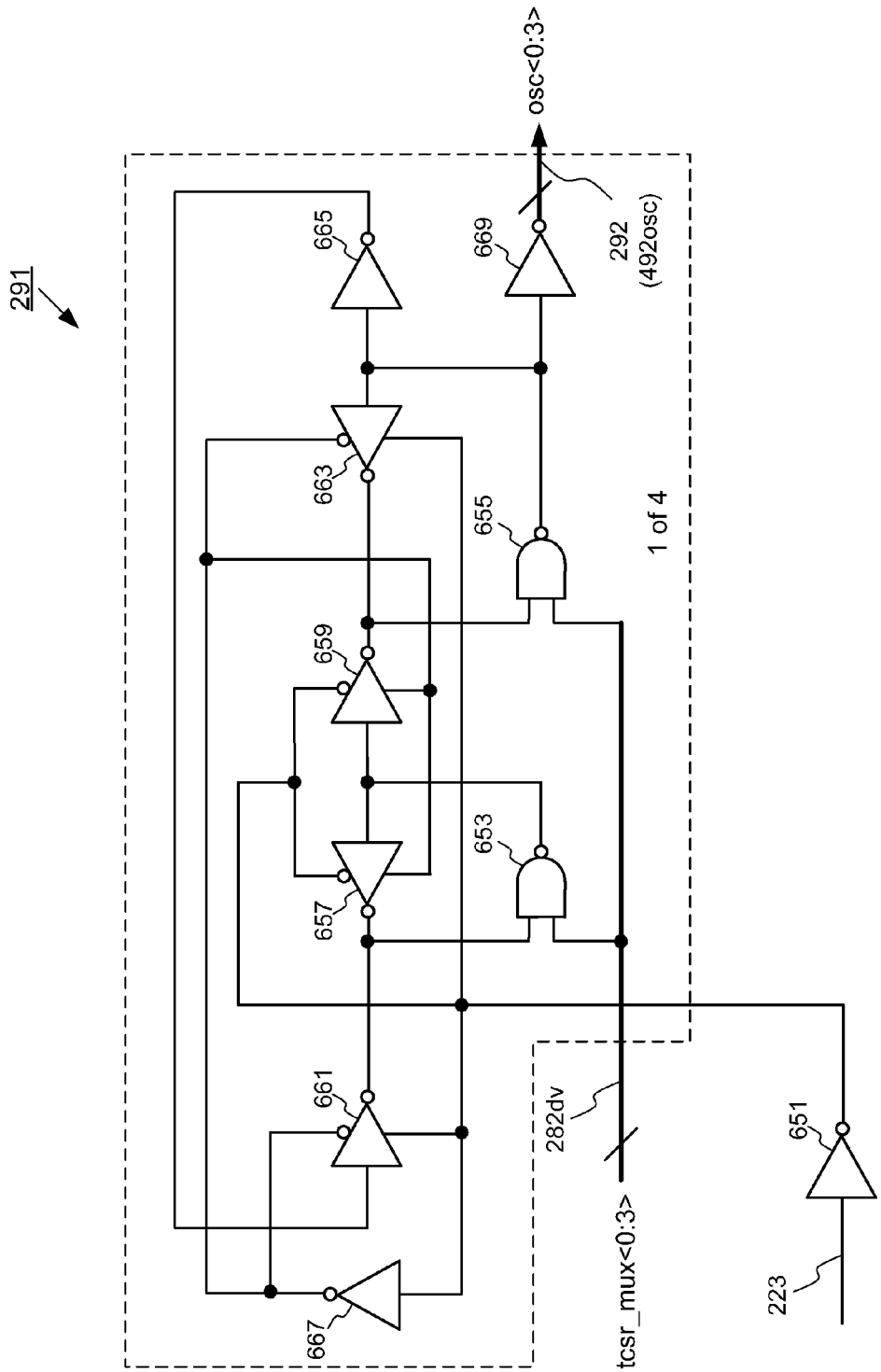
FIG. 13B is a schematic diagram illustrating a detailed circuit of the oscillation signal frequency divider shown in FIG. 13A.

FIG. 13B shows a detailed circuit of the oscillation signal frequency divider 291. Referring to FIGS. 13A and 13B, the first frequency divided signal 223 is inverted by an inverter 651 and its inverted signal is provided to non-inverting inputs of tri-state inverter circuits 661 and 663 and inverting inputs of tri-state inverter circuits 657 and 659. A tri-state inverter circuit 667 has an output provided to inverting inputs of the tri-state logic circuits 661 and 663 and non-inverting inputs of the tri-state inverter circuits 657 and 659. The outputs of the tri-state inverter circuits 657 and 661 are coupled to each other and the coupled output is connected to an input of a NAND gate 653. Similarly, the outputs of the tri-state inverter circuits 659 and 663 are coupled to each other and the coupled output is connected to an input of a NAND gate 655. The controlled inverter logic circuits are the same as one shown in FIG. 9.

The temperature compensation-frequency division signal 282$dv$ is fed to inputs of the NAND gates 653 and 655. The output of the NAND gate 653 is fed to the inputs of the two tri-state inverter circuits 657 and 659. The output of the NAND gate 655 is fed to the inputs of the tri-state inverter circuit 663 and the inverter 665. The inverted output signal of the inverter 665 is fed to the input of the tri-state inverter circuit 661. The output of the NAND gate 655 is inverted by an inverter 669 to produce the frequency divided oscillation signal 292 comprising the four frequency divided oscillation signal 492$osc$.

It is noted that the aforementioned circuit elements are shown for generating a single frequency divided oscillation signal (492osc) from one corresponding temperature compensation-frequency division signal 282dv. Accordingly, there are four duplicate circuits. Hence, input signal tcsr_mux<0:3> denotes a grouping of individual signals tcsr_mux<0> to tcsr_mux<3>, while output signal osc<0:3> denotes a grouping of individual signals osc<0> to osc<3>.

The four bit signals "osc<0>"-"osc<3>" of the frequency divided oscillation signal 492osc have different frequencies F492 as shown in Table 8. In Table 8, the process variation based multiplying factor Ktc is given by Ktc=$2^{Pj}$, where Pj is −1, 0, 1 and 2.

TABLE 8

| Bit Signal <osc> | Frequency F492 = Fdo1/Ktc |
| --- | --- |
| osc<0> | Fdo1/0.5 |
| osc<1> | Fdo1/1 |
| osc<2> | Fdo1/2 |
| osc<3> | Fdo1/4 |

Figure 14A:
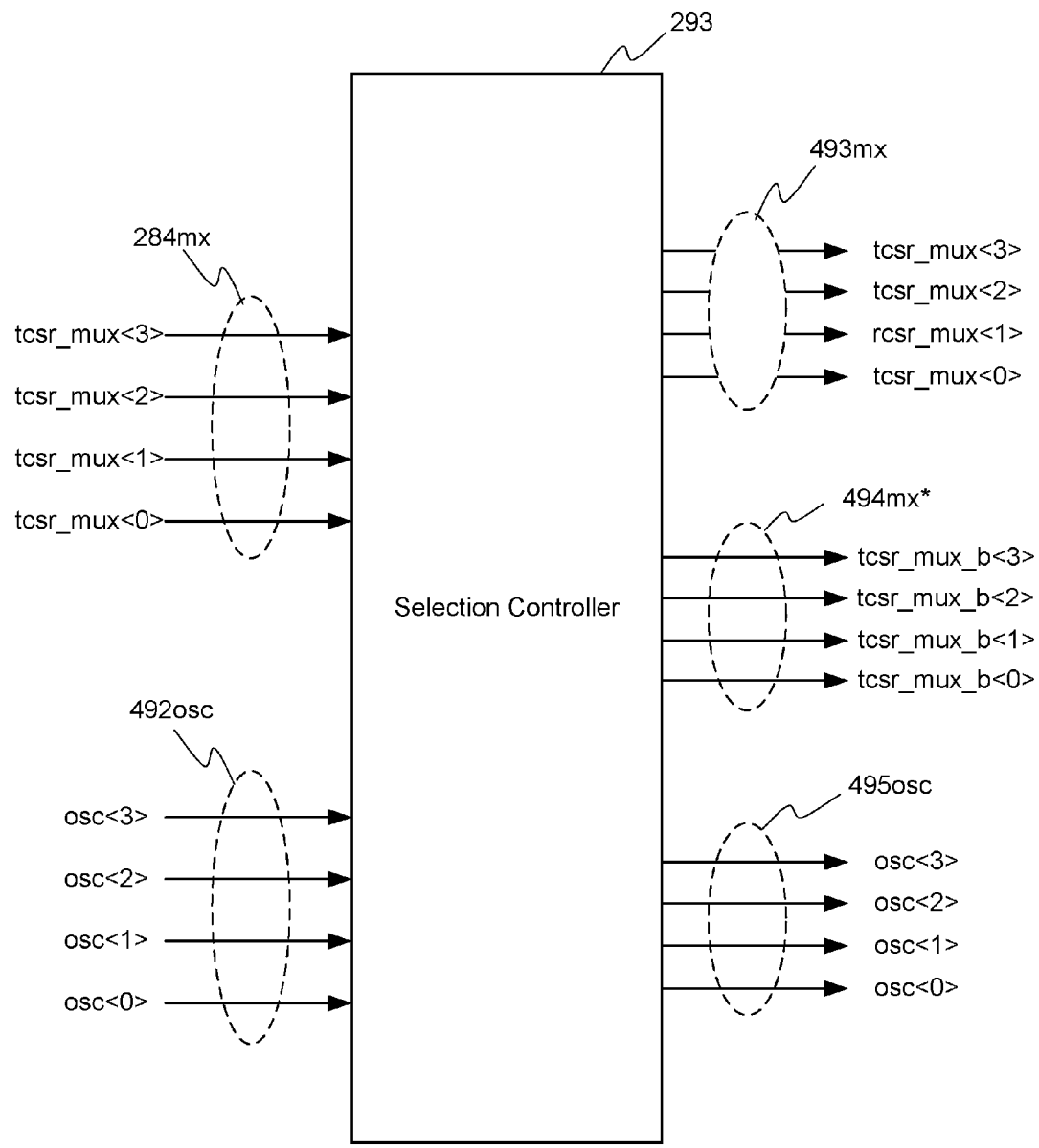
FIG. 14A is a block diagram illustrating a selection controller shown in FIG. 5.

FIG. 14A shows the selection controller 293 shown in FIG. 5. Referring to FIG. 14A, the selection controller 293 receives the frequency divided oscillation signal 492osc from the oscillation signal frequency divider 291 shown in FIGS. 13A and 13B and the temperature compensation-multiplexing signal 284mx from the TCSR decoder 279 shown in FIGS. 12A and 12B. The selection controller 293 provides the four-bit temperature compensation-multiplexing signal 493mx, the four-bit inverted temperature compensation-multiplexing signal 494mx* and the four-bit frequency divided oscillation signal 495osc.

Figure 14B:
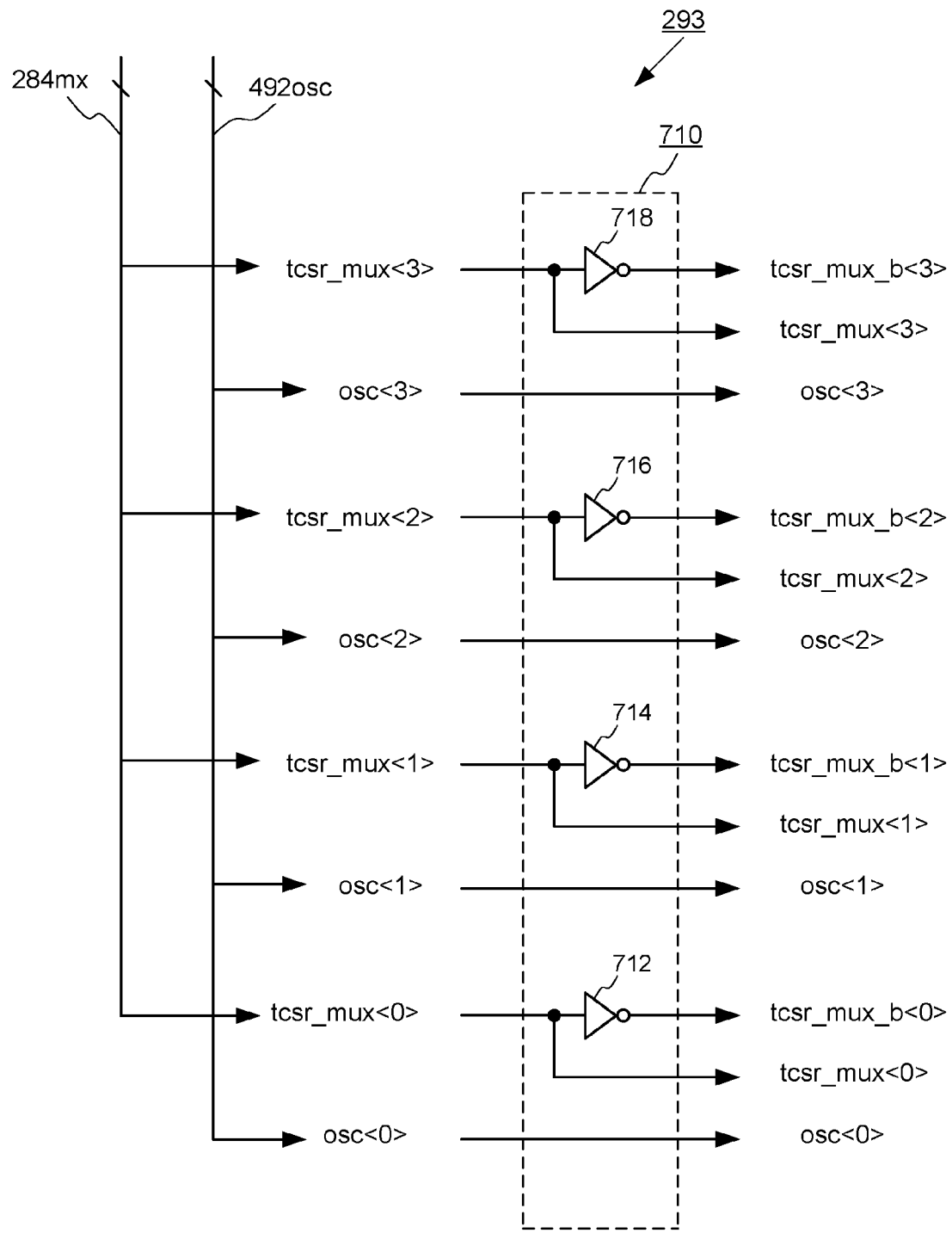
FIG. 14B is a schematic diagram illustrating a detailed circuit of the selection controller shown in FIG. 14A.

FIG. 14B shows a detailed circuit of the selection controller 293. Referring to FIGS. 14A and 14B, the selection controller 293 includes an inverter logic block 710 that includes four inverters 712, 714, 716 and 718. The inverters 712, 714, 716 and 718 invert bit signals "tcsr_mux<0>", "tcsr_mux<1>", "tcsr_mux<2>" and "tcsr_mux<3>", respectively, of the temperature compensation-multiplexing signal 284mx to provide inverted signals "tcsr_mux_b<0>", "tcsr_mux_b<1>", "tcsr_mux_b<2>" and "tcsr_mux_b<3>" of the inverted temperature compensation-multiplexing signal 494mx*. Also, four bit signals "tcsr_mux<0>", "tcsr_mux<1>", "tcsr_mux<2>" and "tcsr_mux<3>" of the temperature compensation-multiplexing signal 493mx and four oscillation bit signals "osc<0>", "osc<1>", "osc<2>" and "osc<3>" of the frequency divided oscillation signal 495osc are provided.

Figure 15A:
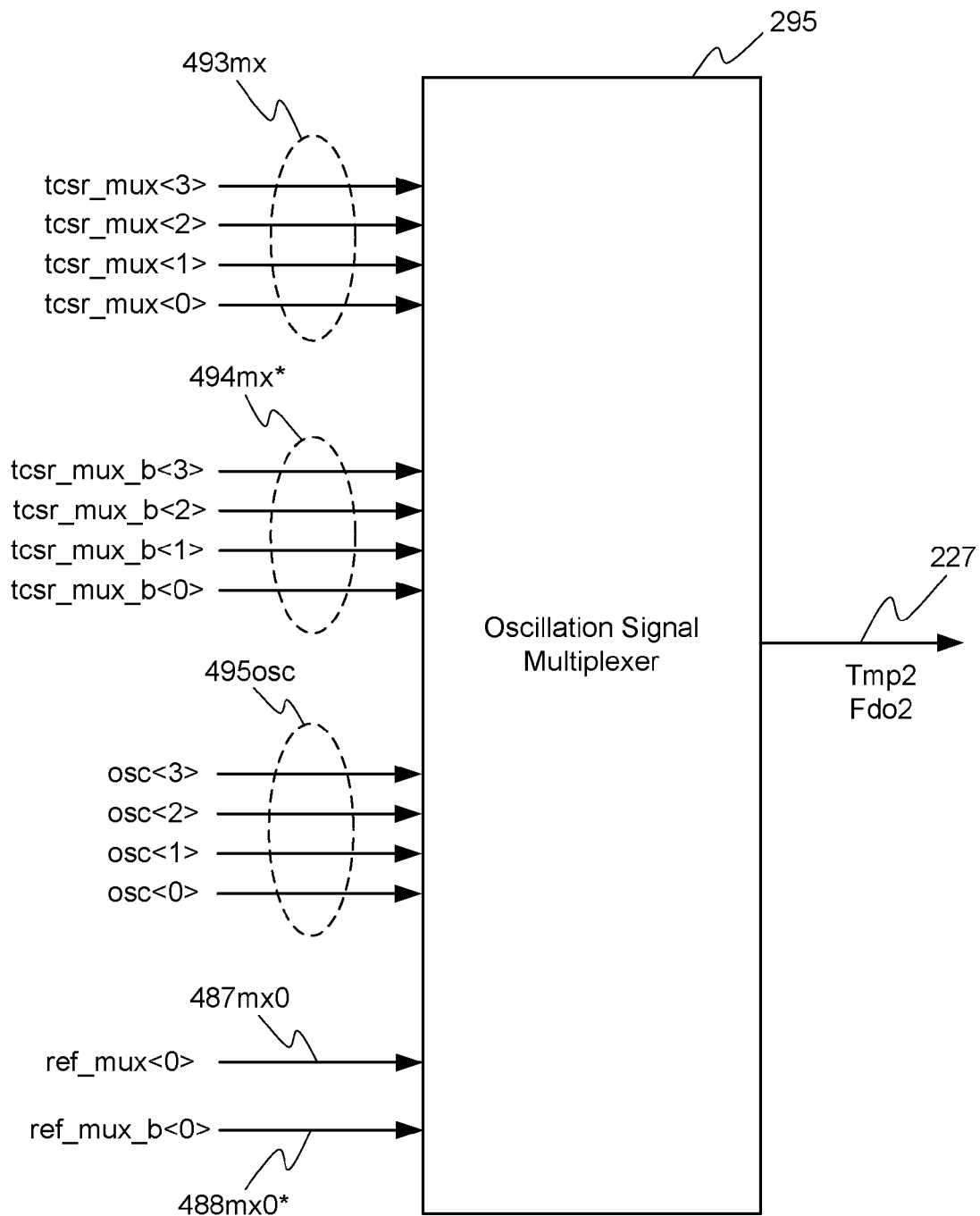
FIG. 15A is a block diagram illustrating an oscillation signal multiplexer shown in FIG. 5.

FIG. 15A shows the oscillation signal multiplexer 295 shown in FIG. 5. Referring to FIG. 15A, the oscillation signal multiplexer 295 receives the temperature compensation-multiplexing signal 493mx, the inverted temperature compensation-multiplexing signal 494mx*, the frequency divided oscillation signal 495osc from the inverter logic block 710 shown in FIG. 14B, and the multiplexing signal 283 comprising the process variation-multiplexing signal 487mx0 and the inverted process variation-multiplexing signal 488mx0* from the inverter logic block 540 shown in FIG. 10B. The oscillation signal multiplexer 295 provides the self-refresh request signal 227.

Figure 15B:
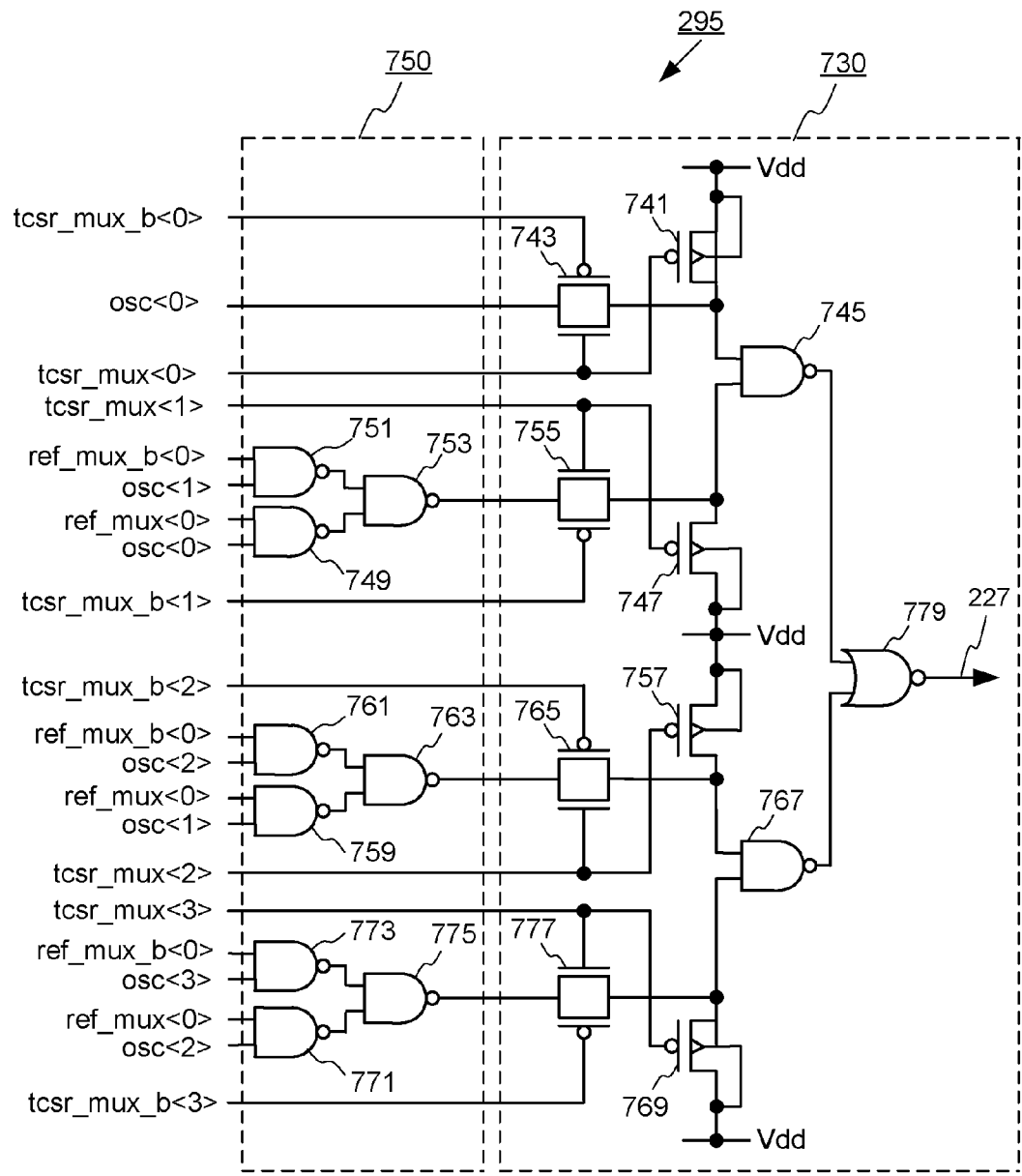
FIG. 15B is a schematic diagram illustrating a detailed circuit of the oscillation signal multiplexer shown in FIG. 15A.

FIG. 15B shows a detailed circuit of the oscillation signal multiplexer 295. Referring to FIGS. 15A and 15B, the oscillation signal multiplexer 295 includes a multiplexing output logic block 730 and a multiplexing input logic block 750. The multiplexing output logic block 730 includes four PMOS transistors 741, 747, 757 and 769, the sources of which are provided with the Vdd voltage. The four bit signals "tcsr_mux<0>", "tcsr_mux<1>", "tcsr_mux<2>" and "tcsr_mux<3>" from the inverter logic block 710 shown in FIG. 14B are provided to the gates of the PMOS transistors 741, 747, 757 and 769, respectively, and to the n-channel gates of four transmission gates 743, 755, 765 and 777, respectively. The inverted signals "tcsr_mux_b<0>", "tcsr_mux_b<1>", "tcsr_mux_b<2>" and "tcsr_mux_b<3>" are provided to the p-channel gates of the transmission gates 743, 755, 765 and 777, respectively. The oscillation bit signal "osc<0>" is fed to the signal input of the transmission gate 743 and its signal output is connected to the drain of the PMOS transistor 741. Also, included are transmission gates 755, 765 and 777, the signal outputs of which are connected to the drains of NAND gate 747, NAND gate 757 and NAND gate 769, respectively.

The multiplexing input logic block 750 includes logic circuits. The bit signals "osc<0>" and "ref_mux<0>" are fed to a NAND gate 749. The bit signals "osc<1>" and "ref_mux_b<0>" are fed to a NAND gate 751. The bit signals "osc<1>" and "ref_mux<0>" are fed to a NAND gate 759. The bit signals "osc<2>" and "ref_mux_b<0>" are fed to a NAND gate 761. The bit signals "osc<2>" and "ref_mux<0>" are fed to a NAND gate 771. The bit signals "osc<3>" and "ref_mux_b<0>" are fed to a NAND gate 773. The output signals of the NAND gate 749 and NAND gate 751 are fed to a NAND gate 753 which provides its logic output signal to the signal input of the transmission gate 755. The output signals of the NAND gate 759 and NAND gate 761 are fed to a NAND gate 763 which provides its logic output signal to the signal input of the transmission gate 765. The output signals of the NAND gate 771 and NAND gate 773 are fed to a NAND gate 775 which provides its logic output signal to the signal input of the transmission gate 777.

In the multiplexing output logic block 730, the drains of the PMOS transistors 741 and 747 are connected to a NAND gate 745. The drains of the PMOS transistors 757 and 769 are connected to a NAND gate 767. The outputs of the NAND gates 745 and 767 are connected to a NOR gate 779 which provides the self-refresh request signal 227.

The logic states of four bit signals "tcsr_mux<0>"-"tcsr_mux<3>" of the temperature compensation-multiplexing signal 493mx are referred to "D0"-"D3" in Table 7. The logic states of four bit signals "tcsr_mux_b<0>"-"tcsr_mux_b<3>" of the inverted temperature compensation-multiplexing signal 494mx* are inverted logic of "D0"-"D3". The logic state of one bit "ref_mux<0>" of the process variation-multiplexing signal 487mx0 is referred to "B0" in Table 5. The logic state of one bit "ref_mux_b<0>" of the inverted process variation-multiplexing signal 488mx0* is inverted logic of "B0".

When the bit signal "tcsr_mux<0>" is "high" (i.e., the bit signal "tcsr_mux_b<0>" is "low"), the oscillation bit signal "osc<0>" passes the transmission gate 743 and is provided to the NAND gate 745. Similarly, when the bit signal "tcsr_mux<1>" is "high", a logic output signal from the NAND gate 753 is provided to the NAND gate 745 through the transmission gate 755. When the bit signal "tcsr_mux<2>" is "high", a logic output signal from the NAND gate 763 is provided to the NAND gate 767 through the transmission gate 765. When the bit signal "tcsr_mux<3>" is "high", a logic output signal from the NAND gate 775 is provided to the NAND gate 767 through the transmission gate 777.

When the bit signal "ref_mux<0>" is "high", the NAND gate 749 provides an inverted bit signal of "osc<0>", i.e., "osc<0>*" and the inverted bit signal "osc<0>*" is further inverted by the NAND gate 753. Thus, the bit signal "osc<0>"

is provided to the signal input of the transmission gate 755. When the bit signal "ref_mux<0>" is "low", the NAND gate 751 provides an inverted bit signal of "osc<1>", i.e., "osc<1>*" and the inverted bit signal "osc<1>*" is further inverted by the NAND gate 753. Thus, the bit signal "osc<1>" is provided to the signal input of the transmission gate 755.

Similarly, when the bit signal "ref_mux<0>" is "high", the NAND gate 759 provides an inverted bit signal of "osc<1>", i.e., "osc<1>*" and the inverted bit signal "osc<1>*" is further inverted by the NAND gate 763. Thus, the bit signal "osc<1>" is provided to the signal input of the transmission gate 765. When the signal "ref_mux<0>" is "low", the NAND gate 761 provides an inverted signal of "osc<2>", i.e., "osc<2>*" and the inverted bit signal "osc<2>*" is further inverted by the NAND gate 763. Thus, the bit signal "osc<2>" is provided to the signal input of the transmission gate 765.

Furthermore, when the bit signal "ref_mux<0>" is "high", the NAND gate 771 provides an inverted bit signal of "osc<2>", i.e., "osc<2>*" and the inverted bit signal "osc<2>*" is further inverted by the NAND gate 775. Thus, the bit signal "osc<2>" is provided to the signal input of the transmission gate 777. When the bit signal "ref_mux<0>" is "low", the NAND gate 773 provides an inverted signal of "osc<3>", i.e., "osc<3>*" and the inverted bit signal "osc<3>*" is further inverted by the NAND gate 775. Thus, the bit signal "osc<3>" is provided to the signal input of the transmission gate 777. The output signals from NAND gates 745 and 767 are fed to the NOR gate 779. The output signals from the NAND gate 767 and the output signal from the transmission gate 777 are fed to the NOR gate 779. The output signals of the NAND gates 745 and 767 are fed to the NOR gate 779 to provide the self-refresh request signal 227.

As such, one bit signal is selected from the frequency divided oscillation signal 495*osc* having four bit signals "osc<0>"-"osc<3>", in accordance with the logic states of four bit signals "tcsr_mux<0>"-"tcsr_mux<3>" of the temperature compensation-multiplexing signal 493*mx*, four bit signals "tcsr_mux_b<0>"-"tcsr_mux_b<3>" of the inverted temperature compensation-multiplexing signal 494*mx\**, one bit signal "ref_mux<0>" of the process variation-multiplexing signal 487*mx*0, and one bit signal "ref_mux_b<0>" of the inverted process variation-multiplexing signal 488*mx*0*. The selected signal is provided as the self-refresh request signal 227. Thus, the self-refresh request signal 227 has the further divided frequency Fdo2 and the further multiplied period Tmp2.

As described above, in the embodiment DRAM device, the refresh time Trf (which directly relates to the basic time period Tbp) are variably controlled by the provided process characteristic values and TCSR values. The self-refresh cycle can, thus, be varied to be longer when the temperature of the DRAM device drops below nominal, and varied to be shorter when the device temperature increases above nominal, dependant upon the current leakage on the device temperature.

In the case of 0.5 ms refresh time, the sleep mode may not be supported, because refresh operations must occur are too frequently. In a such case, internal active power supplies (not shown) can be used to enable the refresh operation. A real sleep mode operation with internal low power supplies is preferably performed when the refresh time is 1 ms.

In the DRAM device according to the embodiment of the present invention, it is easy to change the target refresh time dependent upon the cell refresh characteristics of DRAM devices. In the DRAM device shown in FIGS. 3A and 3B, the basic time period generator 217 generates a basic time period. The refresh time to be used is determined by several frequency dividers with the process variation settings of "rfc0", "rfc1" and "rfc2" and temperature settings of "TC1" and "TC0". The process variation values are set based on the process characteristics, and "TC1" and "TC0" can be automatically changed with temperature sensed by the built-in temperature sensor if the system is to control the refresh time period with more precision.

It will be advantageous that all refresh time selections in the process variation path has one step low value to ensure the refresh time for 85° C., except the 0.5 ms case, because of the TCSR default setting. Then, the output signal of the self refresh time is taken from the TCSR path with one step high value. For example, if the refresh time of 2 ms is selected, the 1 ms time may be obtained from the process variation path and the TCSR path generates the 2 ms refresh time.

Table 9 shows target refresh times Trf in accordance with the cell refresh characteristics of seven cases of process variations.

TABLE 9

| Process Variation PV | Refresh Time Period Tp | Refresh Time Trf |
|---|---|---|
| PV0 | 122 ns | 0.5 ms |
| PV1 | 244 ns | 1 ms |
| PV2 | 488 ns | 2 ms |
| PV3 | 976 ns | 4 ms |
| PV4 | 1952 ns | 8 ms |
| PV5 | 3904 ns | 16 ms |
| PV6 | 7808 ns | 32 ms |

Table 10 shows the process variation based multiplying factor Kpv and the temperature compensation based multiplying factor Ktc to obtain the above target refresh times Trf.

TABLE 10

| Process Variation PV | Process Variation Based Multiplying Factor Kpv | Temperature Compensation Based Multiplying Factor Ktc | Refresh Time Period Tp = Tbp × PVi × Tj |
|---|---|---|---|
| PV0 | 1 | 1 | 122 ns |
| PV1 | 2 | 1 | 244 ns |
| PV2 | 4 | 1 | 488 ns |
| PV3 | 8 | 1 | 976 ns |
| PV4 | 16 | 1 | 1952 ns |
| PV5 | 32 | 1 | 3904 ns |
| PV6 | 64 | 1 | 7808 ns |

In order to obtain the above-mentioned target refresh times Trf in accordance with the cell refresh characteristics, the process variations and the temperature changes are to be set as shown in Table 11.

TABLE 11

| Process Variation PV | Refresh Characteristic | | | Temperature Change | |
|---|---|---|---|---|---|
| | rfc2 | rfc1 | rfc0 | TC1 | TC0 |
| PV0 | 0 | 0 | 0 | 0 | 1 |
| PV1 | 0 | 0 | 1 | 0 | 1 |
| PV2 | 0 | 1 | 0 | 0 | 1 |
| PV3 | 1 | 0 | 0 | 0 | 1 |
| PV4 | 0 | 1 | 1 | 0 | 1 |
| PV5 | 1 | 0 | 1 | 0 | 1 |
| PV6 | 1 | 1 | 0 | 0 | 1 |
| Not Use | 1 | 1 | 1 | 0 | 1 |

For example, in a case where the target refresh time Trf is 8 ms in accordance with the process variation PV 4 and the temperature change is between 85° C. and 70° C., the codes should be 0, 1, 1 and 0, 1, respectively. Therefore, referring to Table 5, the logic states of these signals "ref-time" are as shown in Table 12.

TABLE 12

| Signal "ref_time" | Coded Logic State |
| --- | --- |
| ref_time<6> | 0 |
| ref_time<5> | 0 |
| ref_time<4> | 1 |
| ref_time<3> | 1 |
| ref_time<2> | 1 |
| ref_time<1> | 1 |
| ref_time<0> | 1 |

Therefore, with the logic states of the signals "ref_time", the oscillation bit signals "osc<4>"-"osc<0>" are provided as the frequency divided oscillation signal 286 (the frequency divided oscillation signal 486*osc*) (see FIGS. 8A and 8B).

Furthermore, the logic states of the multiplexing bit signals "ref_mux" are shown in Table 13.

TABLE 13

| Signal "ref_mux" | Coded Logic State |
| --- | --- |
| ref_mux<6> | 0 |
| ref_mux<5> | 0 |
| ref_mux<4> | 1 |
| ref_mux<3> | 0 |
| ref_mux<2> | 0 |
| ref_mux<1> | 0 |
| ref_mux<0> | 0 |

Therefore, referring to FIGS. 11A and 11B, with the "1" logic state of "ref_mux<4>", the transmission gate 576 only passes the input signal (one bit signal "osc<4>" of the frequency divided oscillation signal 486*osc*). The PMOS transistor 575 is off and the passed output signal from the transmission gate 576 (the bit signal "osc<4>") is inverted by the NAND gate 577. Furthermore, the logic output signal from the NAND gate 577 is inverted by the NOR gate 587, the NAND gate 589 and the inverter 590. Thus, the row-address decoder 233 (that is an inverted output signal from the inverter 590) is the same signal as the bit signal "osc<4>" of the frequency divided oscillation signal 486*osc*). The frequency of the bit signal "osc<4>" is Fbo/16 and the repetition period Tmp1 is 16×Tbp.

Furthermore, in the temperature compensation path, the logic states of the frequency divider side are shown in Table 14.

TABLE 14

| Signal "tcsr_time" | Coded Logic State |
| --- | --- |
| tcsr_time<3> | 0 |
| tcsr_time<2> | 0 |
| tcsr_time<1> | 1 |
| tcsr_time<0> | 1 |

Thus, referring to FIGS. 13A and 13B, two bit signals "osc<1>" and "osc<0>" of the frequency divided oscillation signal 492*osc* are provided by the oscillation signal frequency divider 291 as the frequency divided oscillation signal 292.

The multiplexing logic signals "tcsr_mux" are shown in Table 15.

TABLE 15

| Signal "tcsr_mux" | Coded Logic State |
| --- | --- |
| tcsr_mux<3> | 0 |
| tcsr_mux<2> | 0 |
| tcsr_mux<1> | 1 |
| tcsr_mux<0> | 0 |

Referring to FIGS. 15A and 15B, the bit signal "ref_mux_b<0>" is "high" and the bit signal "osc<1>" is inverted by the NAND gate 751 and its output logic signal is further inverted by the NAND gate 753 and passes through the transmission gate 755. The passed output signal from the transmission gate 755 is further inverted by the NAND gate 745 and the NOR gate 779 and is provided as the self-refresh request signal 227. Thus, the self-refresh request signal 227 is the same signal as the bit signal "osc<1>".

The frequency of the bit signal "osc<1>" is the same frequency of the first frequency divided signal 223 and the repetition period Tmp2 is the same as Tmp1. Thus, the first refresh time changer 221 and the second refresh time changer 225 provides a frequency division of 16 and a period time multiplication of 16. The further multiplied period Tmp2 is 16×Tbp.

Figure 16:
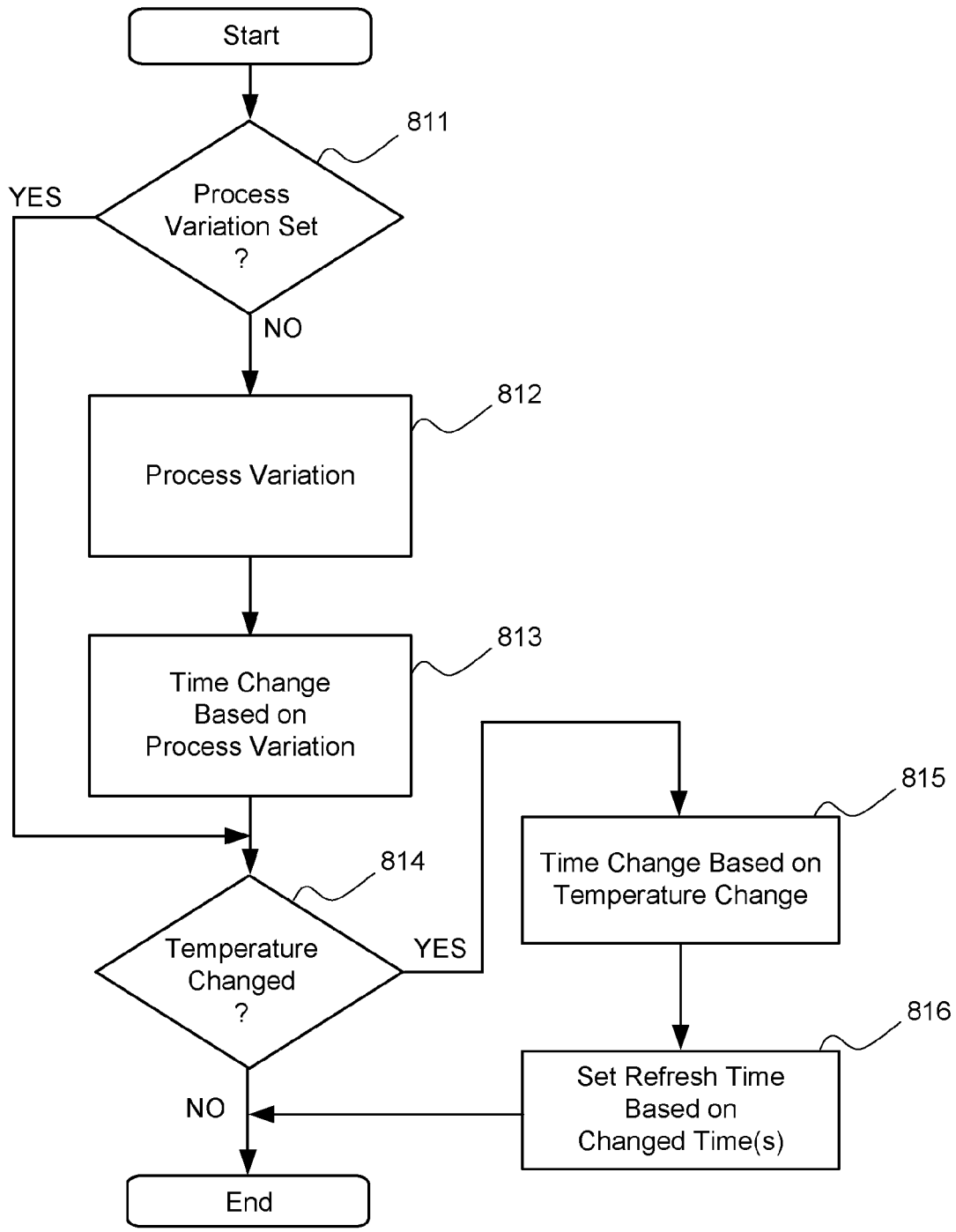
FIG. 16 is a flowchart illustrating the refresh time operation of the DRAM device shown in FIGS. 3A and 3B.

FIG. 16 shows the refresh time setting operation performed by the controller found in the DRAM device shown in FIGS. 3A and 3B.

Referring to FIGS. 3A and 3B and 16, after the self-refresh mode signal 215 is provided by the self-refresh mode detector 213 in the self-refresh mode, the refresh time setting operation starts. First, it is determined whether a process variation has been already set (step 811). In a case where no process variation has been set or fixed (NO at step 811), the process variation characteristic provider 210 provides the refresh period value signal 261 containing a process variation to the refresh period selector 263 (step 812), and the first refresh time changer 221 performs a time change operation based on the process variation provided at step 813. The TCSR requester 275 provides the TCSR signal 277 in response to the temperature signal 273 from the temperature sensor 271. After step 813 or a process variation has been already set (YES at step 811), it is further determined whether the temperature has been changed (step 814). If no temperature change has been sensed (NO at step 814), the refresh time setting operation is over. In a case where a temperature change has been sensed (YES at step 814), the second refresh time changer 225 performs a time change operation based on the changed temperature (step 815). Then, in accordance with the changed time, the refresh time Trf is determined (step 816) and the refresh time setting operation is completed.

Also, at step 814, based on the process variation and the changed temperature, the default controller 276 detects the "default" operation situation (of the minimum refresh time) and the temperature signal is provided to the second refresh time changer 225 to set the refresh time Trf to 0.5 ms.

Figure 17A:
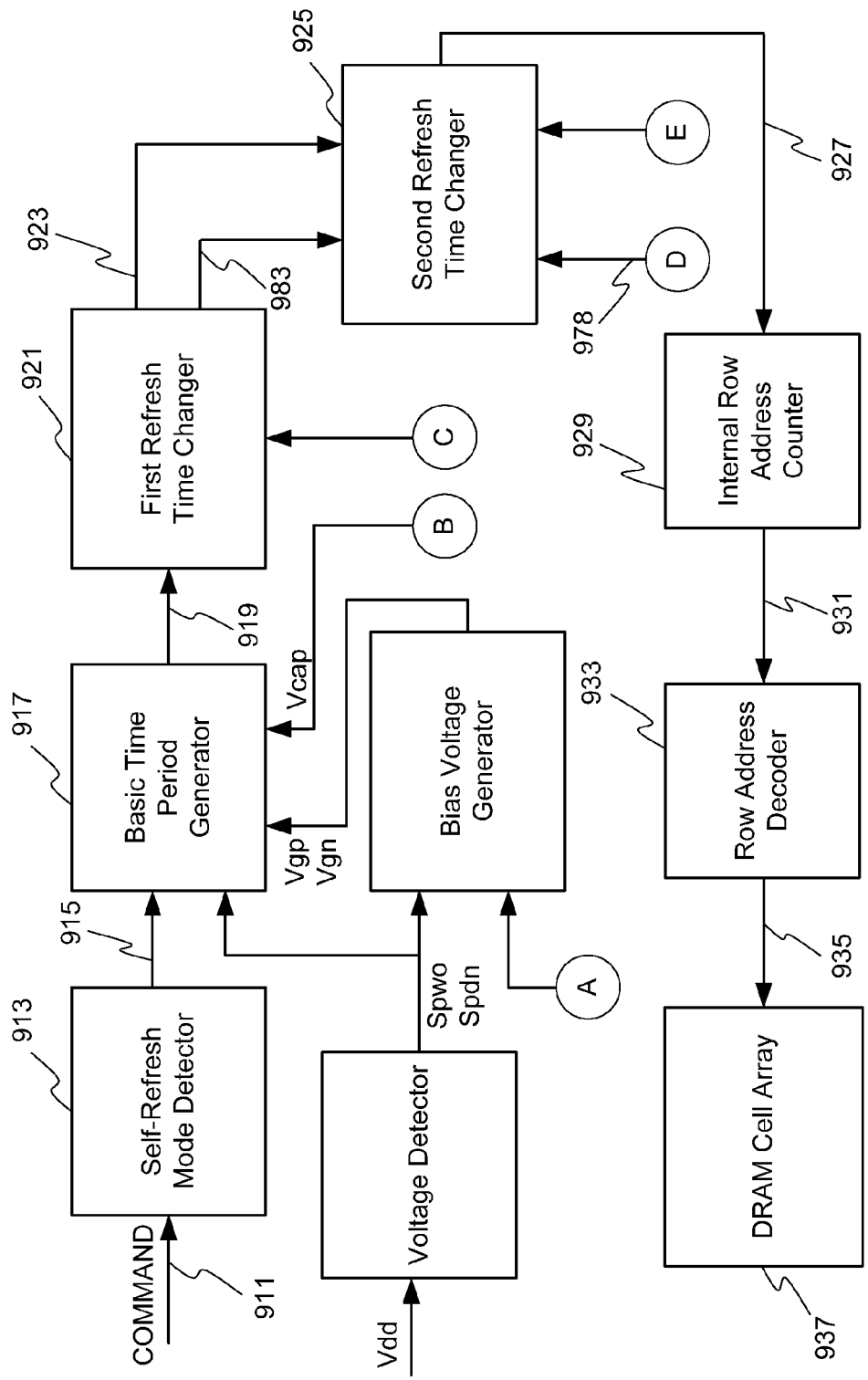
FIGS. 17A and 17B is a block diagram illustrating a DRAM device according to another embodiment of the present invention.
Figure 17B:
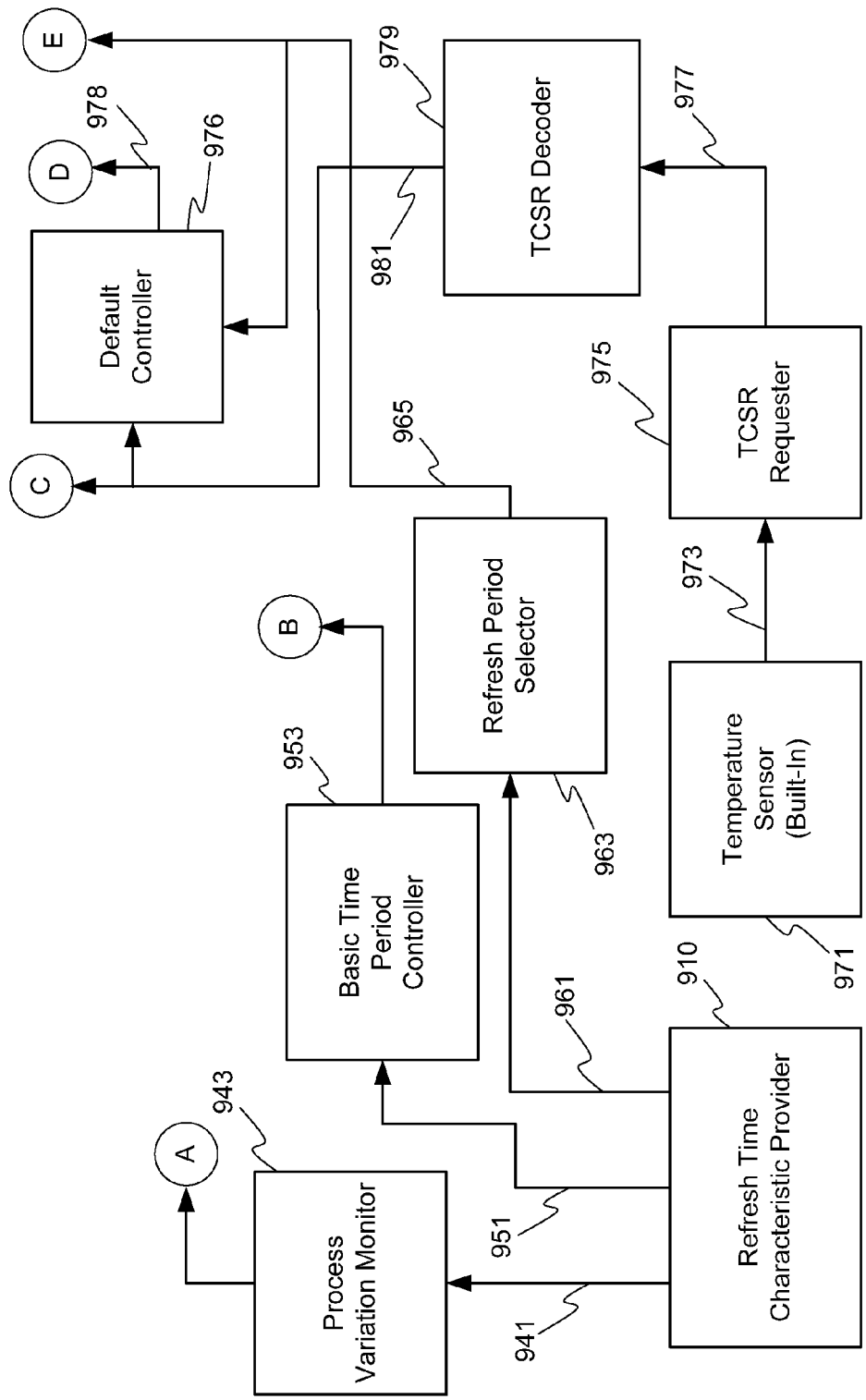

FIGS. 17A and 17B shows a DRAM device according to another embodiment of the present invention. Differences between the embodiment DRAM devices FIGS. 17A and 17B and 3A and 3B are that the first refresh time changer and the second refresh time changer are altered. In FIGS. 17A and 17B, first and second refresh time changers correspond to the second and first refresh time changers 225 and 221, respectively.

Referring to FIGS. 17A and 17B, in response to a command signal 911 having entry to and exit from the self-refresh mode, a self-refresh mode detector 913 enables a self-refresh mode signal 915. In the "self-refresh" mode, a basic time period generator 917 generates a basic oscillation signal 919 having a basic oscillation signal Fbo and a basic time period Tbo that is fed to a first refresh time changer 921. The first refresh time changer 921 provides a first frequency divided signal 923 and a second refresh time changer 925 provides a further frequency divided and multiplexed signal as a self-refresh request signal 927. In response to the self-refresh request signal 927, the internal row-address counter 929 generates an address signal 931 having an appropriate internal row address. A row-address decoder 933 decodes the internal row address to provide a decoded address signal 935, with the result that a selected wordline of an array of DRAM cells 937 is activated.

A temperature sensor 971 built in the DRAM device provides a temperature signal 973 containing a temperature compensated self-refresh (TCSR) value for temperature-based settings to a TCSR requester 975. The TCSR requester 975 provides a TCSR signal 977 to a TCSR decoder 979 which in turn provides a temperature compensation factor signal 981 to the first refresh time changer 921. The first refresh time changer 921 varies the basic time period Tbp generated by the basic time period generator 917 and the first frequency divided signal 923 is provided to the second refresh time changer 925.

A process variation characteristic provider 910 provides a process variation value signal 941 to a process variation monitor 943, a period value signal 951 to a basic period controller 953 and a refresh period value signal 961 to a refresh period selector 963. The refresh period value signal 961 contains the process variation related values that are refresh time characteristics "rfc0", "rfc1" and "rfc2" in accordance with a process variation factor Fpv. The refresh period selector 963 decodes the factor Fpv to provide a provides a process variation factor signal 965 to the second refresh time changer 925. In accordance with the Factor Fpv, the second refresh time changer 925 produces a frequency divided signal.

A default controller 976 receives the temperature compensation factor signal 981 and the process variation factor signal 965 and detects the default operation situation (i.e., the minimum refresh time of e.g., 0.5 ms) to provide a default signal 978 to the second refresh time changer 925.

Table 16 shows target refresh times Trf in accordance with the cell refresh characteristics, with different temperatures and process variations.

TABLE 16

| Temperature Change T(° C.) | Process Variation | | | | | | |
|---|---|---|---|---|---|---|---|
| | PV0 | PV1 | PV2 | PV3 | PV4 | PV5 | PV6 |
| T > 85 (TS3) | 0.5 ms | 0.5 ms | 1 ms | 2 ms | 4 ms | 8 ms | 16 ms |
| 85 > T > 70 (TS2) | 0.5 ms | 1 ms | 2 ms | 4 ms | 8 ms | 16 ms | 32 ms |
| 70 > T > 45 (TS1) | 1 ms | 2 ms | 4 ms | 8 ms | 16 ms | 32 ms | 64 ms |
| 45 > T > 15 (TS0) | 2 ms | 4 ms | 8 ms | 16 ms | 32 ms | 64 ms | 128 ms |

As shown in Table 16, the seven variations PV0-PV6 and the four temperature changes are factors to change or adjust the refresh time Trf. Here, the basic time period Tbp is 122 ns.

Table 17, the seven variations PV0-PV6 and the four temperature changes are refresh time change factors to change or adjust the refresh time Trf. Here, the basic time period Tbp is 122 ns.

TABLE 17

| Temperature Compensation Based Multiplying Factor Ktc | Process Variation Based Multiplying Factor Kpv | Refresh Time Period Tp = Tbp × Kpv × Ktc | Refresh Cycle RC (cycle) | Refresh Time Trf = RC × Tp |
|---|---|---|---|---|
| (Pj = 2) 4 | (Pi = 0) 1 | 488 ns | 4096 | 2 ms |
| (Pj = 2) 4 | (Pi = 1) 2 | 976 ns | 4096 | 4 ms |
| (Pj = 2) 4 | (Pi = 2) 4 | 1952 ns | 4096 | 8 ms |
| (Pj = 2) 4 | (Pi = 3) 8 | 3904 ns | 4096 | 16 ms |
| (Pj = 2) 4 | (Pi = 4) 16 | 7808 ns | 4096 | 32 ms |
| (Pj = 2) 4 | (Pi = 5) 32 | 15616 ns | 4096 | 64 ms |
| (Pj = 2) 4 | (Pi = 6) 64 | 31232 ns | 4096 | 128 ms |
| (Pj = 1) 2 | (Pi = 0) 1 | 244 ns | 4096 | 1 ms |
| (Pj = 1) 2 | (Pi = 1) 2 | 488 ns | 4096 | 2 ms |
| (Pj = 1) 2 | (Pi = 2) 4 | 976 ns | 4096 | 4 ms |
| (Pj = 1) 2 | (Pi = 3) 8 | 1952 ns | 4096 | 8 ms |
| (Pj = 1) 2 | (Pi = 4) 16 | 3904 ns | 4096 | 16 ms |
| (Pj = 1) 2 | (Pi = 5) 32 | 7808 ns | 4096 | 32 ms |
| (Pj = 1) 2 | (Pi = 6) 64 | 15616 ns | 4096 | 64 ms |
| (Pj = 0) 1 | (Pi = 0) 1 | 122 ns | 4096 | 0.5 ms |
| (Pj = 0) 1 | (Pi = 1) 2 | 244 ns | 4096 | 1 ms |
| (Pj = 0) 1 | (Pi = 2) 4 | 488 ns | 4096 | 2 ms |
| (Pj = 0) 1 | (Pi = 3) 8 | 976 ns | 4096 | 4 ms |
| (Pj = 0) 1 | (Pi = 4) 16 | 1952 ns | 4096 | 8 ms |
| (Pj = 0) 1 | (Pi = 5) 32 | 3904 ns | 4096 | 16 ms |
| (Pj = 0) 1 | (Pi = 6) 64 | 7808 ns | 4096 | 32 ms |
| (Pj = −1) 0.5 | (Pi = 0) 1 | 122 ns[#2] | 4096 | 0.5 ms[#2] |
| (Pj = −1) 0.5 | (Pi = 1) 2 | 122 ns | 4096 | 0.5 ms |
| (Pj = −1) 0.5 | (Pi = 2) 4 | 244 ns | 4096 | 1 ms |
| (Pj = −1) 0.5 | (Pi = 3) 8 | 488 ns | 4096 | 2 ms |
| (Pj = −1) 0.5 | (Pi = 4) 16 | 976 ns | 4096 | 4 ms |
| (Pj = −1) 0.5 | (Pi = 5) 32 | 1952 ns | 4096 | 8 ms |
| (Pj = −1) 0.5 | (Pi = 6) 64 | 3904 ns | 4096 | 16 ms |

In Table 17, #2 denotes a "default" and the refresh time period Tp is automatically set to "122 ns" and thus, the refresh time Trf is set to 0.5 ms.

Figure 18:
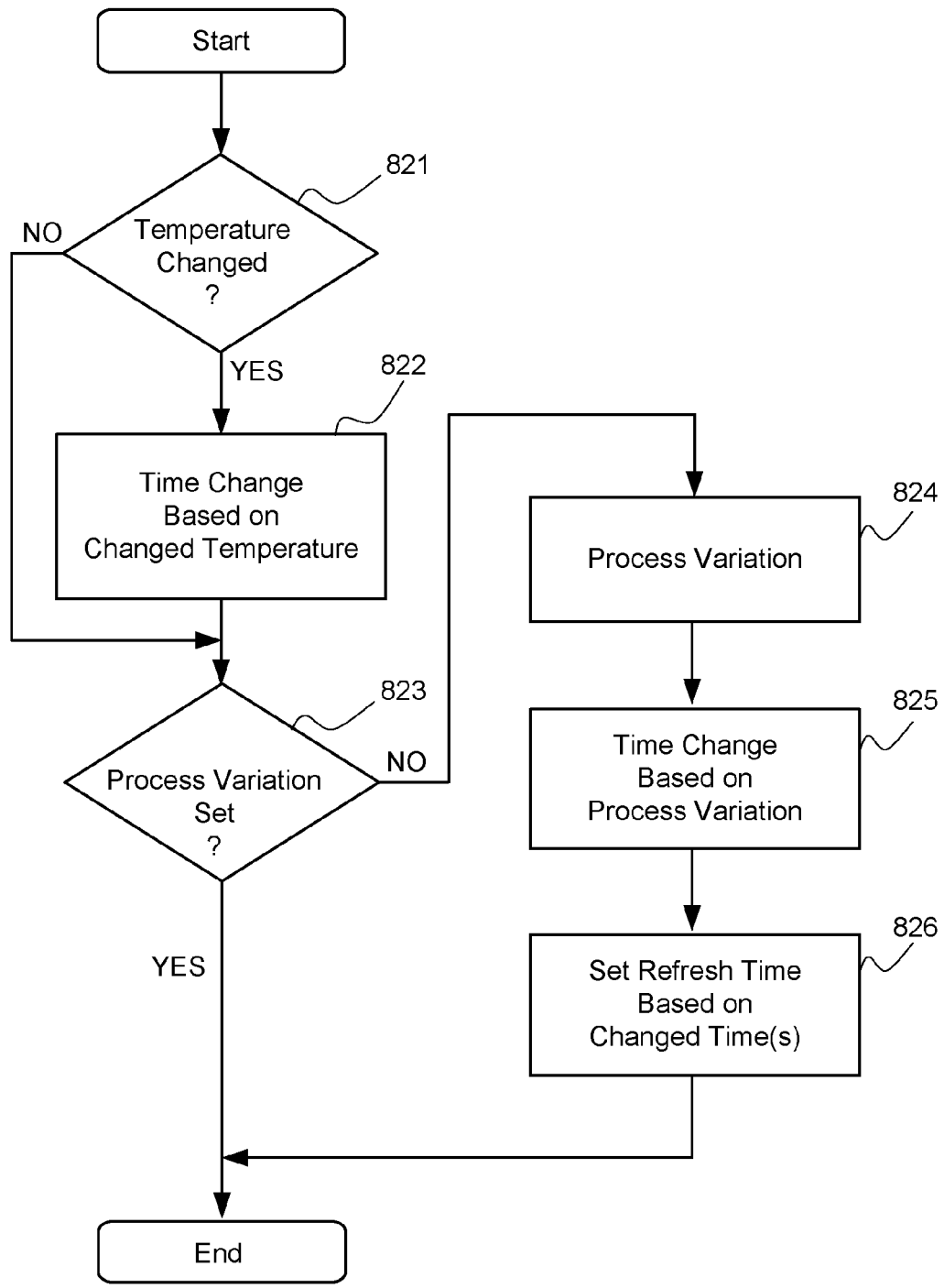
FIG. 18 is a flowchart illustrating the refresh time operation of the DRAM device shown in FIGS. 17A and 17B.

FIG. 18 shows the refresh time setting operation performed by the controller found in the DRAM device shown in FIG. 17.

Referring to FIGS. 17A and 17B and 18, after the self-refresh mode signal 915 is provided by the self-refresh mode detector 913 in the self-refresh mode, the refresh time setting operation starts. The TCSR requester 975 provides the TCSR signal 977 in response to the temperature signal 973 from the temperature sensor 971 and it is determined whether the a temperature change has been sensed (step 821). In a case where the temperature has been changed (YES at step 821), the first refresh time changer 921 performs a time change operation based on the changed temperature (step 822). After step 822 or in a case of no temperature change is sensed (NO at step 821), it is further determined whether the process variation has been already set or fixed (step 823). If the process variation has been already set (YES at step 823), the refresh time setting operation is complete. In a case where no process variation has been set (NO at step 823), the process variation characteristic provider 910 provides the refresh period value signal 961 regarding the process variation to the refresh period selector 963 (step 824). The second refresh time changer 925 performs a time change operation based on the process variation provided at step 824 (step 825). Then, based on the changed time, the refresh time Trf is determined (step 826). The refresh time setting operation is complete.

If at step 822 the sensed temperature T is over 85° C. and the set process variation is specifically PV0, the default controller 276 will determines the "default" operation situation (of the minimum refresh time 0.5 ms), so that the temperature signal is provided to the second refresh time changer 225 to set the refresh time Trf to 0.5 ms.

In the embodiments, the refresh time can be expanded to cover the refreshing of the DRAM cells that have small and large leakage due to the cell characteristic variations. DRAM devices having various structures including MIM capacitors need a wide range of refresh time characteristics due to their small capacitance relative to stacked or trench DRAM capacitors. It is, therefore, necessary to accommodate the whole range of refresh characteristics the MIM capacitor based cell in the product phase, especially for low power applications. A wide range of self-refresh timer options is obtained to select self-refresh pulse periods from 122 ns to 7808 ns with frequency dividers. Based on the cell characteristics with regards to refresh time, it is possible to change a self-refresh time value along with the TCSR function. The 90 nm process technology with MIM capacitor cell is a new approach, especially for low power embedded memory. In accordance with the embodiment of the present invention, the implementation of varying the refresh time can be achieved.

As described above, the wide range of refresh time can be covered along with the TCSR function. Diverse cell refresh characteristics can be covered without loss of yield in low power designs. Along with TCSR (related with temperature), the refresh time related to cell refresh characteristics is selectable in a product test phase. This is advantageous to sort the devices according to the refresh time characteristics caused by process variations or inherent cell characteristics.

The embodiments of the present invention provide a DRAM device and a method for self-refreshing memory cells with temperature compensated self-refresh and with wide range refresh time control. The two factors for the change of refresh time period are temperature and inherent refresh characteristics caused by unavoidable process variations.

The embodiments described above may have further various variations. In the above described embodiments, the signals are active "high" logic signals. The signals may, however, be active "low" signal, according to design preferences. The logic "high" and "low" states of the signals may be represented by the low and high supply voltages Vss and Vdd, respectively.

The number N of the rows of the DRAM cells and the wordlines may be varied dependent upon the DRAM devices. The refresh cycle RC may be different, for example, 1024, 2048, 8192, etc. Also, the refresh time period Tp may be different.

In the embodiments, each of the first and second refresh time changers divides the frequencies of the oscillation signals (and multiplying the repetition period) and provides a set of divided frequency signals. The frequency dividing factors $2^{Pi}$ and $2^{Pj}$ may be changed to other values or a functional parameter.

The time changes may be replaced with frequency multipliers to multiply the input frequencies with the parameters derived from the process variations and the temperature changes, so that a set of signals having higher frequencies are produced. A relevant one of the frequency multiplied signals may be used for varying the refresh time. Also, the first and second refresh time changers may be frequency synthesizer for producing desired frequency (or period) signals to vary the refresh time, in accordance with the refresh time change factors derived from the process variations and the temperature changes.

The process variation characteristic provider 210 provides process variation related values of eight steps (i.e., three-bit values). In a case where more precise control is necessary, the number of steps of the process variations may be used and signals having a greater number of bits representing the process variations may be applied. If the refresh period value signal 261 has a greater number of bits, the refresh period selector 263 will be changed accordingly. Also, if the TCSR signal 277 having bits more than two is implemented, the TCSR decoder 279 will be modified to accord to such bit signal. Therefore, the first and second refresh time changers can divide the frequency of the oscillation signal will be divided with more precise resolution.

The parameter Pi derived from the process variation refresh time change factor Fpv can be represented by a greater number of bits and the set of frequency divided signals (the frequency divided oscillation signal 286) of m divided frequencies can be varied. Similarly, the parameter Pj derived from the temperature compensation refresh time change factor Ftc can be represented by a greater number of bits and the set of frequency divided signals (the frequency divided oscillation signal 292) of n divided frequencies can be varied.

In the embodiments described above, the device elements and circuits are connected to each other as shown in the figures, for the sake of simplicity. In practical applications of the present invention to DRAM devices and semiconductor ICs, circuits, elements, devices, etc. may be connected directly to each other. As well, circuits, elements, devices, etc. may be connected indirectly to each other through other circuits, elements, devices, etc., necessary for operation of the DRAM devices and semiconductor ICs. Thus, in actual configuration of DRAM devices and semiconductor ICs, the circuit, elements, devices, etc. are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A dynamic random access memory (DRAM) comprising:
    an array of DRAM cells arranged in rows and columns, the DRAM cells of each row being coupled to respective wordlines;
    address decoder circuitry configured to drive the wordlines at a variable frequency to refresh the DRAM cells; and
    refresh circuitry configured to receive an input oscillation signal having a period, and configured to receive a first period changing factor, and configured to receive a second period changing factor, the refresh circuitry configured to change the period of the input oscillation signal in response to the first period changing factor, and configured to change the period of the input oscillation signal in response to the second period changing factor.

2. The dynamic random access memory (DRAM) as in claim 1, wherein said first period changing factor is a temperature factor.

3. The dynamic random access memory (DRAM) as in claim 2, wherein said temperature factor is dependent upon the internal temperature of said DRAM.

4. The dynamic random access memory (DRAM) as in claim 1, wherein said second period changing factor is derived from process variations of said DRAM.

5. The dynamic random access memory (DRAM) as in claim 4, wherein said first period changing factor is a temperature factor.

6. The dynamic random access memory (DRAM) as in claim 5, wherein said temperature factor is dependent upon the internal temperature of said DRAM.

7. The dynamic random access memory (DRAM) as in claim 6, wherein the period of the signal temperature factor is decreased with increasing temperature.

* * * * *